(12) United States Patent
Soga et al.

(10) Patent No.: US 9,691,983 B2
(45) Date of Patent: Jun. 27, 2017

(54) COMPOSITION CONTAINING POLYMER COMPOUND AND LIGHT-EMITTING DEVICE USING THE SAME

(75) Inventors: Masayuki Soga, Tokyo (JP); Osamu Goto, Ibaraki (JP); Kazuei Ohuchi, Ibaraki (JP); Nobuhiko Akino, Ibaraki (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 1190 days.

(21) Appl. No.: 13/809,971

(22) PCT Filed: Jul. 13, 2011

(86) PCT No.: PCT/JP2011/065989
§ 371 (c)(1),
(2), (4) Date: Mar. 29, 2013

(87) PCT Pub. No.: WO2012/008493
PCT Pub. Date: Jan. 19, 2012

(65) Prior Publication Data
US 2013/0200349 A1  Aug. 8, 2013

(30) Foreign Application Priority Data
Jul. 16, 2010 (JP) ................... 2010-161682

(51) Int. Cl.
*H01L 51/00* (2006.01)
*C08G 61/10* (2006.01)
(Continued)

(52) U.S. Cl.
CPC .......... *H01L 51/0035* (2013.01); *C08G 61/10* (2013.01); *C08K 5/3492* (2013.01);
(Continued)

(58) Field of Classification Search
None
See application file for complete search history.

(56) References Cited

U.S. PATENT DOCUMENTS

2002/0028347 A1  3/2002  Marrocco, III et al.
2002/0197511 A1* 12/2002 D'Andrade ............ C09K 11/06
                                                          428/690
(Continued)

FOREIGN PATENT DOCUMENTS

CN  102282193 A  12/2011
JP  6-277239 A  10/1994
(Continued)

OTHER PUBLICATIONS

Communication from European Patent Office issued Sep. 30, 2014 in counterpart European Patent Application No. EP 11 806 823.8.
(Continued)

*Primary Examiner* — J. L. Yang
(74) *Attorney, Agent, or Firm* — Sughrue Mion, PLLC

(57) ABSTRACT

It is an object of the present invention to provide a composition using a polymer compound, which is useful for manufacturing a blue phosphorescent light-emitting device excellent in luminous efficiency. The present invention provides a composition including: a polymer compound substantially consisting of a constitutional unit selected from a constitutional unit represented by Formula (1)-1 below, a constitutional unit represented by Formula (1)-2 below, a constitutional unit represented by Formula (2)-1 below, a constitutional unit represented by Formula (2)-2 below, and a constitutional unit derived from a phosphorescent light-emitting compound having a light-emitting spectrum peak at smaller than 480 nm and the polymer compound containing at least both of the constitutional unit represented by Formula (1)-1 and the constitutional unit represented by Formula (1)-2; and a phosphorescent light-emitting compound having a light-emitting spectrum peak at smaller than 480 nm.

[Chemical Formula 1]

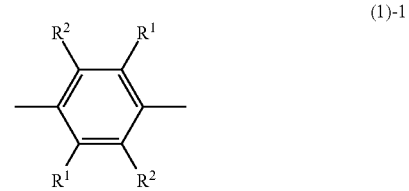

(1)-1

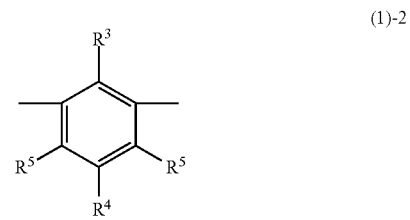

(1)-2

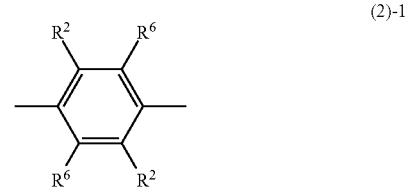

(2)-1

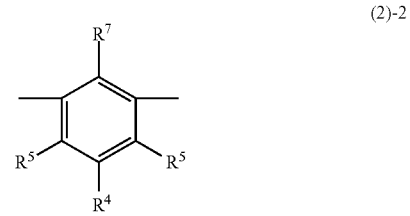

(2)-2

26 Claims, No Drawings

(51) Int. Cl.
*C08K 5/3492* (2006.01)
*C08L 65/00* (2006.01)
*H01L 51/50* (2006.01)

(52) U.S. Cl.
CPC ...... *H01L 51/0043* (2013.01); *H01L 51/0085* (2013.01); *C08G 2261/143* (2013.01); *C08G 2261/1434* (2013.01); *C08G 2261/312* (2013.01); *C08G 2261/3142* (2013.01); *C08G 2261/5242* (2013.01); *C08G 2261/95* (2013.01); *C08L 65/00* (2013.01); *H01L 51/5016* (2013.01)

(56) References Cited

U.S. PATENT DOCUMENTS

| | | |
|---|---|---|
| 2003/0094595 A1 | 5/2003 | Son et al. |
| 2004/0131886 A1 | 7/2004 | Marrocco, III et al. |
| 2005/0186443 A1 | 8/2005 | Marrocco, III et al. |
| 2005/0249972 A1* | 11/2005 | Hatwar ............... H01L 51/5265 428/690 |
| 2006/0251923 A1 | 11/2006 | Lin et al. |
| 2008/0100199 A1 | 5/2008 | Sekine et al. |
| 2008/0254320 A1 | 10/2008 | Akino et al. |
| 2009/0153021 A1 | 6/2009 | Jen et al. |
| 2010/0038592 A1 | 2/2010 | Akino et al. |
| 2010/0140606 A1 | 6/2010 | Shibata et al. |
| 2011/0272686 A1 | 11/2011 | Ohuchi et al. |
| 2015/0014675 A1 | 1/2015 | Feldman et al. |

FOREIGN PATENT DOCUMENTS

| | | |
|---|---|---|
| JP | 11-80326 A | 3/1999 |
| JP | 2003-183363 A | 7/2003 |
| JP | 2004-031210 A | 1/2004 |
| JP | 2006-008927 A | 1/2006 |
| JP | 2006-188673 A | 7/2006 |
| JP | 2007-514832 A | 6/2007 |
| WO | 2004/101707 A1 | 11/2004 |
| WO | 2007/032437 A1 | 3/2007 |
| WO | 2007/133632 A2 | 11/2007 |
| WO | 2008/081852 A1 | 7/2008 |
| WO | 2010/084977 A1 | 7/2010 |
| WO | 2012153082 A1 | 11/2012 |

OTHER PUBLICATIONS

Communication dated Sep. 3, 2015 issued by the United States Patent and Trademark Office in counterpart U.S. Appl. No. 13/740,744.
Second Office Action issued May 27, 2015 in corresponding Chinese Patent Application No. 201180034595.7 with translation.
Yukiko Muramatsu, et al., "Combinatorial synthesis and screening for blue luminescent π-conjugated polymer thin film", Applied Surface Science, 2002, pp. 319-326, vol. 189.
Office Action dated Apr. 20, 2015, issued by the United States Patent and Trademark Office in Application No. 13740744.
Communication dated Oct. 7, 2016, from the United States Patent and Trademark Office in counterpart U.S. Appl. No. 13/740,744.
Office Action from United States Patent and Trademark Office issued Apr. 1, 2016 in U.S. Appl. No. 13/740,744.
Communication dated Mar. 15, 2017, issued from the Europe Patent Office in corresponding European Application No. 11806823.8.

* cited by examiner

COMPOSITION CONTAINING POLYMER COMPOUND AND LIGHT-EMITTING DEVICE USING THE SAME

This is a national stage entry of International Application No. PCT/JP2011/065989 filed Jul. 13, 2011, which claims priority to Japanese Application No. 2010-161682 filed Jul. 16, 2010, the entire disclosures of which are hereby incorporated by reference.

TECHNICAL FIELD

The present invention relates to a composition containing a polymer compound and a light-emitting device using the same.

BACKGROUND ART

As a light-emitting material used for a light-emitting layer of a light-emitting device, a composition prepared by doping a phosphorescent light-emitting compound exhibiting light emission from a triplet excited state as a dopant in a host material, is known.

As the host material for a green phosphorescent light-emitting compound, a copolymer (polymer compound) that comprises a fluorene-2,7-diyl group and a 1,4-phenylene group having a specific substituent at a 2-position and a 5-position, is known (Patent Literature 1).

RELATED ART DOCUMENTS

Patent Literature

Patent Literature 1: International Publication No. WO 2007/032437

SUMMARY OF THE INVENTION

Problem to be Solved by the Invention

However, when a light-emitting device is manufactured using a composition containing the above phosphorescent light-emitting compound exhibiting a blue emitting light color and a polymer compound as the host material for the compound, the obtained light-emitting device has an unsatisfactory luminous efficiency.

It is an object of the present invention to provide a composition useful for manufacturing a blue light-emitting device excellent in luminous efficiency.

Means for Solving Problem

[1] A composition comprising a polymer compound and a phosphorescent light-emitting compound that has a light-emitting spectrum peak at smaller than 480 nm, wherein:

the polymer compound substantially consists of constitutional units that are selected from among a constitutional unit represented by Formula (1)-1, a constitutional unit represented by Formula (1)-2, a constitutional unit represented by Formula (2)-1, and a constitutional unit represented by Formula (2)-2; and the polymer compound contains at least both the constitutional unit represented by Formula (1)-1 and the constitutional unit represented by Formula (1)-2;

[Chemical Formula 1]

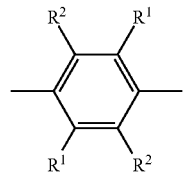
(1)-1

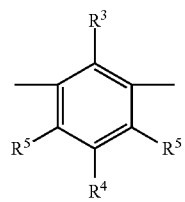
(1)-2

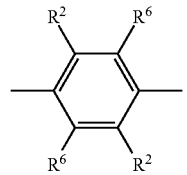
(2)-1

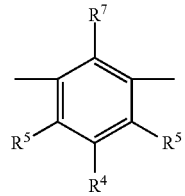
(2)-2 wherein $R^1$ represents an alkyl group, an aryl group, a monovalent aromatic heterocyclic group, an aryloxy group, an aralkyl group, an arylalkoxy group, a substituted amino group, a substituted carbonyl group, a formyl group, a substituted carboxyl group, or a cyano group, and two or more $R^1$s that are present in the polymer compound may be the same as or different from each other;

$R^2$ represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and two or more $R^2$s that are present in the polymer compound may be the same as or different from each other;

$R^3$ represents an alkyl group, an aryl group, a monovalent aromatic heterocyclic group, or an aralkyl group;

$R^4$ and $R^5$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and when two or more $R^4$s are present in the polymer compound, $R^4$ may be the same as or different from each other, and two or more $R^5$s that are present in the polymer compound may be the same as or different from each other;

R⁶ represents a hydrogen atom, an alkoxy group, or a fluorine atom, and two or more R⁶ that are present in the polymer compound may be the sane as or different from each other; and R⁷ represents a hydrogen atom, an alkoxy group, an aryloxy group, an arylalkoxy group, a substituted amino group, a substituted carbonyl group, a formyl group, a substituted carboxyl group, or a fluorine atom, and when two or more R⁷s are present in the polymer compound, R⁷s may be the same as or different from each other.

[2] The composition according to [1], wherein R¹ is an alkyl group, an aryl group, or an aralkyl group.

[3] The composition according to [1] or [2], wherein R² is a hydrogen atom.

[4] The composition according to any one of [1] to [3], wherein R³ is an alkyl group, an aryl group, or an aralkyl group.

[5] The composition according to t[4], wherein R³ is a methyl group.

[6] The composition according to any one of [1] to [5], wherein R⁵ is a hydrogen atom.

[7] The composition according to any one of [1] to [6], wherein R⁴ is a group represented by Formula (3, and/or a group represented by Formula (4):

[Chemical Formula 2]

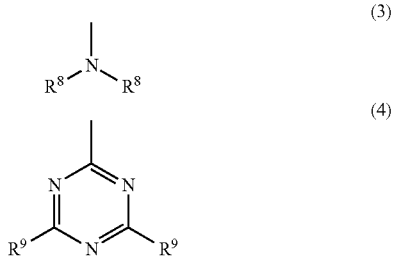

wherein
R⁸ and R⁹ each independently represent an alkyl group, an aryl group, a monovalent aromatic heterocyclic group, or an aralkyl group;

two R⁸s that are present in Formula (3) are optionally linked together; two or more R⁸s that are present in the polymer compound may be the same as or different from each other;

two R⁹s that are present in Formula (4) are optionally linked together; and two or more R⁹s that are present in the polymer compound, may be the same as or different from each other.

[8] The composition according toe any one of [1] to [7], wherein a ratio of a total number of moles of the constitutional unit represented by Formula (1)-2 and the constitutional unit represented by Formula (2)-2 relative to a total number of moles of the constitutional unit represented by Formula (1)-1 and the constitutional unit represented by Formula (2)-1 is 0.1 to 9.0.

[9] The composition according to [7] or [8] wherein a ratio of a total number of moles of: the constitutional unit represented by Formula (1)-2 and the constitutional unit represented by Formula (2)-2 in which R⁴ is the group represented by Formula (3); and the constitutional unit represented by Formula (1)-2 and the constitutional unit represented by Formula (2)-2 in which R⁴ is the group represented by Formula (4), relative to a total number of moles of: the constitutional unit represented by Formula (1)-1; the constitutional unit represented by Formula (2)-1; the constitutional unit represented by Formula (1)-2 in which R⁴ is neither the group represented by Formula (3) nor the group represented by Formula (4); and the constitutional unit represented by Formula (2)-2 in which R⁴ is neither the group represented by Formula (3) nor the group represented by Formula (4), is 0.1 to 9.0.

[10] The composition according to any one of [7] to [9], wherein a ratio of a total number of moles of the constitutional unit represented by Formula (1)-2 and the constitutional unit represented by Formula (2)-2 in which R⁴ is the group represented by Formula (3) relative to a total number of moles of the constitutional unit represented by Formula (1)-2 and the constitutional unit represented by Formula (2)-2 in which R⁴ is the group represented by Formula (4) is 0.1 to 9.0.

[11] The composition according to any one of [1] to [10], wherein constitutional units represented by Formula (2)-1 are not substantially adjacent to each other; constitutional units represented by Formula (2)-2 are not substantially adjacent to each other; and the constitutional unit represented by Formula (2)-1 and the constitutional unit represented by Formula (2)-2 are not substantially adjacent to each other.

[12] The composition according to any one of [1] to [11], wherein the phosphorescent light-emitting compound is an iridium complex.

[13] The composition according to [12], wherein the iridium complex has a fluorine atom or a trifluoromethyl group.

[14] The composition according to [12] or [13], wherein the iridium complex has an alkyl group.

[15] The composition according to any one of [1] to [14], wherein a ratio of a weight of the phosphorescent light-emitting compound relative to a weight of the polymer compound is 0.05 to 0.5

[16] The composition according to any one of [1] to [15], further comprising a phosphorescent light-emitting compound that has a light-emitting spectrum peak at 480 nm or larger.

[17] The composition according to [16], further comprising a phosphorescent light-emitting compound that has a light-emitting spectrum peak at 480 nm or larger and smaller than 580 nm and a phosphorescent light-emitting compound that has a light-emitting spectrum peak at 580 nm or larger and smaller than 680 nm.

[18] The composition according to any one of [1] to [17], further comprising:
one or more types of material selected from the group consisting of a hole transport material, on electron transport material, and a light-emitting material except for a phosphorescent light-emitting material.

[19] The composition according to [18], wherein the electron transport material is an electron transport material having a structure represented by Formula (5):

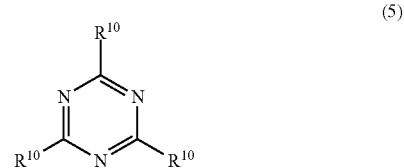

wherein

R[10] represents an alkyl group, an aryl group, a monovalent aromatic heterocyclic group, or an aralkyl group; three R[10]s are optionally linked together; and three R[10]s that are present in the polymer compound may be the same as or different from each other.

[20] A polymer compound wherein:

the polymer compound substantially consisting of constitutional units that are selected from among a constitutional unit represented by Formula (1)-1, a constitutional unit represented by Formula (1)-2, a constitutional unit represented by Formula (2)-1, a constitutional unit represented by Formula (2)-2, and a constitutional unit derived from a phosphorescent light-emitting compound that has a light-emitting spectrum peak at smaller than 480 nm; and the polymer compound containing at least the constitutional unit represented by Formula (1)-1, the constitutional unit represented by Formula (1)-2, and the constitutional unit derived from the phosphorescent light-emitting compound that has a light-emitting spectrum peak at smaller than 480 nm;

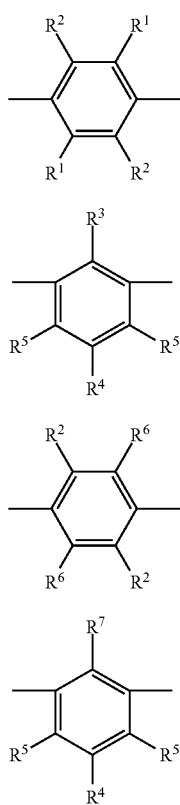

wherein

R[1] represents an alkyl group, an aryl group, a monovalent aromatic heterocyclic group, an aryloxy group, an aralkyl group, an arylalkoxy group, a substituted amino group, a substituted carbonyl group, a formyl group, a substituted carboxyl group, or a cyano group, and two or more R[1]s that are present in the polymer compound may be the same as or different from each other;

R[2] represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and two or more R[2]s that are present in the polymer compound may be the same as or different from each other;

R[3] represents an alkyl group, an aryl group, a monovalent aromatic heterocyclic group, or an aralkyl group, and when two or more R[3]s are present in the polymer compound, R[3]s may be the same as or different from each other;

R[4] and R[5] each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and when two or more R[4]s are present in the polymer compound, R[4]s may be the same as or different from each other, and two or more R[5]s that are present in the polymer compound may be the same as or different from each other;

R[6] represents a hydrogen atom, an alkoxy group, or a fluorine atom, and two or more R[6]s that are present in the polymer compound may be the same as or different from each other; and R[7] represents a hydrogen atom, an alkoxy group, an aryloxy group, an arylalkoxy group, a substituted amino group, a substituted carbonyl group, a formyl group, a substituted carboxyl group, or a fluorine atom and when two or more R[7]s are present in the polymer compound, R[7]s may be the same as or different from each other.

[21] A liquid composition comprising:

the composition according to any one of [1] to [19] or the polymer compound according to [20]; and a solvent.

[22] A film comprising:

the composition according to any one of [1] to [19] or the polymer compound according to [20].

[23] A light-emitting device comprising:

an anode and a cathode; and a layer that is provided between the anode and the cathode and that comprises the composition according to any one of [1] to [19] or the polymer compound according to [20].

[24] The light-emitting device according to [23], wherein the layer is a light-emitting layer.

[25] A surface light source comprising the light-emitting device according to [23] or [24]

[26] A display device comprising the light-emitting device according to [23] or [24].

Effects of the Invention

According to the composition of the present invention, a blue light-emitting device having a satisfactorily high luminous efficiency can be provided. According to a preferred embodiment of the composition of the present invention, a white light-emitting device having a satisfactorily high luminous efficiency can be provided. In addition, according to the present invention, a composition useful for manufacturing the light-emitting device, a liquid composition containing the composition, and a film containing the composition can be provided.

EMBODIMENTS FOR CARRYING OUT THE INVENTION

The present invention will now be described in detail.

In the present specification, although the "constitutional unit" means one or more units included in a polymer compound, the "constitutional unit" is included in a polymer compound preferably as a "repeating unit" (that is, two or more units included in a polymer compound. The "monovalent aromatic heterocyclic group" means an atomic group remaining after removing one hydrogen atom from an aromaticity-exhibiting heterocyclic compound.

The "aryl group" means an atomic group remaining after removing one hydrogen atom from an aromatic hydrocarbon. The "$C_1$-$C_{12}$ alkoxy" indicates that the number of carbon atoms of an alkoxy moiety of the group or the compound described immediately thereafter is 1 to 12. The "$C_1$-$C_{12}$ alkyl" indicates that the number of carbon atoms of an alkyl moiety of the group or the compound described immediately thereafter is 1 to 2.

In the present specification, Me represents a methyl group; Et represents an ethyl group; i-Pr represents an isopropyl group; n-Bu represents an n-butyl group; and t-Bu represents a tert-butyl group.

In the present specification, "unsubstituted" means that a hydrogen atom of the group described immediately thereafter is not substituted with a substituent. "Substituted" affixed immediately before the group means that a part of or all of hydrogen atoms of the group is(are) substituted with a substituent. Examples of the substituent may include, unless defined otherwise, a halogen atom, a hydrocarbyl group having 1 to 30 carbon atoms, and a hydrocarbyloxy group having 1 to 30 carbon atoms and among them, preferred are a halogen atom, a hydrocarbyl group having 1 to 15 carbon atoms, and a hydrocarbyloxy group having 1 to 10 carbon atoms; more preferred are a halogen atom, a hydrocarbyl group having 1 to 12 carbon atoms, and a hydrocarbyloxy group having 1 to 12 carbon atoms; further preferred are a halogen atom and a hydrocarbyl group having 1 to 12 carbon atoms; and particularly preferred are a halogen atom and a hydrocarbyl group having 1 to 6 carbon atoms.

The composition of the present invention contains a polymer compound containing a prescribed constitutional unit and a phosphorescent light-emitting compound having a light-emitting spectrum peak at smaller than 480 nm. The polymer compound and the phosphorescent light-emitting compound are described below, in order of their appearance.

<Polymer Compound>

Description of Substituent

First, the substituent in each constitutional unit contained in the composition of the present invention is described below.

The alkyl group in Formulae (1)-1, (1)-2, (2)-1, and (2)-2 includes linear, branched, and cyclic alkyl groups and includes both of a substituted alkyl group and an unsubstituted alkyl group. The number of carbon atoms of the alkyl group is usually 1 to 20. This number of carbon atoms does not include the number of carbon atoms of the substituent that the substituted alkyl group has. Examples of the substituent that the substituted alkyl group has may include a halogen atom such as a fluorine atom. Examples of the alkyl group may include a methyl, group, an ethyl group, a propyl group, an isopropyl group, butyl group, a sec-butyl group, an isobutyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group, and a perfluorooctyl group.

The aryl group in Formulae (1)-1, (1)-2, (2)-1, and (2)-2 includes an aryl group having a condensed ring and includes both of a substituted aryl group and an unsubstituted aryl group. The number of carbon atoms of the aryl group is usually 6 to 60, preferably 6 to 48, more preferably 6 to 20, and further preferably 6 to 14. This number of carbon atoms does not include the number of carbon atoms of the substituent that the substituted aryl group has. Examples of the substituent that the substituted aryl group has many include an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom, and a cyano group.

The aryl group is preferably a substituted phenyl group or an unsubstituted phenyl group. The substituent that the substituted phenyl group has is preferably a substituent containing any one of an alkyl group, an aryl group, a monovalent aromatic heterocyclic group, an alkoxy group, an aryl oxy group, an aralkyl group, and a substituted amino group, and further preferably a substituent containing any one of an alkyl group, an aryl group, and a monovalent aromatic heterocyclic group.

The monovalent aromatic heterocyclic group in Formulae (1)-1, (1)-2, (2)-1, and (2)-2 includes both of a substituted monovalent aromatic heterocyclic group and an unsubstituted monovalent aromatic heterocyclic group. The number of carbon atoms of the monovalent aromatic heterocyclic group is usually 2 to 60, preferably 3 to 60, and more preferably 3 to 20. This number of carbon atoms does not include the number of carbon atoms of the substituent that the substituted monovalent aromatic heterocyclic group has. Examples of the monovalent aromatic heterocyclic group may include a 2-oxadiazolyl group, a 2-oxathiazolyl group, a 2-thiadiazolyl group, a 2-thiazolyl group, a 2-oxazolyl group, a 2-thienyl group, a 2-pyrrolyl group, a 2-furyl group, a 2-pyridyl group, a 3-pyridyl group, a 4-pyridyl group, a 2-pyrazyl group, a 2-pyrimidyl group, a 2-triazyl group, a 3-pyridazyl group, a 3-carbazolyl group, a 2-phenoxazinyl group, a 3-phenoxazinyl group, a 2-phenothiazinyl group, and a 3-phenothiazinyl group. Examples of the substituent that the substituted monovalent aromatic heterocyclic, group has may include an alkyl group, an aryl group, a monovalent aromatic heterocyclic group, an alkoxy group, an aryloxy group, an aralkyl group, an arylalkoxy group, a substituted amino group, a substituted carbonyl group, a substituted carboxyl group, a fluorine atom, and a cyano group.

The monovalent aromatic heterocyclic group is preferably a substituted or unsubstituted 2-pyridyl group, 3-pyridyl group, 4-pyridyl group, 2-pyrazyl group, 2-pyrimidyl group, 2-triadyl group, or 3-pyridazyl group. The substituent that the substituted monovalent aromatic heterocyclic group has contains preferably any one of an alkyl group, an aryl group and a monovalent aromatic heterocyclic group.

The alkoxy group in Formulae (1)-1, (1)-2, (2)-1, and (2)-2 includes linear, branched, and cyclic alkoxy groups and includes both of a substituted alkoxy group and an unsubstituted alkoxy group. The number of carbon atoms of the alkoxy group is usually 1 to 20. This number of carbon atoms does not include the number of carbon atoms of the substituent that the substituted alkoxy group has. Examples of the alkoxy group may include a methoxy group, an ethoxy group, a propyloxy group, an isopropyloxy group, a butoxy group, a sec-butoxy group, an isobutoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy croup, a perfluorobutoxy group, a perfluorohexyl group, a perfluorooctyl group, a methoxymethyloxy group, a 2-methoxyethyloxy group, and a 2-ethoxyethyloxy group.

The aryloxy group in Formulae (1)-1, (1)-2, (2)-1, and (2)-2 includes both of a substituted aryloxy group and at unsubstituted aryloxy group. The number of carbon atoms of the aryloxy group is usually 6 to 60. This number of carbon atoms does not include the number of carbon atoms of the substituted that the substituted aryloxy group has examples of the aryloxy group may include a phenoxy group, a $C_1$-$C_{12}$ alkoxyphenoxy group, a $C_1$-$C_{12}$ alkylphenoxy group, a 1-naphthyloxy group, a 2-naphthyloxy group, and a pentafluorophenyloxy group.

The aralkyl group in Formulae (1)-1, (1)-2, (2)-1, and (2)-2 includes both of a substituted aralkyl group and an unsubstituted aralkyl group. The number of carbon atoms of the aralkyl group is usually 7 to 60. This number of carbon atoms does not include the number of carbon atoms of the substituent that the substituted aralkyl group has. Examples of the aralkyl group may include a phenyl-$C_1$-$C_{12}$ alkyl group, a $C_1$-$C_{12}$ alkoxyphenyl-$C_1$-$C_{12}$ alkyl group, and a $C_1$-$C_{12}$ alkylphenyl-$C_1$-$C_{12}$ alkyl group.

The arylalkoxy group in Formulae (1)-1, (1)-2, (2)-1, and (2)-2 includes both of a substituted arylalkoxy group, and at unsubstituted arylalkoxy group. The number of carbon atoms of the arylalkoxy group is usually 7 to 60. This number of carbon atoms does not include the number of carbon atoms of the substituent that the substituted arylalkoxy group has. Examples of the arylalkoxy group may include a phenyl-$C_1$-$C_{12}$ alkoxy group, a $C_1$-$C_{12}$ alkoxyphenyl-$C_1$-$C_{12}$ alkoxy group, and a $C_1$-$C_{12}$ alkylphenyl-$C_1$-$C_{12}$ alkoxy group.

The number of carbon atoms of the substituted amino group in Formulae (1)-1, (1)-2, and (2)-2 is usually 2 to 60. Examples of the substituent that the substituted amino group has may include an alkyl group, an aryl group, an aralkyl group, and a monovalent aromatic heterocyclic group. The substituted amino group includes also an amino group in which the substituents of the amino group are bonded directly with each other and an amino group in which the substituents of the amino group are bonded with each other through an atom such as a carbon atom, an oxygen atom, and a sulfur atom to form a condensed ring. The substituted amino group is preferably a dialkyl-substituted amino group or a diaryl-substituted amino group, and more preferably a dimethylamino group, a diethylamino group, a diphenylamino group, a di-4-tolylamino group, a di-4-tert-butylphenylamino group, a bis(3,5-di-tert-butylphenyl)amino group, an N-carbazolyl group, an N-phenoxazinyl group, an N-acridinyl group, or an N-phenothiazinyl group.

The number of carbon atoms of the substituted carbonyl group in Formulae (1)-1, (1)-2, (2)-1, and (2)-2 is usually 2 to 60. Examples of the substituent that the substituted carbonyl group has may include an alkyl group, an aryl group, an aralkyl group, and a monovalent aromatic heterocylic group, and preferred are an acetyl group, a butyryl group, and a benzoyl group.

The number of carbon atoms of the substituted carboxyl group in Formulae (1)-1, (1)-2, (2)-1, and (2)-2 is usually 2 to 60. Examples of the substituent that the substituted carboxyl group has may include an alkyl group, an aryl group, an aralkyl group, and a monovalent aromatic heterocyclic group, and preferred are a methoxycarbonyl group, an ethoxycarbonyl group, a butoxycarbonyl group, a phenoxycarbonyl group, and a benzyloxycarbonyl group Constitutional Unit Represented by Formula (1)-1 and Constitutional Unit Represented by Formula (2)-1

The polymer compound contained in the composition of the present invention contains a constitutional unit represented by Formula (1)-1 below and may further contain a constitutional unit represented by Formula (2)-1 below. The constitutional unit represented by Formula (2)-1 below is different from the constitutional unit represented by Formula (1)-1 below.

[Chemical Formula 5]

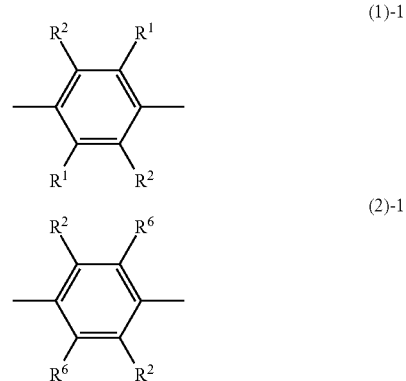

In Formula (1)-1, $R^1$ represents an alkyl group, an aryl group, a monovalent aromatic heterocyclic group, an aryoxy group, an aralkyl group, an arylalkoxy group, a substituted amino group, a substituted carbonyl group, a formyl group, a substituted carboxyl group, or a cyano group.

In Formula (1)-1 and Formula (2)-1, $R^2$ represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group.

Two $R^1$s that are present in Formula (1)-1 may be the same as or different from each other. When two or more $R^1$s are present in the polymer compound, two or more $R^1$s may be the same as or different from each other. Two $R^2$s that are present in Formula (1)-1 and Formula (2)-1 may be the same as or different from each other. When two or more $R^2$s are present in the polymer compound, two or more $R^2$s may be the same as or different from each other.

In Formula (2)-1, $R^6$ represents a hydrogen atom, an alkoxy group, or a fluorine atom. Two $R^6$s that are present in Formula (2)-1 may be the same as or different from each other. When two or more $R^6$s are present in the polymer compound, two or more $R^6$s may be the same as or different from each other.

In Formula (1)-1, because the balance between the heat resistance of the polymer compound and the solubility in an organic solvent of the polymer compound can be enhanced, $R^1$ is preferably an alkyl group, an aryl group, a monovalent aromatic heterocyclic group, an aryloxy group, an aralkyl group, or a substituted amino group, more preferably an alkyl group, an aryl group, or an aralkyl group, further preferably an alkyl group, and particularly preferably a propyl group, an isopropyl group, a butyl group, a sec-butyl group, an isobutyl group, a pentyl group, an isoamyl group, a hexyl group, a cyclohexyl group, a heptyl group, an octyl group, a 2-ethylhexyl group, a cyclohexylmethyl group, a nonyl group, a decyl group, a 3,7-dimethyloctyl group, or a dodecyl group. A part of or all of hydrogen atoms of each of the above-mentioned groups may be substituted with a halogen atom such as a fluorine atom.

In Formula (1)-1 and Formula (2)-1, because the heat resistance of the polymer compound, the solubility in an organic solvent of the polymer compound, and the reactivity of the monomer during the polymerization thereof can be enhanced, $R^2$ is preferably a hydrogen atom, an alkyl group, an alkoxy group, an aryl group, a monovalent aromatic heterocyclic group, or an aralkyl croup, more preferably a hydrogen atom or an alkyl group, and further preferably a hydrogen atom.

In Formula (2)-1, because the heat resistance of the polymer compound, the solubility in an organic solvent of the polymer compound, and the reactivity of the monomer during the polymerization thereof can be enhanced, $R^6$ is preferably a hydrogen atom or an alkoxy group, and more preferably a hydrogen atom.

Examples of the constitutional unit represented by Formula (1)-1 may include the constitutional units represented by Formulae (1)-1-001 to (1)-1-017 and (1)-1-101 to (1)-1-105 below.

[Chemical Formula 6]

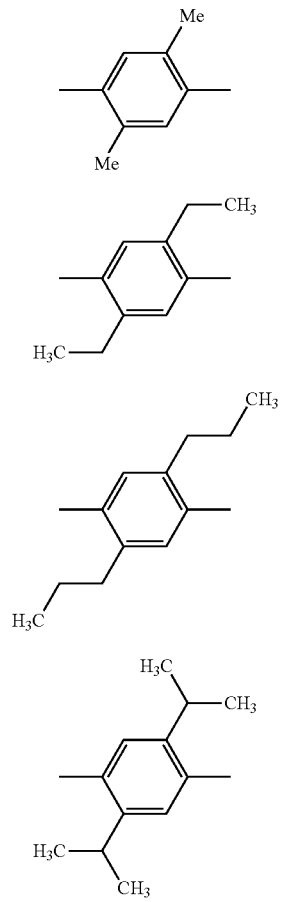

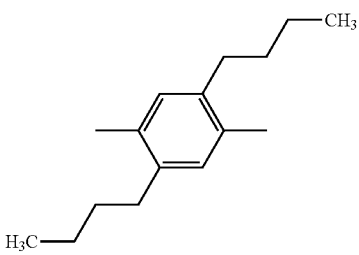

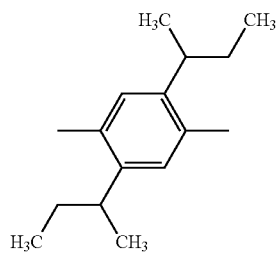

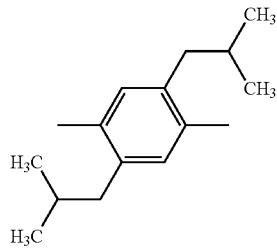

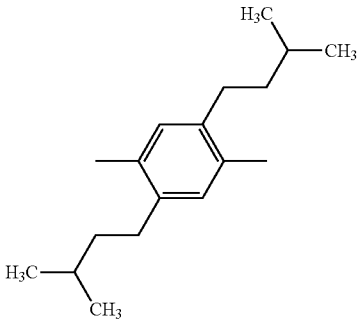

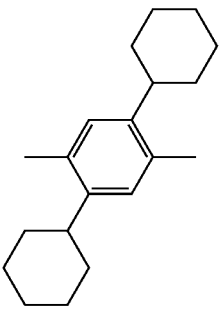

-continued
(1)-1-010
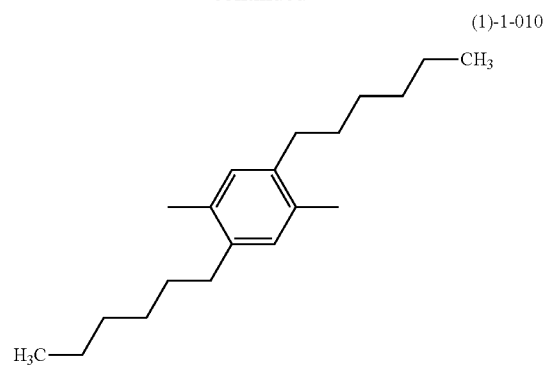
[Chemical Formula 7]
(1)-1-011
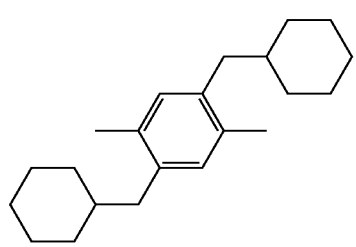
(1)-1-012
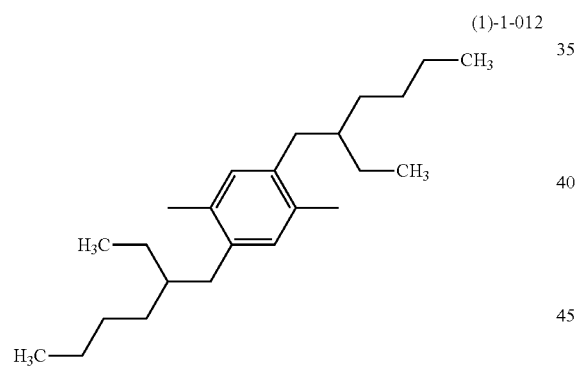
(1)-1-013
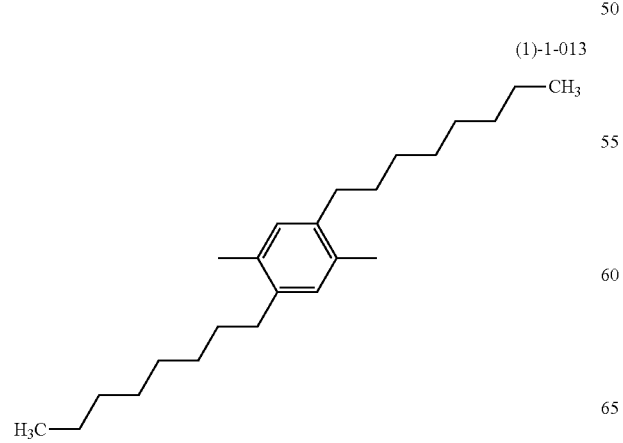
-continued
(1)-1-014
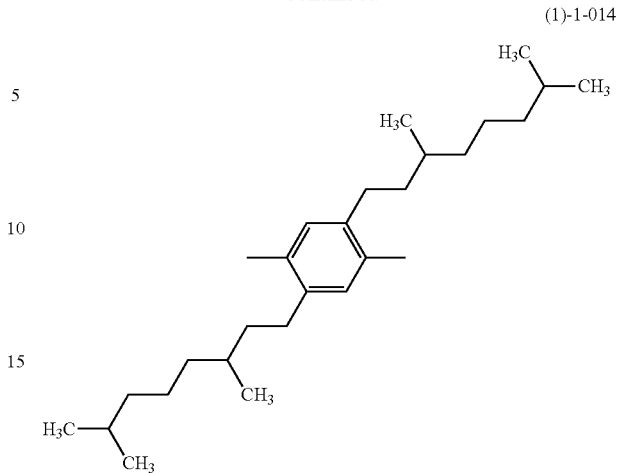
[Chemical Formula 8]
(1)-1-015
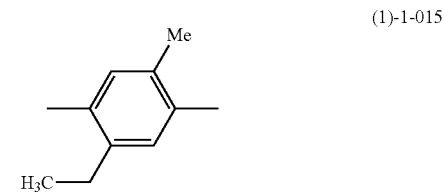
(1)-1-016
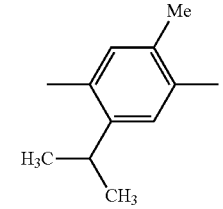
(1)-1-017
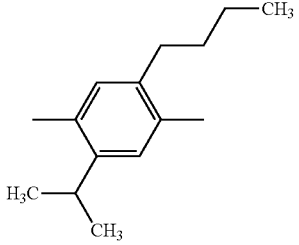
[Chemical Formula 9]
(1)-1-101
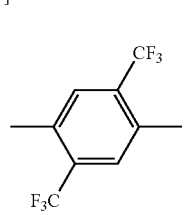
(1)-1-102
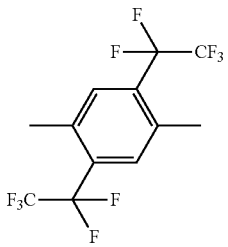

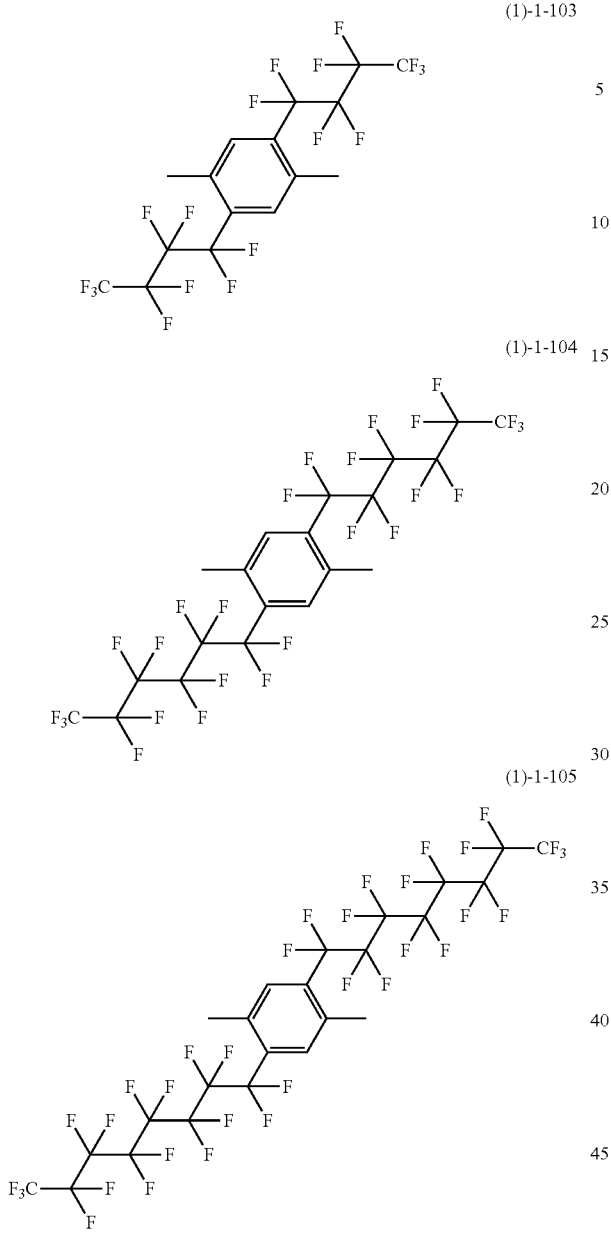
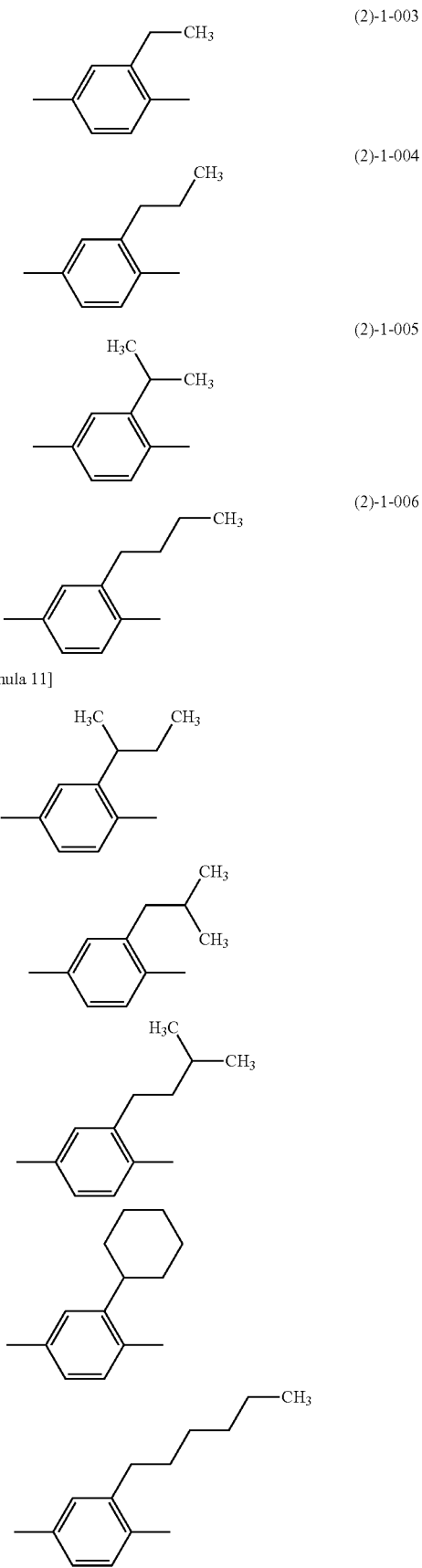
Examples of the constitutional unit represented by Formula (2)-1 may include the constitutional units represented by Formulae (2)-1-001 to (2)-1-015 and (2)-1-101 to (2)-1-105 below.
[Chemical Formula 10]
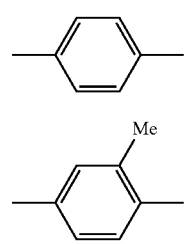
[Chemical Formula 11]

[Chemical Formula 12]

(2)-1-012 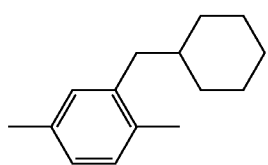

(2)-1-013 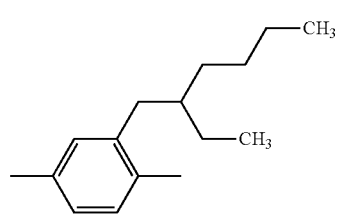

(2)-1-014 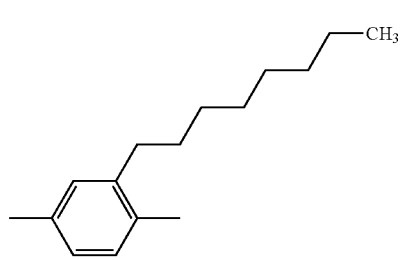

(2)-1-015 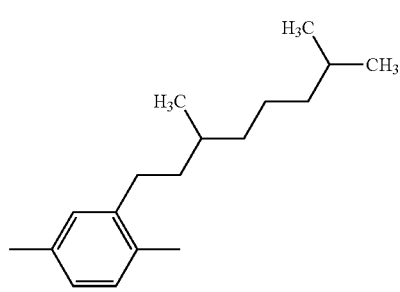

[Chemical Formula 13]

(2)-1-101 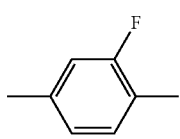

(2)-1-102 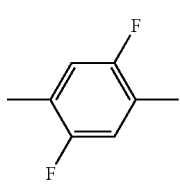

(2)-1-103 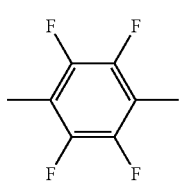

(2)-1-104 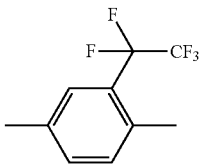

(2)-1-105 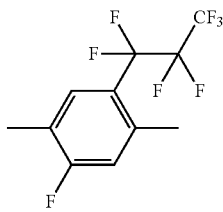

Either one type alone or two or more types of the constitutional unit represented by Formula (1)-1 and the constitutional unit represented by Formula (2)-1, respectively, may be contained in the polymer compound.

Constitutional unit represented by Formula (1)-2 and constitutional unit represented by Formula (2)-2

The polymer compound contained in the composition of the present invention contains a constitutional unit represented by Formula (1)-2 below and may further contain a constitutional unit represented by Formula (2)-2 below. The constitutional unit represented by Formula (2-2 below is different from the constitutional unit represented by Formula (1)-2 below.

[Chemical Formula 14]

(1)-2 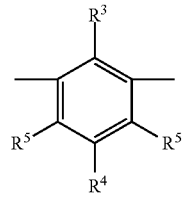

(2)-2 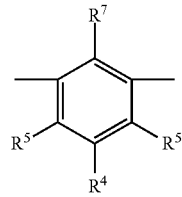

In Formula (1)-2, $R^3$ represents an alkyl group, an aryl group, a monovalent aromatic heterocyclic group, or an aralkyl group. When two or more $R^3$s are present in the polymer compound, two or more $R^3$s may be the same as or different from each other.

In Formula (1)-2 and Formula (2)-2, $R^4$ and $R^5$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group. When two or more $R^4$s are present in the polymer compound, two or more $R^4$s may be the same as or different from each other. Two $R^5$s that are present in Formula (1)-2 and Formula (2)-2 may be the same as or different from each other. When two or more $R^5$s are present in the polymer compound, two or more $R^5$s may be the same as or different from each other.

In Formula (2)-2, $R^7$ represents a hydrogen atom, an alkoxy group, an aryloxy group, an arylalkoxy group, a substituted amino group, a substituted carbonyl group, a formyl group, a substituted carboxyl group, or a flourine atom. When two or more $R^7$s are present in the polymer compound, two or more $R^7$s may be the same as or different from each other.

In Formula (1)-2, because the reactivity of the monomer during the polymerization thereof can be enhanced, $R^3$ is preferably an alkyl group, an aryl group, or an aralkyl group, more preferably an alkyl group, further preferably a methyl group, an ethyl group, a propyl group, a butyl group, a pentyl group, or a hexyl group, and particularly preferably a methyl group.

In Formulae (1)-2 and (2)-2, because the driving voltage of the light-emitting device obtained using the composition of the present invention can be lowered, $R^4$ is preferably a hydrogen atom, an alkyl group, an aryl group, a monovalent aromatic heterocyclic group, or a substituted amino group, and more preferably an unsubstituted aryl group or an aryl group substituted with an alkyl group, an aryl group, a monovalent aromatic heterocyclic group, or a substituted amino group; an unsubstituted monovalent aromatic heterocyclic group or a monovalent aromatic heterocyclic group substituted with an alkyl group, an aryl group, or a monovalent aromatic heterocyclic group; or a diaryl-substituted amino group, further preferably an aryl group substituted with a monovalent aromatic heterocyclic group or a substituted amino group; an unsubstituted monovalent aromatic heterocyclic group or a monovalent aromatic heterocyclic group substituted with an alkyl group, an aryl group, or a monovalent aromatic heterocyclic group; or a diaryl-substituted amino group, and particularly preferably a phenyl group substituted with a monovalent aromatic heterocyclic group or a substituted amino group; a pyridyl group substituted with an alkyl group, an aryl group, or a monovalent aromatic heterocyclic group; a pyrazyl group substituted with an alkyl group, an aryl group, or a monovalent aromatic heterocyclic group; a pyridazinyl group substituted with an alkyl group, an aryl group, or a monovalent aromatic heterocyclic group; a pyrimidyl group substituted with an alkyl group, an aryl group, or a monovalent aromatic heterocyclic group; a 1,3,5-triazine-2-yl group substituted with an alkyl group, an aryl group, or a monovalent aromatic heterocyclic group; a pyridyl group; or a diaryl-substituted amino group.

$R^4$ is preferably a group represented by Formula (3) below and/or a group represented by Formula (4) below.

[Chemical Formula 15]

(3)

(4)

In Formula (3) and Formula (4), $R^8$ and $R^9$ each independently represent an alkyl group, an aryl group, a monovalent aromatic heterocyclic group, or an aralkyl group. Two $R^8$s included in Formula (3) are optionally linked together. Two or more $R^8$s that are present in the polymer compound may be the same as or different from each other. Two $R^9$s that are present in Formula (4) are optionally linked together. Two or more $R^9$s that are present in the polymer compound may be the same as or different from each other.

In Formula (1)-2 and Formula (2)-2, because the reactivity of the monomer during the polymerization thereof can be enhanced, $R^5$ is preferably a hydrogen atom, an alkyl group, an aryl group, or a monovalent aromatic heterocyclic group, and more preferably a hydrogen atom.

In Formula (2)-2, because the reactivity of the monomer during the polymerization thereof can be enhanced, $R^7$ is preferably a hydrogen atom, an alkoxy group, an aryloxy group, an arylalkoxy group, and more preferably a hydrogen atom.

Examples of the constitutional unit represented by Formula (1)-2 may include the constitutional units represented by Formulas (1)-2-001 to (1)-2-017, (1)-2-101 to (1)-2-107, and (1)-2-201 to (1)-2-206 below.

[Chemical Formula 16]

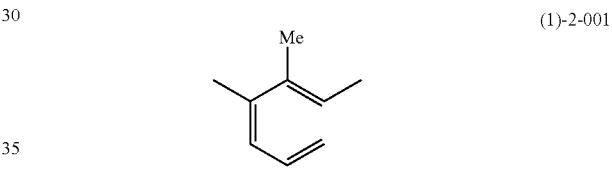

(1)-2-001

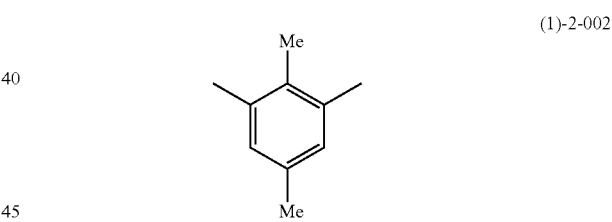

(1)-2-002

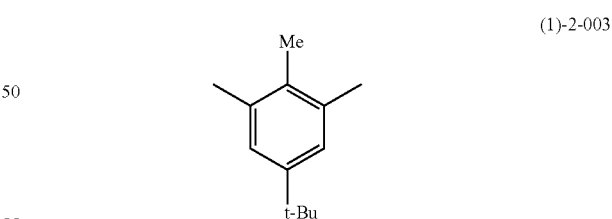

(1)-2-003

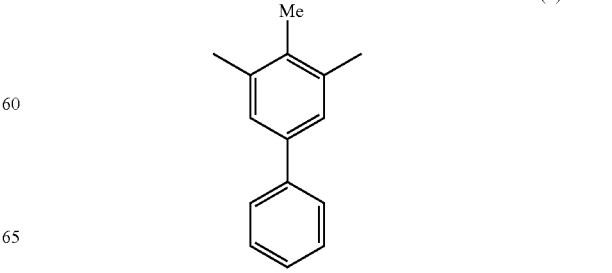

(1)-2-004

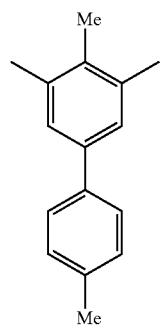 (1)-2-005
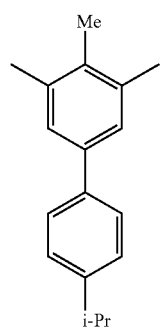 (1)-2-006
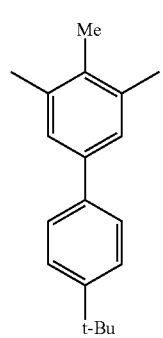 (1)-2-007
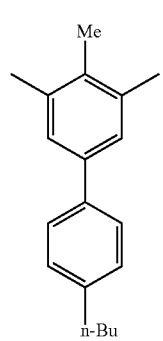 (1)-2-008
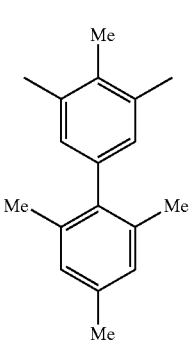 (1)-2-009
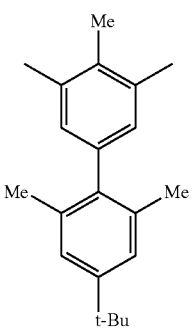 (1)-2-010
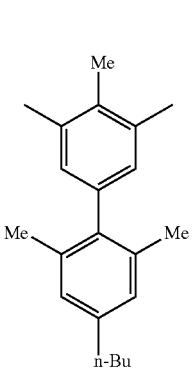 (1)-2-011
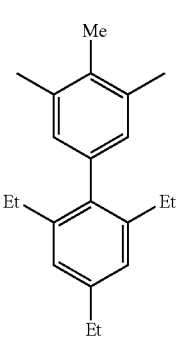 (1)-2-012
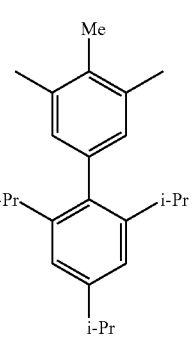 (1)-2-013
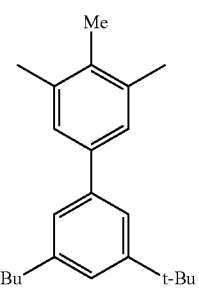 (1)-2-014

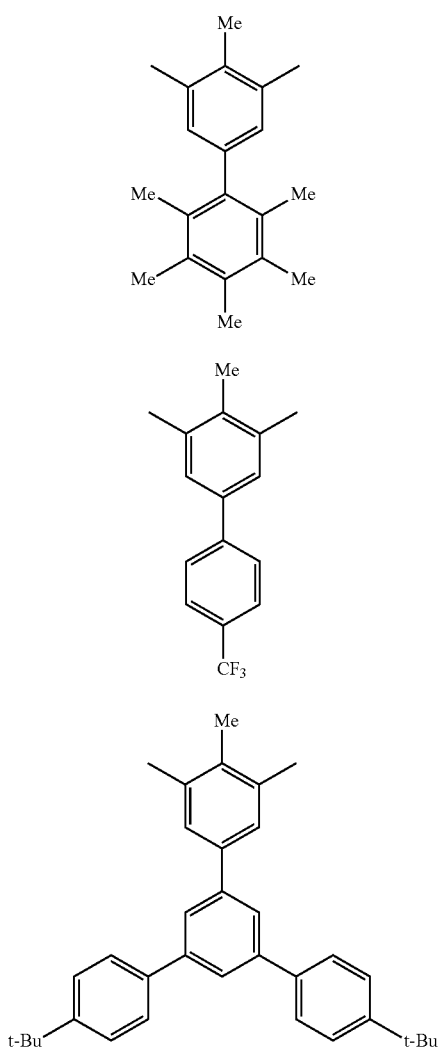
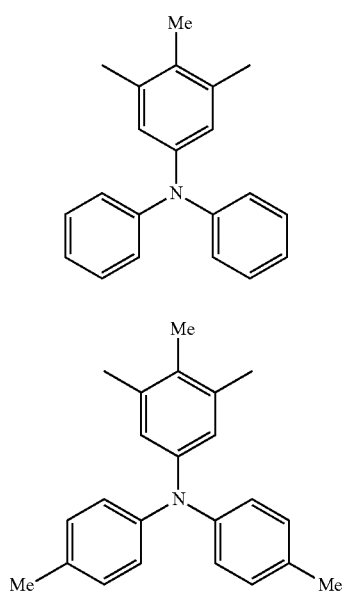
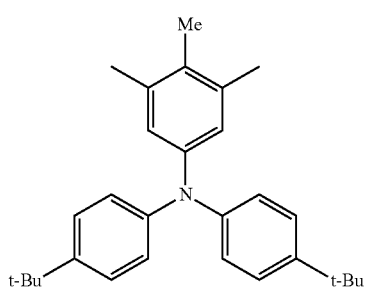
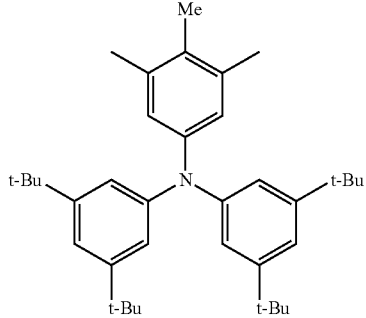
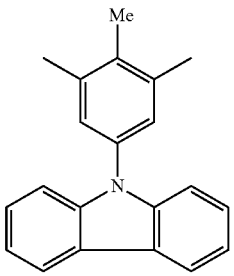
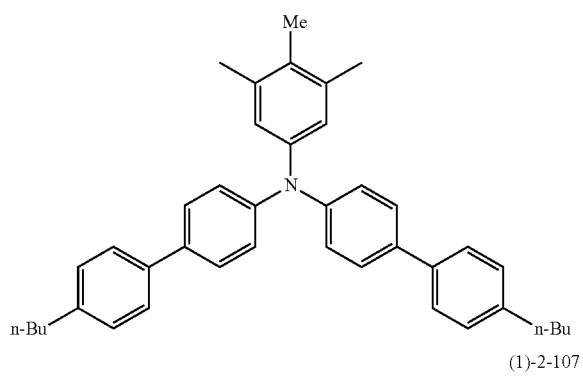
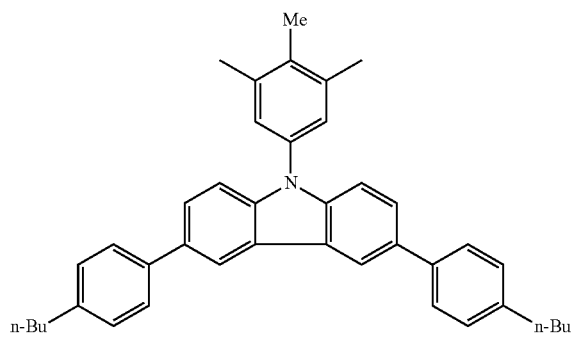

-continued
[Chemical Formula 18]
(1)-2-201
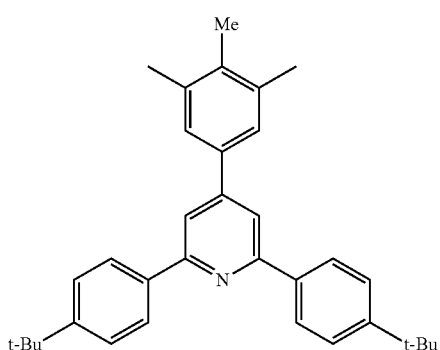
(1)-2-202
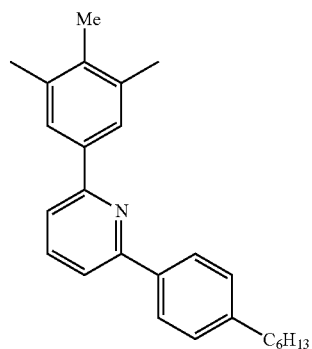
(1)-2-203
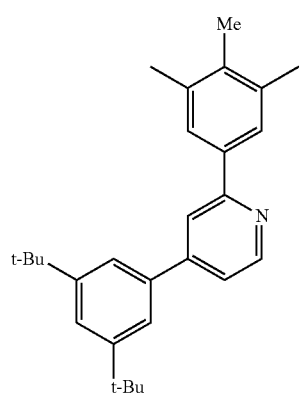
(1)-2-204
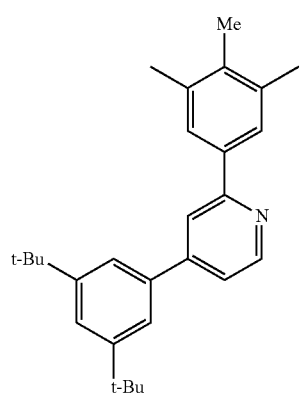
(1)-2-205
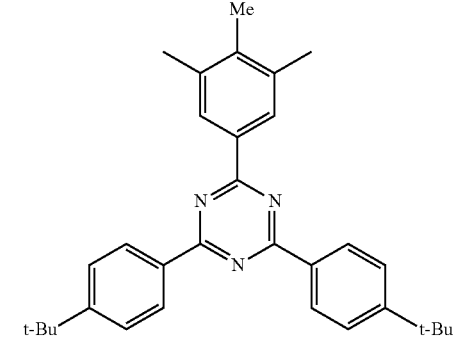
(1)-2-208
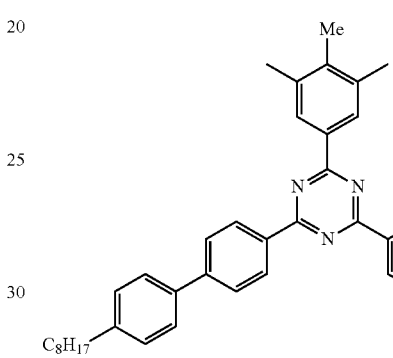
Examples of the constitutional unit represented by Formula (2)-2 may include the constitutional units represented by Formulae (2)-2-001 to (2)-2-019, (2)-2-101 to (2)-2-107, and (2)-2-201 to (2)-2-206 below.
[Chemical Formula 19]
(2)-2-001
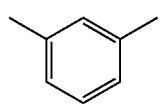
(2)-2-002
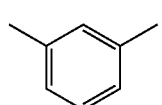
(2)-2-003
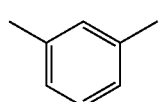
(2)-2-004
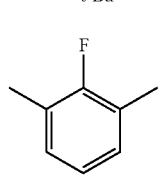

-continued
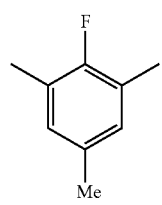
(2)-2-005
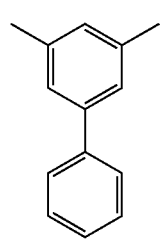
(2)-2-006
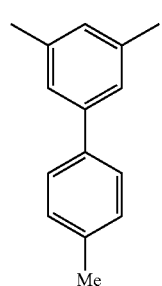
(2)-2-007
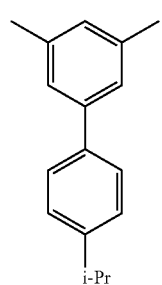
(2)-2-008
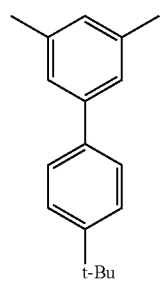
(2)-2-009
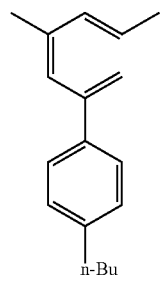
(2)-2-010
-continued
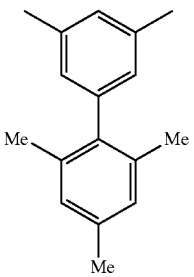
(2)-2-011
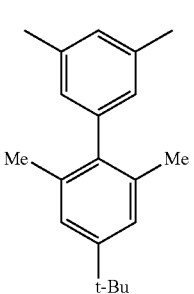
(2)-2-012
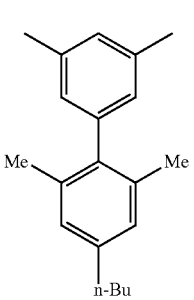
(2)-2-013
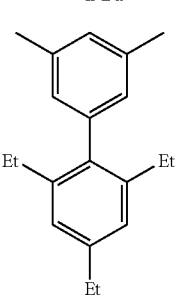
(2)-2-014
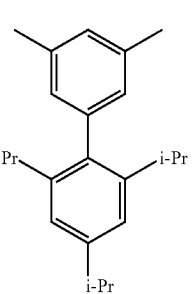
(2)-2-015
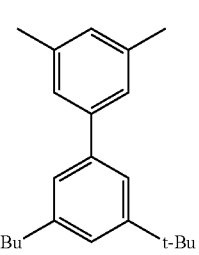
(2)-2-016

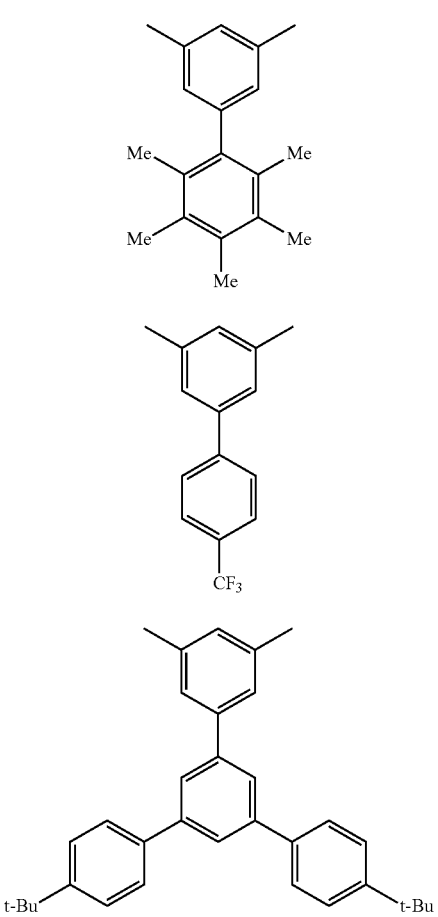
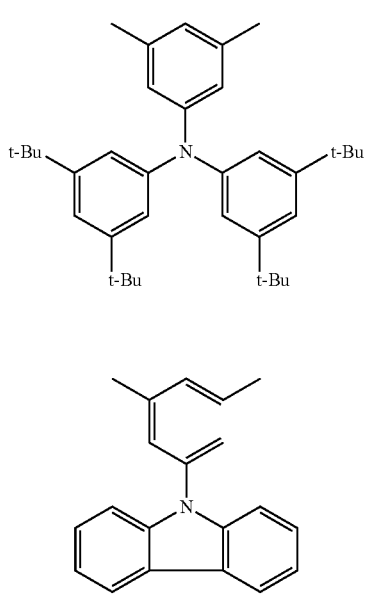
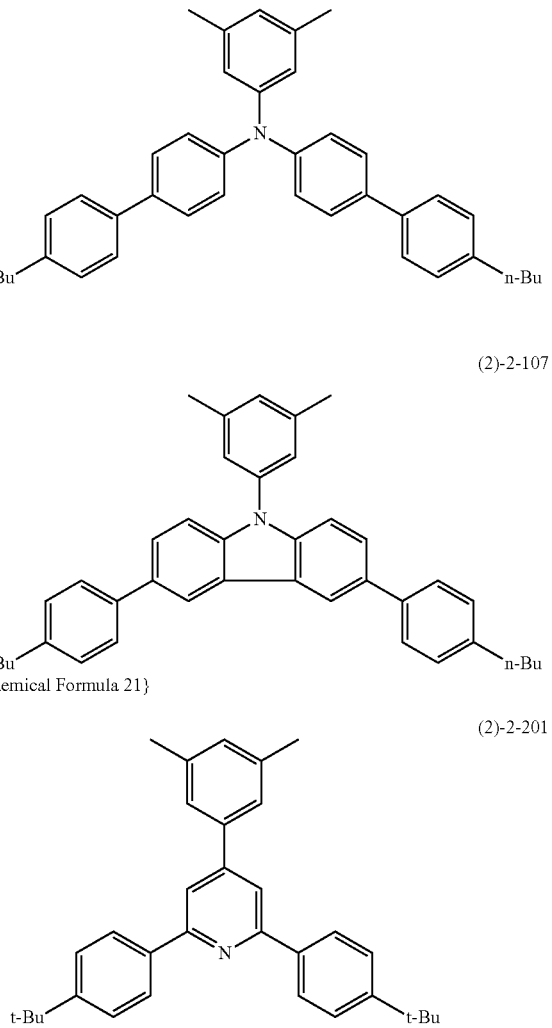

-continued (2)-2-202
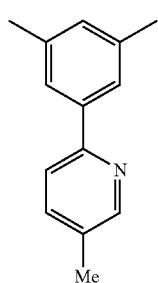

(2)-2-203
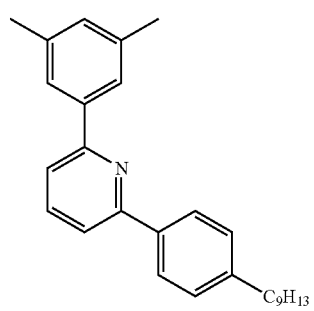

(2)-2-204
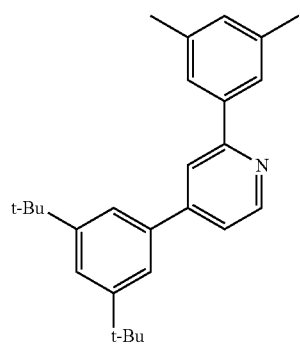

(2)-2-205
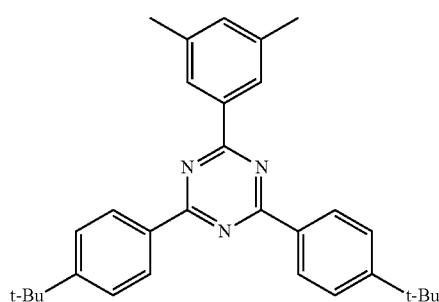

(2)-2-206
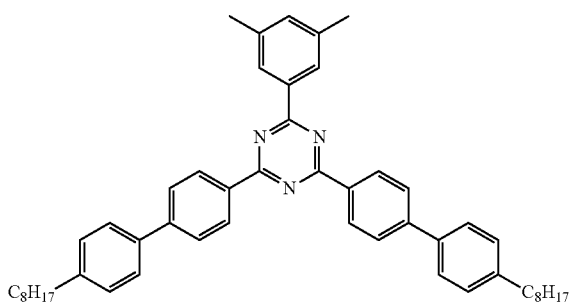

With respect to each of the constitutional units represented by Formulae (1)-2 and (2)-2, either one type alone or two or more types may be contained in the polymer compound.

Constitutional unit derived from phosphorescent light-emitting compound having light-emitting spectrum peak at smaller than 480 nm.

Because the workability during the manufacturing of the light-emitting device can be enhanced, the polymer compound may contain the below-described constitutional unit derived from a phosphorescent light-emitting compound having a light-emitting spectrum peak at smaller than 480 nm. When the polymer compound contains a constitutional unit derived from a phosphorescent light-emitting compound having a light-emitting spectrum peak of smaller than 480 nm, the polymer compound may be individually used for manufacturing the light-emitting device. That is, the polymer compound may be used for manufacturing the light-emitting device not as a composition of the polymer compound with the phosphorescent light-emitting compound having a light-emitting spectrum peak at smaller than 480 nm, but individually.

Examples of "the constitutional unit derived from the phosphorescent light-emitting compound having a light-emitting spectrum peak at smaller than 480 nm" may include: an arylene group or a divalent aromatic heterocyclic group that has as the substituent a residue remaining after removing one hydrogen atom from the above-mentioned phosphorescent light-emitting compound; a residue remaining after removing two hydrogen atoms from the above-mentioned phosphorescent light-emitting compound; and a residue retaining after removing three hydrogen atoms from the above-mentioned phosphorescent light-emitting compound. When the constitutional unit is the residue remaining after removing three hydrogen atoms from the above-mentioned phosphorescent light-emitting compound, the polymer compound takes a branched structure in the constitutional unit. A ratio of a total number of moles of the constitutional unit derived from the phosphorescent light-emitting compound having a light-emitting spectrum peak at smaller than 480 nm relative to a total number of moles of all constitutional units of the polymer compound is usually 0.01 to 0.3, because the luminous efficiency of the light-emitting device obtained from the composition of the present invention can be enhanced, preferably 0.05 to 0.3, more preferably 0.05 to 0.2, and further preferably 0.1 to 0.2.

Constitutional Unit Derived from Phosphorescent Light-Emitting Compound Having Light-Emitting Spectrum Peak at 480 nm or Larger The polymer compound may contain together with the constitutional unit derived from the phosphorescent light-emitting compound having a light-emitting spectrum peak at smaller than 480 min, the constitutional unit derived from the phosphorescent light-emitting compound having a light-emitting spectrum peak at 480 nm or larger. Herewith, the polymer compound can be utilized as a white light-emitting device. Examples of "the constitutional unit derived from the phosphorescent light-emitting compound having a light-emitting spectrum peak at 480 nm or larger" may include: an arylene group or a divalent aromatic heterocyclic group that has as the substituent, a residue remaining after removing one hydrogen atom from the above-mentioned phosphorescent light-emitting compound; a residue remaining after removing two hydrogen atoms from the above-mentioned phosphorescent light-emitting compound; and a residue remaining after removing three hydrogen atoms from the above-mentioned phosphorescent light-emitting compound.

When the constitutional unit is the residue remaining after removing three hydrogen atoms from the above-mentioned phosphorescent light-emitting compound, the polymer compound takes a branched structure in the constitutional unit.

Ratio of Constitutional Unit in Polymer Compound

Examples of the polymer compound in the present invention may include the compounds EP-1 to EP-4 below.

TABLE 1

RATIO OF NUMBER OF MOLES OF CONSTITUTIONAL UNIT

| COMPOUND | FORMULA (1)-1 u | FORMULA (1)-2 v | FORMULA (2)-1 w | FORMULA (2)-2 x | CONSTITUTIONAL UNIT DERIVED FROM PHOSPHORESCENT LIGHT-EMITTING y |
|---|---|---|---|---|---|
| EP-1 | 0.001-0.999 | 0.001-0.999 | 0 | 0 | 0-0.3 |
| EP-2 | 0.001-0.998 | 0.001-0.998 | 0.001-0.998 | 0 | 0-0.3 |
| EP-3 | 0.001-0.998 | 0.001-0.998 | 0 | 0.001-0.998 | 0-0.3 |
| EP-4 | 0.001-0.997 | 0.001-0.997 | 0.001-0.997 | 0.001-0.997 | 0-0.3 |

[In Table 1, u, v, w, x, and y each are a number representing a mole fraction; and they satisfy: $u+v+w+x+y=1.0$; and $1 \geq u+v+w+x \geq 0.7$]

In the polymer compound contained in the composition of the present invention, a ratio of a total number of moles of the constitutional unit represented by Formula (1)-2 and the constitutional unit represented by Formula (2)-2 relative to a total number of moles of the constitutional unit represented by Formula (1)-1 and the constitutional unit represented by Formula (2)-1 is usually 0.1 to 9.0, because the reactivity of the monomer during 1.5 the polymerization thereof can be enhanced, preferably 0.2 to 5.0, and more preferably 0.25 to 1.0.

In the polymer compound contained in the composition of the present invention, because the driving voltage of the light-emitting device obtained from the composition can be lowered, a ratio of a total number of moles of the constitutional unit represented by Formula (1)-2 and the constitutional unit represented by Formula (2)-2 in which $R^4$ is the group represented by Formula (3) and the constitutional unit represented by Formula (1)-2 and the constitutional unit represented by Formula (2)-2 in which $R^4$ is the group represented by Formula (4), relative to a total number of moles of the constitutional unit represented by Formula (1)-1, the constitutional unit represented by Formula (2)-1, the constitutional unit represented by Formula (1)-2 in which $R^4$ is neither the group represented by Formula (3) nor the group represented by Formula (4), and the constitutional nit represented by Formula (2)-2 in which $R^4$ is neither the group represented by Formula (3) nor the group represented by Formula (4), is preferably 0.1 to 9.0, more preferably 0.2 to 1.0, and further preferably 0.25 to 1.0.

In the polymer compound contained in the composition of the present invention, because the driving voltage of the light-emitting device obtained from the composition can be lowered and the luminous efficiency of the light-emitting device can be enhanced, a ratio of a total number of moles of the constitutional unit represented by Formula (1)-2 and the constitutional unit represented by Formula (2)-2 in which $R^4$ is the group represented by Formula (3), relative to a total number of moles of the constitutional unit represented by Formula (1)-2 and the constitutional unit represented by Formula (2)-2 in which $R^4$ is the group represented by Formula (4), is preferably 0.1 to 9.0, more preferably 0.2 to 5.0, and further preferably 0.5 to 2.0.

One or more types of the constitutional unit represented by Formula (1)-1 and One or more types of the constitutional unit represented by Formula (1)-2 may be contained in the polymer compound.

The constitutional unit represented by Formula (2)-1 and the constitutional unit represented by Formula (2)-2 are an arbitral constitutional unit capable of being contained in the polymer compound and one or more types of them may be contained.

The arrangement of each constitutional unit contained in the polymer compound is not limited. Constitutional units of the same type may be continuously bonded, or a constitutional unit of a type and a constitutional unit of another type may be linked together. Because the luminous efficiency of the light-emitting device obtained from the composition of the present invention can be enhanced, it is preferred that: the constitutional units represented by Formula (2)-1 are not substantially adjacent to each other; the constitutional units represented by Formula (2)-2 are not substantially adjacent to each other; and the constitutional unit represented by Formula (2)-1 and the constitutional unit represented by Formula (2)-2 are not substantially adjacent to each other. Here, "not substantially adjacent to each other" means that a ratio of the total of the number of bonds by which the constitutional units represented by Formula (2)-1 are adjacent to each other, the number of bonds by which the constitutional units represented by Formula (2)-2 are adjacent to each other, and the number of bonds by which the constitutional unit represented by Formula (2)-1 and the constitutional unit represented by Formula (2-2 are adjacent to each other, to the number of all bonds of the constitutional units to each other, is less than 0.05.

Others

The polymer compound contained in the composition of the present invention can become a polymer having an arbitral form such as a linear polymer, a branched polymer, a hyper-branched polymer, a cyclic polymer, a comb-shaped polymer, a star-shaped polymer, and a network polymer. The polymer compound may also be a polymer having arbitral formulation and/or arbitral regularity such as a homopolymer, an alternating copolymer, a periodic copolymer, a random copolymer, a block copolymer, and a graft copolymer that have the above-mentioned arbitral shape.

When a terminal group of the polymer compound contained in the composition of the present invention is a polymerization-active group, in the case where the composition is used for manufacturing the light-emitting device, there is a probability for lowering the luminous efficiency or the brightness life of the obtained light-emitting device, so that the terminal group is preferably a stable group. The terminal group is preferably a group conjugation-bonded so the main chain of the polymer compound and, for example, is a croup bonded to an aryl group or a monovalent aromatic heterocyclic group through a carbon-carbon bond. These aryl group and monovalent aromatic heterocyclic group are the same groups as the groups described and exemplified above as the aryl group and the monovalent aromatic heterocyclic group represented by $R^1$ in Formula (1)-1.

The polymer compound contained in the composition of the present invention has a polystyrene-equivalent number average molecular weight (Mn), measured by gel permeation chromatography (hereinafter, called "GPC"), of usually $1 \times 10^3$ to $1 \times 10^8$, preferably $1 \times 10^4$ to $1 \times 10^6$, and more preferably $1 \times 10^4$ to $5 \times 10^5$. The polymer compound has a polystyrene-equivalent weight average molecular weight (Mw) of usually $1 \times 10^3$ to $1 \times 10^8$, because the film formation property of the polymer compound and the luminous efficiency of the light-emitting device obtained from the composition of the present invention can be enhanced, preferably $1 \times 10^4$ to $5 \times 10^6$, more preferably $3 \times 10^4$ to $1 \times 10^6$, and further preferably $3 \times 10^4$ to $5 \times 10^5$. Examples of the analysis condition for GPC may include, unless defined otherwise, the analysis conditions illustrated in Examples below.

Because the durability of the composition of the present invention for a process for manufacturing the light-emitting device or the like and the stability (heat resistance) of the composition relative to heat generation during the drive of the light-emitting device can be enhanced, the polymer compound contained in the composition of the present invention has a glass transition temperature of preferably 70° C. or more, and more preferably 100° C. or more.

A ratio of the weight of the polymer compound contained in the composition of the present invention in usually 0.1 to 0.99, preferably 0.5 to 0.95, and more preferably 0.7 to 0.95.

<Phosphorescent Light-Emitting Compound Having Light-Emitting Spectrum Peak at Smaller than 480 nm>

Examples of the phosphorescent light-emitting compound having a light-emitting spectrum peak at smaller than 480 nm that is contained in the composition of the present invention may include phosphorescent light-emitting compounds (iridium complex) having a light-emitting spectrum peak at smaller than 480 nm and containing iridium as a central metal.

As the phosphorescent light-emitting compound having a light-emitting spectrum peak at smaller than 480 nm that is contained in the composition of the present invention, the compounds represented by Formulae (101) to (105) below are preferred.

[Chemical Formula 22]

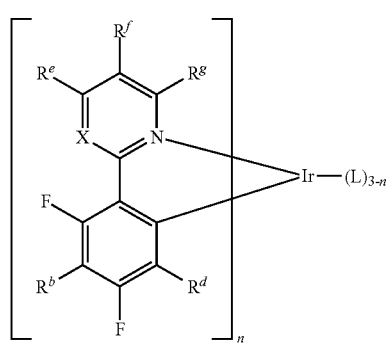
(101)

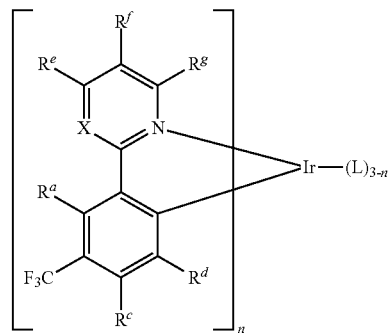
(102)

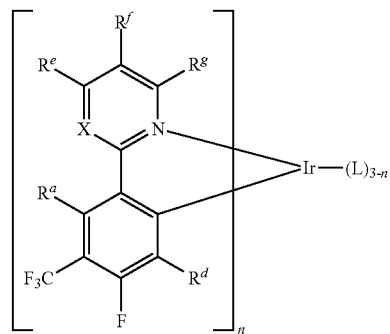
(103)

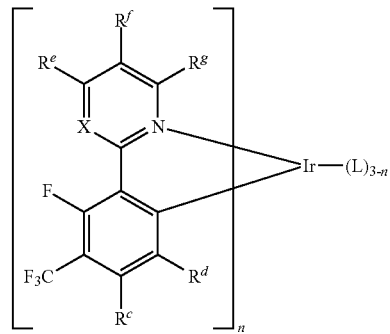
(104)

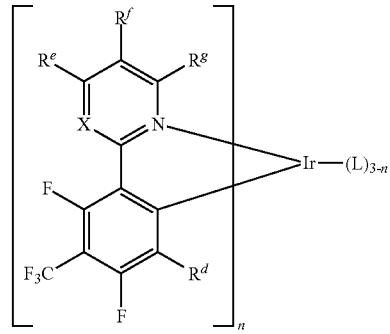
(105)

In Formulae (101) to (105), X represents a carbon atom or a nitrogen atom; $R^a$, $R^b$, $R^c$, $R^d$, $R^e$, $R^f$, and $R^g$ each independently represent a hydrogen atom, a substituted or unsubstituted alkyl group having 1 to 30 carbon atoms, a substituted or unsubstituted aryl group having 6 to 60 carbon atoms, a substituted or unsubstituted alkenyl group having 2 to 30 carbon atoms, a substituted or unsubstituted alkynyl group having 2 to 30 carbon atoms, a substituted or unsubstituted amino group having 0 to 30 carbon atoms, a substituted or unsubstituted monovalent heterocylic group having 1 to 60 carbon atoms, a substituted or unsubstituted alkoxy group having 1 to 30 carbon atoms, a substituted or unsubstituted alkylthio group having 1 to 30 carbon atoms, a substituted or unsubstituted aryloxy group having 6 to 60 carbon atoms, a substituted or unsubstituted arylthio group having 6 to 60 carbon atoms, a substituted or unsubstituted heterocyclic ring-oxy group having 1 to 60 carbon atoms, a substituted or unsubstituted heterocyclic ring-thio group having 1 to 60 carbon atoms, an acyl group, an acyloxy group, an amido group, an acid imido group, an imine residue, a substituted silyl group, a substituted silyloxy group, a substituted silylthio group, a substituted silylamino group, a halogen atom, a cyano group, or a carboxyl group; at least one of $R^a$, $R^b$, $R^c$, $R^d$, $R^e$, $R^f$, and $R^g$ an alkyl group; L represents a bidentate ligand; the groups adjacent to each other among $R^a$, $R^b$, $R^c$, $R^d$, $R^e$, $R^f$, and $R^g$ may be linked together to form a ring structure; n is an integer of 1 to 3; when n is 1, two Ls may be the same as or different from each other.

n is an integer of 1 to 3, preferably 2 or 3. When n is 3, such a compound has geometric isomers such as a facial body and a meridional body, where the facial body is preferred.

The bidentate ligand represented by L is preferably a neutral bidentate ligand and an anionic bidentate ligand, more preferably an anionic bidentate ligand, and particularly preferably a monoanionic bidentate ligand.

L is preferably a bidentate ligand forming a metal-nitrogen bond and a metal-carbon bond between the ligand and an iridium atom, a bidentate ligand forming a metal-nitrogen bond and a metal-oxygen bond between the ligand and an iridium atom, a bidentate ligand forming two metal-oxygen bonds between the ligand and an iridium atom, or a bidentate ligand forming two metal-nitrogen bonds between the ligand and an iridium atom.

L is particularly preferably a bidentate ligand represented by any of Formulae (106) to (108).

[Chemical Formula 23]

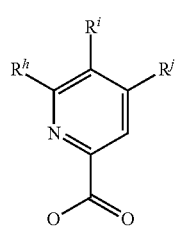
(106)

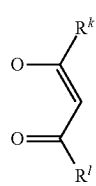
(107)

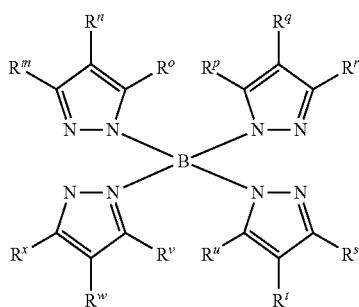
(108)

In Formulae (106) to (108), $R^h$, $R^i$, $R^j$, $R^k$, $R^l$, $R^m$, $R^n$, $R^o$, $R^p$, $R^q$, $R^r$, $R^s$, $R^t$, $R^u$, $R^v$, $R^w$, and $R^x$ each independently represent a hydrogen atom, a substituted or unsubstituted alkyl group having 1 to 30 carbon atoms, a substituted or unsubstituted aryl group having 6 to 60 carbon atoms, a substituted or unsubstituted alkenyl group having 2 to 30 carbon atoms, a substituted or unsubstituted alkynyl group having 2 to 30 carbon atoms, amino group optionally having a substituent having 0 to 30 carbon atoms, a substituted or unsubstituted monovalent heterocyclic group having 1 to 60 carbon atoms, a substituted or unsubstituted alkoxy group having 1 to 30 carbon atoms, a substituted or unsubstituted alkylthio group having 1 to 30 carbon atoms, a aryloxy group optionally having a substituent having 6 to 60 carbon atoms, a substituted or unsubstituted arylthio group having 6 to 60 carbon atoms, a substituted or unsubstituted heterocyclic ring-oxy group having 1 to 60 carbon atoms, a substituted or unsubstituted heterocyclic ring-thin group having 1 to 60 carbon atoms, an acyl group, an acyloxy group, an amido group, an acid imido group, an imine residue, a substituted silyl group, a substituted silyloxy group, a substituted silylthio group, a substituted silylamino group, a halogen atom, a cyano group, a carboxyl group, or a trifluoromethyl group; and the groups adjacent to each other among $R^h$ to $R^x$ may be linked together to form a ring structure.

The phosphorescent light-emitting compound having a light-emitting spectrum peak at smaller than 480 nm that is contained in the composition of the present invention is preferably a phosphorescent light-emitting compound having a light-emitting spectrum peak at smaller than 475 nm from the viewpoint of the color reproducibility of the display device.

More preferred examples of the phosphorescent light-emitting compound having a light-emitting spectrum peak at smaller than 480 nm may include Ir-1 (trade name: ADS065BE) and Ir-2 (trade name: ADS070BE), which are commercially available from American Dye Source Inc., Ir-3 (trade name: LT-N620), which is commercially available from OHJEC CORPORATION, Ir-4 described in Japanese Patent Laid-open Publication No. 2004-139819, Ir-5, Ir-6, and Ir-7 described in International Publication No. WO 2004/034751, Ir-8, Ir-9, Ir-10, Ir-11, Ir-12, Ir-13, and a phosphorescent light-emitting compound A described in Japanese Patent Application Laid-open No. 2008-74921, and a phosphorescent light-emitting compound B to a phosphorescent light-emitting compound J described in International Publication No. WO 2011/024737.

[Chemical Formula 24]
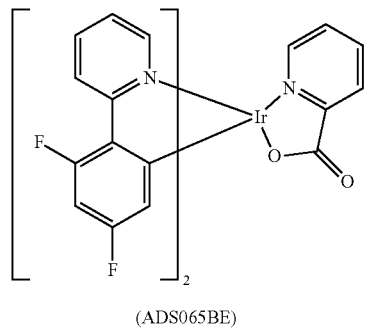
(ADS065BE) Ir-1
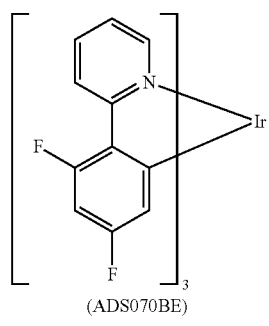
(ADS070BE) Ir-2
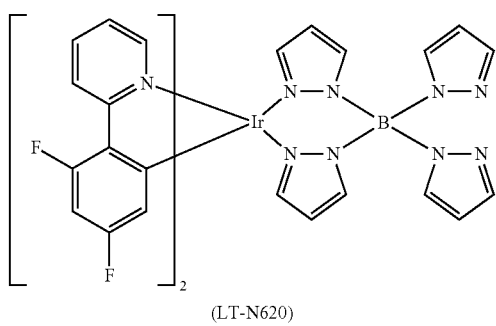
(LT-N620) Ir-3
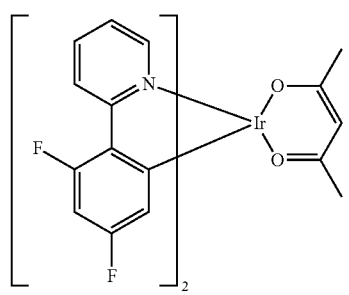
Ir-4
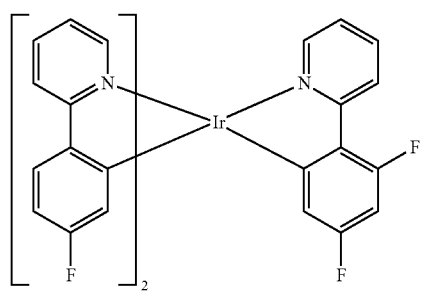
Ir-5
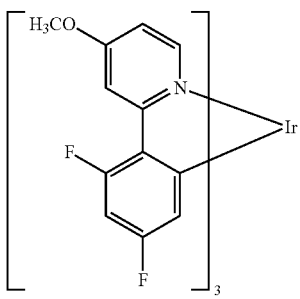
Ir-6
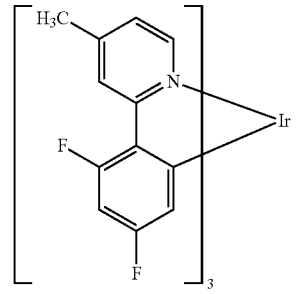
Ir-7
[Chemical Formula 25]
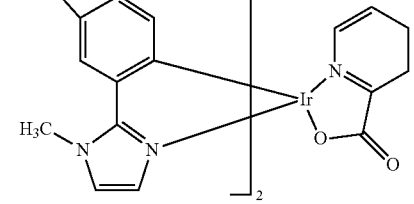
Ir-8
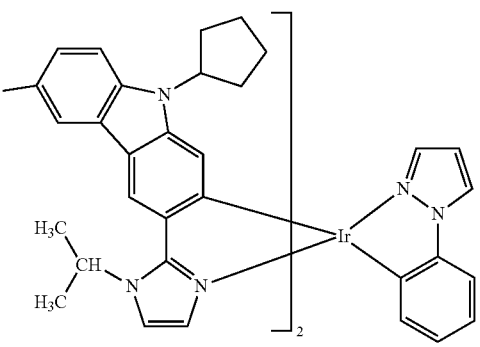
Ir-9

-continued
Ir-10 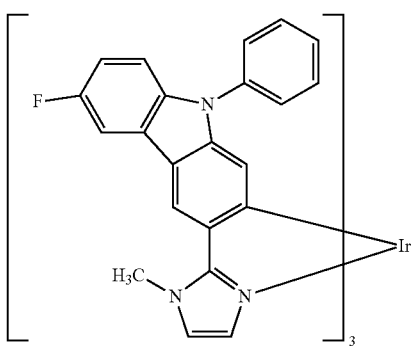
[Chemical Formula 26]
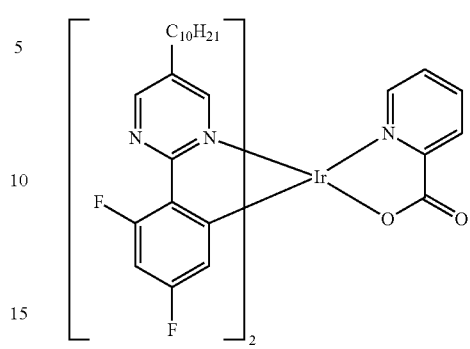
COMPOUND A
PHOSPHORESCENT LIGHT-EMITTING
Ir-11 [Chemical Formula 27]
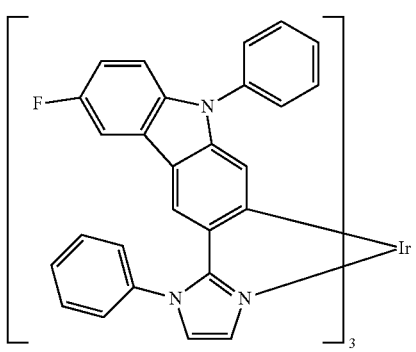
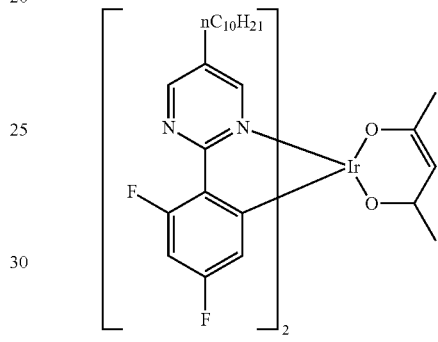
COMPOUND B
PHOSPHORESCENT LIGHT-EMITTING
Ir-12
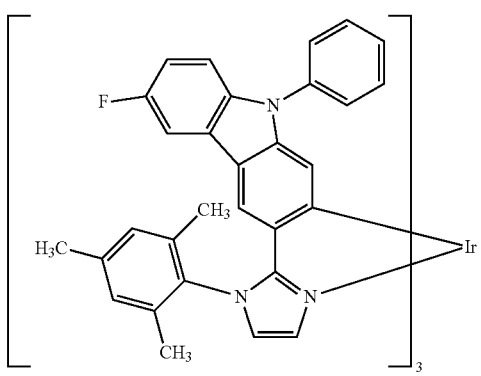
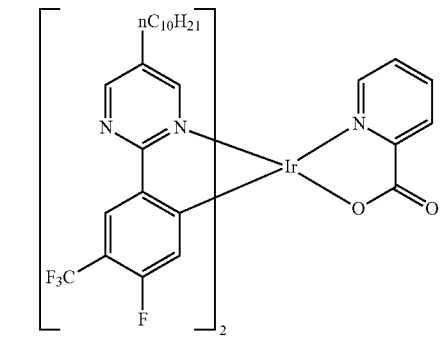
COMPOUND C
PHOSPHORESCENT LIGHT-EMITTING
Ir-13
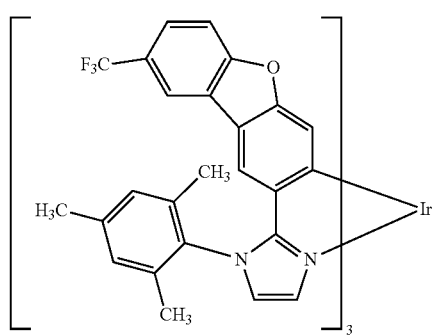
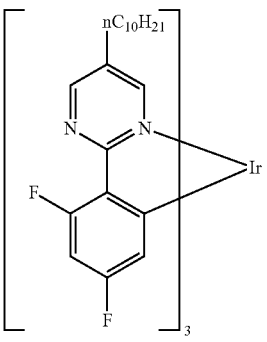
COMPOUND D
PHOSPHORESCENT LIGHT-EMITTING

COMPOUND E

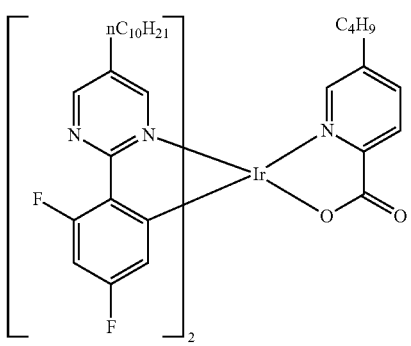

PHOSPHORESCENT
LIGHT-EMITTING

COMPOUND F

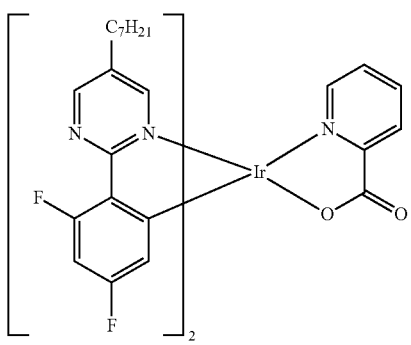

PHOSPHORESCENT
LIGHT-EMITTING

COMPOUND G

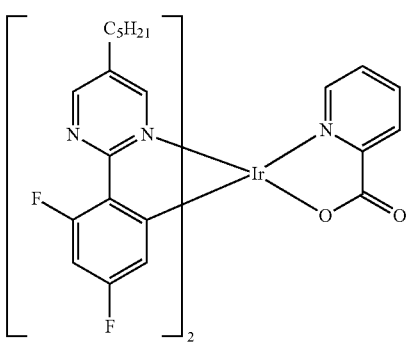

PHOSPHORESCENT
LIGHT-EMITTING

COMPOUND H

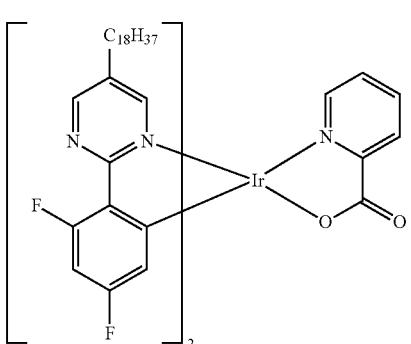

PHOSPHORESCENT
LIGHT-EMITTING

COMPOUND I

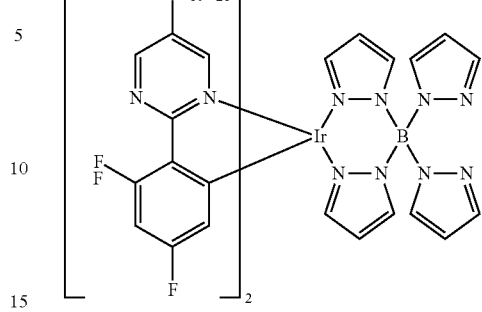

PHOSPHORESCENT
LIGHT-EMITTING

COMPOUND J

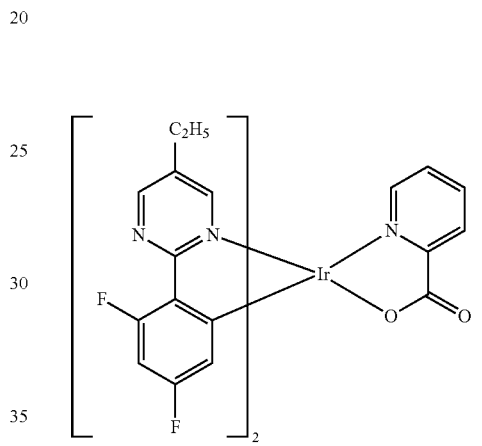

PHOSPHORESCENT
LIGHT-EMITTING

Other examples of the phosphorescent light-emitting compound having a light-emitting spectrum peak at smaller than 480 nm may include a phosphorescent light-emitting compound having a light-emitting spectrum peak at smaller than 480 nm and containing platinum as a central metal. Examples of such a compound may include Pt-1 (trade name: ADS064BE) commercially available from American Dye Source Inc. and Pt-2 described in Japanese Patent Application Laid-open No. 2004-139319.

[Chemical Formula 28]

Pt-1

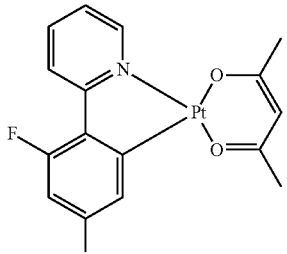

(ADS064BE)

-continued

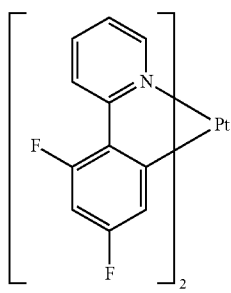

Pt-2

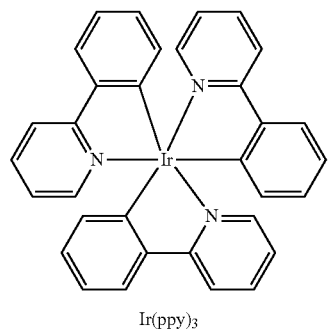

Ir(ppy)₃

The light-emitting spectrum peak of the phosphorescent light-emitting compound can be evaluated, for example, by a method including: dissolving the compound in an organic solvent such as xylene, toluene, and chloroform to prepare a dilute solution thereof; and measuring the PL spectrum of the dilute solution.

As the phosphorescent light-emitting compound contained in the composition of the present invention, an iridium complex is preferred. The iridium complex has more preferably a fluorine atom or a trifluoromethyl group from the viewpoint of the light-emitting spectrum. The iridium complex has more preferably an alkyl group because of having advantageous solubility.

A ratio of the weight of the phosphorescent light-emitting compound contained in the composition of the present invention relative to the weight of the polymer compound is usually 0.05 to 0.5, because the luminous efficiency of the light-emitting device obtained from the composition can be enhanced, preferably 0.1 to 0.4, and more preferably 0.2 to 0.4.

<Phosphorescent Light-Emitting Compound Having Light-Emitting Spectrum Peak at 480 nm or Larger>

The composition of the present invention may contain besides the phosphorescent light-emitting compound having a light-emitting spectrum peak at smaller than 480 nm, a phosphorescent light-emitting compound (hereinafter, may be called "light-emitting material") having a light-emitting spectrum peak at 480 mm or larger. Examples of the phosphorescent light-emitting compound having a light-emitting spectrum peak at 480 nm or larger may include the compounds below.

Compounds containing iridium as a central metal (iridium complex): Ir (ppy)₃ (for example, described in Appl. Phys. Lett., (1999), 75(1), 4 and Jpn. J. Appl. Phys., 34, 1883 (1995)); ADS066GE (trade name) commercially available from American Dye Source Inc.; Btp₂Ir (acac) (for example, described in Appl. Phys. Lett., (2001), 78(11), 1622); a light-emitting material P to a light-emitting material U; and the like.

Compounds containing platinum as a central metal (platinum complex): PtOEP (for example, described in Nature, (1998), 395, 151) and the like.

Compounds containing europium as a central metal (europium complex): Eu(TTA)₃-phen and the like.

Among them, an iridium complex is preferred.

[Chemical Formula 29]

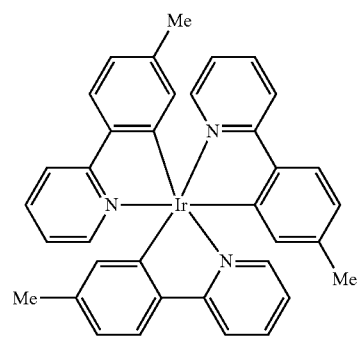

ADS066GE

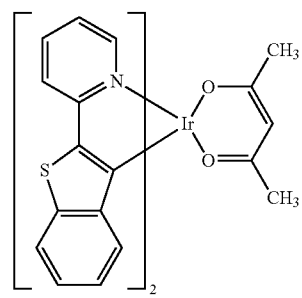

Btp₂Ir(aoac)

[Chemical Formula 30]

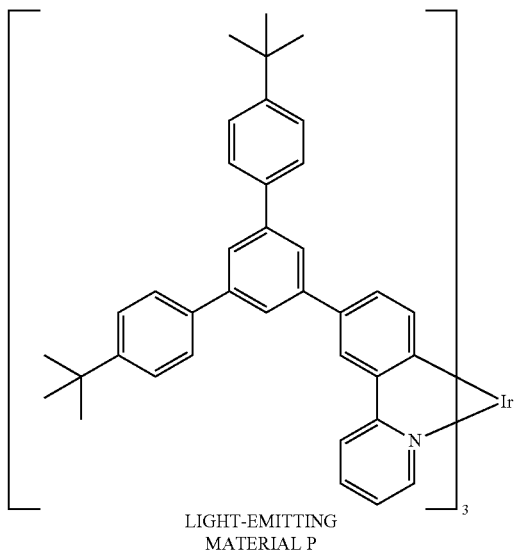

LIGHT-EMITTING MATERIAL P

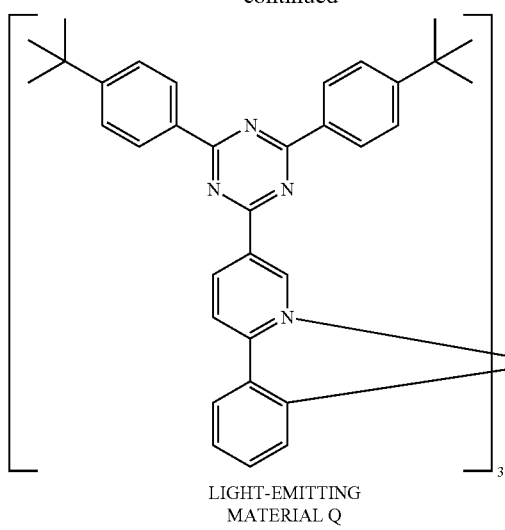
LIGHT-EMITTING MATERIAL Q
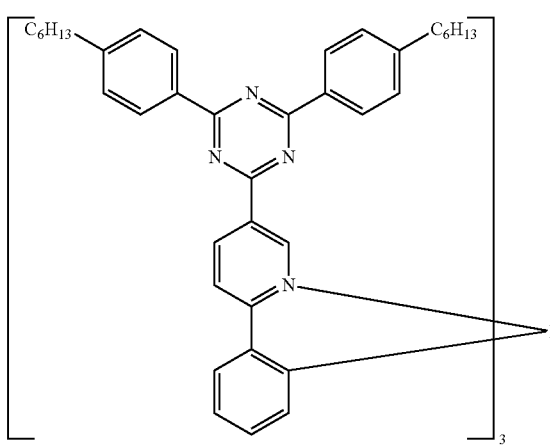
LIGHT-EMITTING MATERIAL R
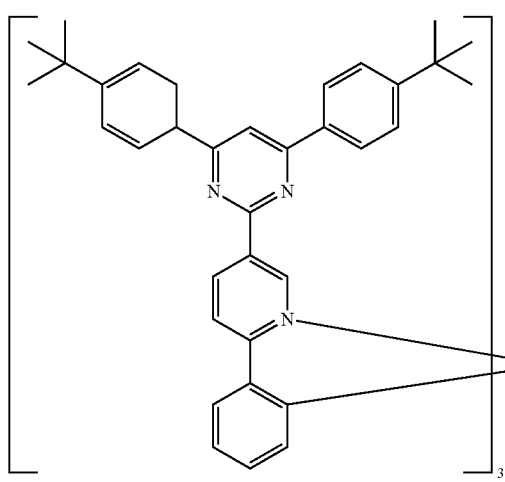
LIGHT-EMITTING MATERIAL S
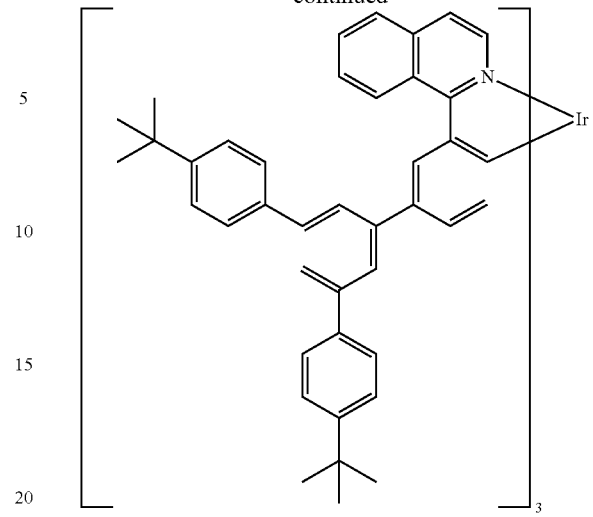
LIGHT-EMITTING MATERIAL T
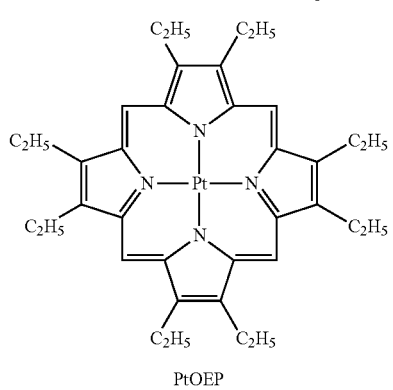
LIGHT-EMITTING MATERIAL U
[Chemical Formula 31]
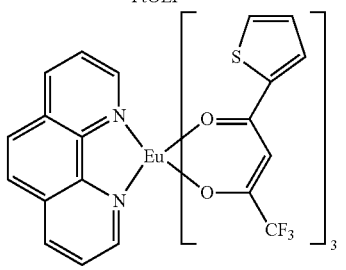
PtOEP
Eu(TTA)₃phen
By containing together with the phosphorescent light-emitting compound having a light-emitting spectrum peak at smaller than 480 nm, the phosphorescent light-emitting compound having a light-emitting spectrum peak at 480 nm or larger in the composition of the present invention, the light-emitting spectrum of the composition can be controlled. Particularly, by preparing the phosphorescent light-emitting compound having a light-emitting spectrum peak at 480 nm or larger as a combination of a phosphorescent light-emitting compound having a light-emitting spectrum peak in a green color region with a phosphorescent light-emitting compound having a light-emitting spectrum peak in a red color region, the obtained composition becomes possible to be utilized for manufacturing a white light-emitting device.

The phosphorescent light-emitting compound having a light-emitting spectrum peak in a green color region is preferably a phosphorescent light-emitting compound having a light-emitting spectrum peak at 480 nm or larger and smaller than 580 nm. The phosphorescent light-emitting compound having a light-emitting spectrum peak in a red color region is preferably a phosphorescent light-emitting compound having a light-emitting spectrum peak at 580 nm or larger and smaller than 680 nm.

Examples of the phosphorescent light-emitting compound having a light-emitting spectrum peak at 480 nm or larger and smaller than 580 nm may include $Ir(ppy)_3$, ADS-066GE, the light-emitting material P, and the light-emitting material U, which are described above, and among them, the light-emitting material P and the light-emitting material U are preferred. Examples of the phosphorescent light-emitting compound having a light-emitting spectrum peak at 580 nm or larger end smaller than 680 nm may include $3tp_2Ir(acac)$, PtOEP, $Eu(TTA)_3phen$, the light-emitting material Q, the light-emitting material R, the light-emitting material S, and the light-emitting material T, which are described above, and among them the light-emitting material Q, the light-emitting material R, the light-emitting material S, and the light-emitting material T are preferred.

Because the light-emitting device obtained by using the composition of the present invention emits white color light and the luminous efficiency can be enhanced, a ratio of the total, weight of the phosphorescent light-emitting compound having a light-emitting spectrum peak at 480 nm or larger and smaller than 580 nm and the phosphorescent light-emitting compound having a light-emitting spectrum peak at 580 nm or larger and smaller than 680 nm relative to the weight of the phosphorescent light-emitting compound having a light-emitting spectrum peak at smaller than 480 nm, is preferably 0.01 to 0.3, more preferably 0.01 to 0.2, and further preferably 0.03 to 0.2.

Because the light-emitting device obtained by using the composition of the present invention has a luminescent chromaticity falling in a white color range and the luminous efficiency can be enhanced, a ratio of the weight of the phosphorescent light-emitting compound having a light-emitting spectrum peak at 480 nm or larger and smaller than 580 nm relative to the weight of the phosphorescent light-emitting compound having a light-emitting spectrum peak at 580 nm or larger and smaller than 680 nm is preferably 1.0 to 10.0, more preferably 1.0 to 5.0, and further preferably 1.0 to 3.0.

It can be confirmed that the light-emitting device obtained from the composition of the present invention emits white color light through, for example, measurement of the chromaticity of the light-emitting device under the same condition as in Examples below to obtain a chromaticity coordinate (CIE chromaticity coordinate). When X of the chromaticity coordinate is in a range of 0.30 to 0.55 and Y thereof is in a range of 0.30 to 0.55, it can be evaluated that the light-emitting device emits white color light. When X is in a range of 0.30 to 0.50 and Y is in a range of 0.30 to 0.50, it can be evaluated that the light-emitting device emits high quality white color light.

<Components Other than Polymer Compound and Phosphorescent Light-Emitting Compound>

The composition of the present invention may contain as components other than the polymer compound and the phosphorescent light-emitting compound, at least one type of material selected from the group consisting of a hole transport material, an electron transport material, and a light-emitting material other than the phosphorescent light-emitting compound. In the composition of the present invention, the hole transport materials, the electron transport materials, or the light-emitting materials other than the phosphorescent light-emitting compound may be used individually or in combination of two or more types thereof.

In the composition of the present invention, with respect to a ratio between "at least one type of material selected from the group consisting of the hole transport material, the electron transport material, and the light-emitting material other than the phosphorescent light-emitting compound" and the polymer compound and the phosphorescent light-emitting compound, when the total of the polymer compound and the phosphorescent light-emitting compound is assumed to be 100 parts by weight, a ratio of each material which is "at least one type of material selected from the group consisting of the hole transport material, the electron transport material, and the light-emitting material other than the phosphorescent light-emitting compound" is usually 0.01 to 400 parts by weight, preferably 0.05 to 150 parts by weight.

The hole transport material may be a material publicly known as the hole transport material of the organic EL device. Examples of the hole transport material may include: polyvinylcarbazole and derivatives thereof; polysilane and derivatives thereof; a polysiloxane derivative having an aromatic amine in side chains or the main chain thereof; a pyrazoline derivative; an arylamine derivative; a stilbene derivative; polyaniline and derivatives thereof; polythiophene and derivatives thereof; polyarylamine and derivatives thereof; polypyrrole and derivatives thereof; poly(p-phenylenevinylene) and derivatives thereof; and poly(2,5-thienylenevinylene) and derivatives thereof. The hole transport material may have an arylene group or a divalent aromatic heterocyclic group as a copolymerization component constitutional unit).

The electron transport material may be a material publicly known as the electron transport material of the organic EL device. Examples of the electron transport material may include an oxadiazole derivative, anthraquinodimethane and derivatives thereof, benzoquinone and derivatives thereof, naphthoquinone and derivatives thereof, anthraquinone and derivatives thereof, tetracyanoanthraquinodimethane and derivatives thereof, a fluorenone derivative, diphenyldicyanoethylene and derivatives thereof, a diphenoquinone derivative, a metal complex of 8-hydroxyquinoline and derivatives thereof, triaryltriazine and derivatives thereof, polyquinoline and derivatives thereof, polyquinoxaline and derivatives thereof, and polyfluorene and derivatives thereof. The electron transport material may have an arylene group or a divalent aromatic heterocyclic group as a copolymerization component (constitutional unit).

Because the driving voltage of the light-emitting device obtained using the composition of the present invention can be lowered, the electron transport material contains, preferably an electron transport material having a structure represented by Formula (5) below.

[Chemical Formula 32]

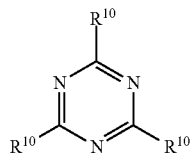

(5)

In Formula (5), $R^{10}$ represents an alkyl group, an aryl group, a monovalent aromatic heterocyclic group, or an aralkyl group and three $R^{10}$s may be linked together. Three $R^{10}$s may be the same as or different from each other.

As the electron transport material having a structure represented by Formula (5), ET-A represented by a formula below is preferred.

[Chemical Formula 33]

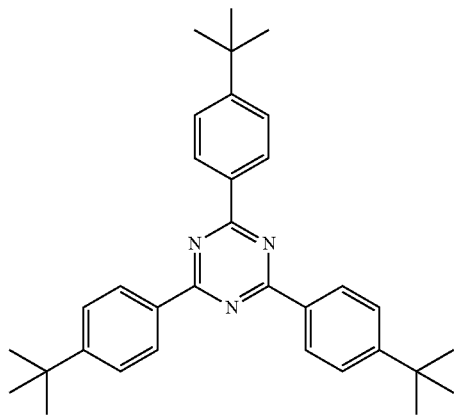

ET-A

The light-emitting material may be a light-emitting material other than the phosphorescent light-emitting compound and examples thereof may include a fluorescent light-emitting compound. The fluorescent light-emitting compound includes a low molecular fluorescent material and a polymer fluorescent material. The low molecular fluorescent material is usually a material having a maximum peak of fluorescent light emission at a wavelength in a range of 400 nm to 700 nm and having a molecular weight of usually less than 3,000, preferably 100 to 2,000, and more preferably 100 to 1,000.

The low molecular fluorescent material may be a material publicly known as the light-emitting material of the organic EL device. Examples of the low molecular fluorescent material may include: a dye-based material such as a naphthalene derivative, anthracene and derivatives thereof, perylene and derivatives thereof, a quinacridone derivative, a xanthene-based dye, a coumarin-based dye, a cyanine-based dye, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, and an oligothiophene derivative; and a metal complex material such as a metal complex having as a central metal Al, Zn, Be, or the like, or a rare earth metal such as Tb, Eu, and Dy and having as a ligand, an oxadiazole, thiadiazole, phenylpyridine, phenylbenzimidazole quinoline structure, or the like, the metal complex such as an aluminum-quinolinol complex, a benzoquinolinol-beryllium complex, a benzoxazolyl-zinc complex, a benzothiazole-zinc complex, an azomethyl-zinc complex, a porphyrin-zinc complex, an europium complex.

Examples of the polymer fluorescent material may include a poly-para-phenylenevinylere derivative, a polythiophene derivative, a poly-para-phenylene derivative, a polysilane derivative, a polyacetylene derivative, a polyfluorene derivative, a polyvinylcarbazole derivative, and a plastid containing a dye-based material exemplified above in examples of the low molecular fluorescent material.

In the composition of the present invention, the compounds of each component such as the polymer compound may be used individually or in combination of two or more types thereof.

<Liquid Composition>

The liquid composition of the present invention is a composition containing the composition of the present invention and a solvent. The liquid composition of the present invention is useful for a printing method and the like and may be generally called an ink, an ink composition, or the like. The solvent used for the liquid composition of the present invention may contain if necessary, a stabilizer, a thickener (a polymer compound for enhancing the viscosity), a low molecular compound for lowering the viscosity, a surfactant, an antioxidant, a polymer compound other than the polymer compound of the present invention, and the like. The compounds of each component contained in the liquid composition of the present invention may be used individually or in combination of two or more types thereof.

The ratio of the composition of the present invention in the liquid composition of the present invention when the whole liquid composition is assumed to be 100 parts by weight is usually 0.1 parts by weight to 99 parts by weight, preferably 0.5 parts by weight to 40 parts by weight, and more preferably 0.5 parts by weight to 20 parts by weight.

The viscosity of the liquid composition of the present invention may be controlled depending on that to which printing method, the liquid composition of the present invention is applied. When the printing method is a printing method in which the liquid composition is flowed through a discharge apparatus such as an inkjet printing method, in order to prevent a clogging or a flying warp during the discharge, the viscosity of the liquid composition at 25° C. is preferably in a range of 1 mPa·s to 20 mPa·s.

The thickener may be a thickener soluble in a solvent used for the liquid composition of the present invention and not hindering light emission or charge transport. As the thickener, a compound such as polymer polystyrene and polymer polymethyl methacrylate can be used. The thickener has a polystyrene-equivalent weight average molecular weight of preferably $5 \times 10^5$ or more, and more preferably $1 \times 10^6$ or more.

The antioxidant is an agent for enhancing the preservation stability of the liquid composition. The antioxidant may be any antioxidant so long as the antioxidant is soluble in the same solvent as the solvent for the composition of the present invention and does not hinder light emission or charge transport, and examples thereof may include a phenol-based antioxidant and a phosphorus-based antioxidant.

The solvent making up the liquid composition of the preset invention is preferably a solvent capable of dissolving a solid content as the solute or a solvent capable of homogeneously dispersing the solid content. Examples of the solvent may include: a chlorinated solvent such as chloroform, methylene chloride, 1,2-dichloroethane, 1,1,2-trichloroethane, chlorobenzene, and o-dichlorobenzene; an ether solvent such as tetrahydrofuran, dioxane and anisole; an aromatic hydrocarbon solvent such as toluene and xylene; an aliphatic hydrocarbon solvent such as cyclohexane, methylcyclohexane, n-pentane, n-hexane, n-heptane, n-octane, n-nonane, and n-decane a ketone solvent such as acetone, methyl ethyl ketone, cyclohexanone, benzophenone, and acetophenone; an ester solvent such as ethyl acetate, butyl acetate, ethylcellosolve acetate, methyl benzoate, and phenyl acetate; a polyhydric alcohol and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol; an alcohol solvent such as methanol, ethanol, propanol, isopropanol, and cyclohexanol; a sulfoxide solvent such as dimethylsulfoxide; and an amide solvent such as N-methyl-2-pyrrolidone and N,N-dimethylformamide.

These solvents may be used individually or in combination of two or more types thereof. Because the film formation property of the liquid composition and the device characteristics of the light-emitting device obtained from the liquid composition can be enhanced, these solvents may be used preferably in combination of two or more types thereof, more preferably in combination of two or three types thereof, and particularly preferably in combination of two types thereof.

When two types of solvents are contained in the liquid composition of the present invention, one type of solvent among them may be a solvent in a solid state at 25° C. Because the film formation property of the liquid composition can be enhanced, one type of solvent among them is preferably a solvent having a boiling point of 180° C. or more, and more preferably a solvent having a boiling point of 200° C. or more. Because the liquid composition can have an appropriate viscosity, the polymer compound of the present invention is preferably dissolved in both of the two types of solvents in a concentration of 1% by weight or more at 60° C. and the composition of the present invention is preferably dissolved in one type of solvent among the two types of solvents in a concentration of 1% by weight or more at 25° C.

When two or more types of solvents are contained in the liquid composition of the present invention, because the liquid composition can have an appropriate viscosity and excellent film formation property, a ratio of a solvent having the highest boiling point based on the weight of all solvents in the liquid composition is preferably 40 to 90% by weight, more preferably 50 to 90% by weight, and further preferably 65 to 85% by weight.

The liquid composition of the present invention may further contain water, a metal end salts thereof, silicon, phosphorus, fluorine, chlorine, bromine, and the like in a concentration in a range of 1 ppm to 1,000 ppm on a weight basis. Examples of the metal may include lithium, sodium, calcium, potassium, iron, copper, nickel, aluminum, zinc, chromium, manganese, cobalt, platinum, and iridium.

<Film>

The film of the present invention contains the composition of the present invention and is a light-emitting film or a conductive film.

The film of the present invention can be prepared by a method such as a spin coating method, a casting method, a microgravure coating method, a gravure printing method, a bar coating method, a roll coating method, a wire bar coating method, a dip coating method, a spray coating method, a screen printing method, a flexo printing method, an offset printing method, an inkjet method, a capillary coating method, and a nozzle coating method.

When the film is prepared using the liquid composition of the present invention, although depending on the glass transition temperature of the polymer compound contained in the liquid composition, the film can be prepared usually by baking the coating film at a temperature of 100° C. or more (for example 130° C., 160° C.).

Because the brightness and the light-emitting voltage of the device can be enhanced, the light-emitting quantum efficiency of the film is preferably 30% or more, more preferably 40% or more, further preferably 50% or more, and particularly preferably 60% or more.

The surface resistance of the film is preferably 1 KΩ/□ or less, more preferably 100Ω/□ or less, and further preferably 10Ω/□ or less. By doping a Lewis acid, an ionic compound, or the like in the film, the electric conductivity of the film can be enhanced.

<Light-Emitting Device>

The light-emitting device of the present invention is a light-emitting device having an anode, a cathode, and a layer containing the composition of the present invention that is provided between the anode and the cathode.

The light-emitting device of the present invention has usually a layer (hereinafter, simply referred to as "light-emitting layer") functioning as a light-emitting layer. The light-emitting device may have between the anode and the cathode, not only the light-emitting layer, but also other layers (for example, a hole injection layer, a hole transport layer, an electron block layer, an electron injection layer, an electron transport layer, a hole block layer). Each layer between the anode and the cathode may consist either of one layer or of two or more layers. The materials and compounds making up each layer may be used individually or in combination of two or more types thereof. In the light-emitting device of the present invention, when each layer described above consists of two or more layers, it is satisfactory that at least one layer contains the composition, and two or more layers may contain the composition. Although the layer containing the composition functions as any layer of the above-described layers, the layer functions usually as the light-emitting layer, the hole transport layer, and the electron block layer, preferably as the light-emitting layer.

Examples of the layer capable of being provided between the anode and the light-emitting layer may include the hole injection layer, the hole transport layer, and the electron block layer. When the layer provided between the anode and the light-emitting layer is one layer, the one layer is the hole injection layer. When the layer provided between the anode and the light-emitting layer are two or more layers, a layer in contact with the anode is the hole injection layer and other layers are the hole transport layer. The hole injection layer is a layer having a function of improving the hole injection efficiency from the anode. The hole transport layer is a layer having a function of improving the hole injection from the hole injection layer or a layer closer to the anode. When the hole injection layer or the hole transport layer has a function of blocking the electron transport, these layers may also be called the electron block layer. It can be confirmed that the layer has the function of blocking the electron transport through a method including: preparing a device passing an electron current only; and confirming the blocking effect from the decrease of the current value thereof.

Examples of the layer provided between the cathode and the light-emitting layer may include the electron injection layer, the electron transport layer, an the hole block layer. When the layer provided between the cathode and the light-emitting layer is one layer alone, the one layer is the electron injection layer and when the layer provided between the cathode and the light-emitting layer is two or more layers, a layer in contact with the cathode is the electron injection layer and other layers are the electron transport layer. The electron injection layer is a layer having a function of improving the electron injection efficiency from the cathode. The electron transport layer is a layer having a function of improving the electron injection from the electron injection layer or a layer closer to the cathode. When the electron injection layer or the electron transport layer has a function of blocking the hole transport, these layers may also be called the hole block layer. It can be confirmed that the layer has the function of blocking the hole transport through a method including: preparing a device passing a hole current only; and confirming the blocking effect from the decrease of the current value thereof.

Examples of the structure of the light-emitting device of the present invention may include the structures of a) to d) below.
a) Anode/Light-emitting layer/Cathode
b) Anode/Hole transport layer/Light-emitting layer/Cathode
c) Anode/Light-emitting layer/Electron transport layer/Cathode
d) Anode/Hole transport layer/Light-emitting layer/Electron transport layer/Cathode.
(The symbol "/" means that the layers are stacked adjacent no each other. Hereinafter, the symbol "/" also have the same meaning).

Among the hole transport layer and the electron transport layer that are provided as adjacent to the electrode, a layer having a function of improving the charge (hole or electron) injection efficiency from the electrode and an effect of lowering the driving voltage of the light-emitting device may be called a charge injection layer (hole injection layer or electron injection layer).

Furthermore, in order to enhance the adhesion with the electrode or improve the charge injection from the electrode, the charge injection layer or an insulating layer may be provided as adjacent to the electrode. For enhancing the adhesion at the interface or preventing the intermixing at the interface, a thin buffer layer may be inserted in the interface between the charge transport layer or the light-emitting layer and another layer. The order and the number of layers to be stacked between the electrodes and the thickness of each layer may be controlled by taking into consideration the luminous efficiency and the device life of the light-emitting device.

Examples of the structure of the light-emitting device of the present invention in which the charge injection layer is provided may include the structures of e) to p) below.
e) Anode/Charge injection layer/Light-emitting layer/Cathode
f) Anode/Light-emitting layer/Charge injection layer/Cathode
g) Anode/Charge injection layer/Light-emitting layer/Charge injection layer/Cathode
h) Anode/Charge injection layer/Hole transport layer/Light-emitting layer/Cathode
i) Anode/Hole transport layer/Light-emitting layer/Charge injection layer/Cathode
j) Anode/Charge injection layer/Hole transport layer/Light-emitting layer/Charge injection layer/Cathode
k) Anode/Charge injection layer/Light-emitting layer/Charge transport layer/Cathode
l) Anode/Light-emitting layer/Electron transport layer/Charge injection layer/Cathode
m) Anode/Charge injection layer/Light-emitting layer/Electron transport layer/Charge injection layer/Cathode
n) Anode/Charge injection layer/Hole transport layer/Light-emitting layer/Charge transport layer/Cathode
o) Anode/Hole transport layer/Light-emitting layer/Electron transport layer/Charge injection layer/Cathode
p) Anode/Charge injection layer/Hole transport layer/Light-emitting layer/Electron transport layer/Charge injection layer/Cathode The light-emitting device of the present invention is formed usually using a substrate. On one side of the substrate, the electrode is formed and on the other side, each layer of the device is formed. Examples of the substrate may include a substrate of a substance such as glass, plastic, and silicon and a substrate of a polymer film.

Although the anode and the cathode contained in the light-emitting device of the present invention are usually transparent or translucent, it is preferred that the anode is transparent or translucent.

The anode is usually transparent or translucent, is made of a film of a metal oxide, a metal sulfide, or a metal having a high electric conductivity, and is preferably made of a material having a high transmittance among them. Examples of the material for the anode may include: a conductive inorganic compound such as indium oxide, zinc oxide, tin oxide, indium-tin-oxide (ITO), and indium-zinc-oxide; a metal such as gold, platinum, silver, and copper; polyaniline and derivatives thereof; and polythiophene and derivatives thereof. Among them, ITO, indium-zinc-oxide, or tin oxide is preferred. The conductive inorganic compound may make up the anode as an NESA film. Polyaniline and derivatives thereof or polythiophene and derivatives thereof may make up an organic transparent conductive film.

For preparation of the anode, a method such as a vacuum deposition method, a sputtering method, an ion plating method, and a plating method is used.

The thickness of the anode may be selected by taking into consideration the light transparency and the electric conductivity and is usually 10 nm to 10 µm, preferably 20 nm to 1 µm, and more preferably 40 nm to 500 nm.

Examples of the material used for the hole injection layer may include a phenylamine compound, a star-burst type amine compound, and a phthalocyanine compound; an oxide such as vanadium oxide, molybdenum oxide, ruthenium oxide, and aluminum oxide; amorphous carbon, polyaniline and derivatives thereof, polythiophene and derivatives thereof, and other conductive polymers.

When the material used for the hole injection layer is a conductive polymer, for enhancing the electric conductivity of the conductive polymer, if necessary, an anion such as a polystyrenesulfonic acid ion, an alkylbenzenesulfonic acid ion, and a camphorsulfonic acid ion may be doped in the conductive polymer.

Examples of the material used for the hole transport layer may include the materials described and exemplified above as the hole transport material. When the material used for the hole transport layer is a low molecular compound, the material is preferably dispersed in a polymer binder to be used.

In the light-emitting device of the present invention, when a layer containing the composition of the present invention is the hole transport layer, the polymer compound contained in the composition of the present invention contains preferably a hole transport group (for example, a substituted amino group, a thienyl group, and the like) as the constitutional unit and/or the substituent of the polymer compound.

Preferred examples of the material used for the hole transport layer may include polyvinylcarbazole and derivatives thereof, polysilane and derivatives thereof, a polysiloxane derivative having an aromatic amine in side chains or the main chain thereof, polyarylamine and derivatives thereof, and the composition of the present invention.

Examples of the method for forming the hole transport layer may include: film formation from a mixed solution of the low molecular compound with the polymer binder, when the material used for the hole transport layer is a low molecular compound; and film formation from a solution of the polymer compound, when the material used for the hole transport layer is a polymer compound.

The solvent used for film formation from a solution may be a solvent capable of dissolving the material used for the hole transport layer. Examples of the solvent may include: a chlorinated solvent such as chloroform, methylene chloride, and dichloroethane; an ether solvent such as tetrahydrofuran; an aromatic hydrocarbon solvent such as toluene and xylene; a ketone solvent such as acetone and methyl ethyl ketone; and an ester solvent such as ethyl acetate, butyl acetate, and ethylcellosolve acetate.

The film formation from a solution may be performed by a coating method such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, and an inkjet printing method.

As the polymer binder, a polymer binder that does not extremely inhibit the charge transport is preferred. The polymer binder is preferably a polymer binder that does not strongly absorb visible light. Examples of the polymer binder may include polycarbonate, polyacrylate, polymethyl acrylate, polymethyl methacrylate, polystyrene, polyvinyl chloride, and polysiloxane.

Although the thickness of the hole transport layer may be controlled by taking into consideration the driving voltage and the luminous efficiency of the light-emitting device, the thickness is preferably a thickness not feared to cause a pin hole. When the thickness of the hole transport layer is too large, the driving voltage of the light-emitting device may become higher. Accordingly, the thickness of the hole transport layer is usually from to 1 µm, preferably 2 nm to 500 nm, and more preferably 5 nm to 200 nm.

The light-emitting layer is formed usually from an organic compound (low molecular compound, polymer compound) emitting a fluorescence or a phosphorescence and if necessary, a dopant assisting the organic compound. The composition of the present invention is preferably contained in the light-emitting layer in the light-emitting device of the present invention. When the composition of the present invention is contained in the light-emitting layer, together with the composition, the above-described light-emitting materiel other than the phosphorescent light-emitting compound may be contained. When the light-emitting material is a low molecular compound, the light-emitting material is preferably dispersed in the polymer binder to be used.

In the light-emitting layer, for enhancing the luminous efficiency of the light-emitting device and changing the light-emitting wavelength of the light-emitting device, a dopant may be added. Examples of the dopant may include an anthracene derivative, a perylene derivative, a coumarin derivative, a rubrene derivative, a quinacridone derivative, a squarylium derivative, a porphyrin derivative, a styryl-based dye, a tetracene derivative, a pyrazolo derivative decacyclene, and phenoxazone.

Although the thickness of the light-emitting layer may be selected by taking into consideration the driving voltage and the luminous efficiency of the light-emitting device, the thickness is usually 2 nm to 200 nm.

For forming the light-emitting layer, a method such as a method for applying a solution containing a material used for the light-emitting layer on or over the substrate, a vacuum deposition method, and a transferring method may be used. The solvent used for preparing the solution is the same as the solvent described and exemplified in the paragraph of film formation from a solution for the hole transport layer. Examples of the method for applying a solution containing the light-emitting material on or over the substrate may include a printing method such as a spin coating method, a dip coating method, an inkjet method, a flexo printing method, a gravure printing method, and a slit coating method. When the light-emitting material is a sublimable low molecular compound, the vacuum deposition method is preferably used. The transferring method is a method for forming the light-emitting layer at a desired position by transferring or heat transfer printing with a laser.

Examples of the material used for the electron transport layer may include the composition of the present invention and the above-mentioned electron transport material.

When the composition of the present invention is used for the electron transport layer, the polymer compound contained in the composition of the present invention contains preferably an electron transporting group (an oxadiazole group, an oxathiazole group, a pyridyl group, a pyrimidyl group, a pyridazyl group, a triazyl group, and the like) as the constitutional unit and/or the substituent of the polymer compound.

As the material used for the electron transport layer, the composition of the present invention, an oxadiazole derivative, benzoquinone and derivatives thereof, anthraquinone and derivatives thereof, a metal complex of 8-hydroxyquinoline and derivatives thereof, polyquinoline and derivatives thereof, polyquinoxaline and derivatives thereof, and polyfluorene and derivatives thereof are referred.

Examples of the method for forming the electron transport layer when the material used for the electron transport layer is a low molecular compound may include a vacuum deposition method from a powder and a method by film formation from a solution state or a molten state and examples of the method for forming the electron transport layer when the material used for the electron transport layer is a polymer compound may include a method by film formation from a solution state or a molten state. In the case of the film formation from a solution state or a molten state, a polymer binder may be used in combination. The film formation from a solution may be performed in the same manner as in the above-described method for film-forming the hole transport layer from a solution.

Although the thickness of the electron transport layer may be controlled by taking into consideration the driving voltage and the luminous efficiency of the light-emitting device, the thickness is preferably a thickness not feared to cause a pin hole. When the thickness of the electron transport layer is too large, the driving voltage of the light-emitting device may become higher. Accordingly, the thickness of the electron transport layer is usually 1 on to 1 µm, preferably 2 nm to 500 nm, and more preferably 5 nm to 200 nm.

Examples of the electron injection layer may include: an electron injection layer composed of a single layer structure of a Ca layer; and an electron injection layer composed of a stacked structure of a layer formed with one or more types selected from a metal (except Ca) selected from the IA Group and the IIA Group of the Periodical Table having a work function of 1.5 to 3.0 eV, an oxide of the metal, a halide of the metal, and a carbonate of the metal with a Ca layer, and any one of these electron injection layers can be appropriately selected according to the type of the light-emitting layer. Examples of the metal having a work function of 1.5 to 3.0 eV in the IA Group of the Periodic Table, the oxide of the metal, the halide of the metal, or the carbonate of the metal may include lithium, lithium fluoride, sodium oxide, lithium oxide, and lithium carbonate. Examples of the metal except Ca having a work function of 1.5 to 3.0 eV in the IIA Group of the Periodic Table, the oxide of the metal, the halide of the metal, or the carbonate of the metal may include strontium, magnesium oxide, magnesium fluoride, strontium fluoride, barium fluoride, strontium oxide, and magnesium carbonate.

Examples of the method for forming the electron injection layer may include a deposition method, a sputtering method, and a printing method. The thickness of the electron injection layer is preferably 1 nm to 1 μm.

As the material for the cathode, a material having a small work function that can easily inject the electron into the light-emitting layer is preferred. Examples of such a material may include: a metal such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; an alloy of two or more types of these metals; an alloy of one or more types of these metals with one or more types of gold, silver, platinum, copper, manganese, titanium, cobalt, nickel, tungsten, and tin; and graphite and a graphite intercalate compound. Examples of the alloy may include a magnesium-silver allay, a magnesium-indium alloy, a magnesium-aluminum alloy, an indium-silver alloy, a lithium-aluminum alloy, a lithium-magnesium alloy, a lithium-indium alloy, and a calcium-aluminum alloy.

The cathode may be a stacked structure of two or more layers. The stacked structure is preferably a stacked structure of a layer of one or more types selected from the metal, the metal oxide of the metal, the metal fluoride of the metal, and an alloy thereof, with a layer of a metal such as aluminum, silver, and chromium.

The thickness of the cathode may be selected by taking into consideration the electric conductivity and the durability and is usually 10 nm to 10 μm, preferably 20 nm to 1 μm, and more preferably 50 nm to 500 nm.

For the preparation of the cathode, a method such as a vacuum deposition method, a sputtering method, and a laminate method for thermocompression-bonding a metal film may be used. After the preparation of the cathode, in a part or the whole of the periphery of the light-emitting device, a protection layer and/or a protecting cover may be fitted. In order to use the light-emitting device stably for a long period, the light-emitting device is preferably protected from the outside and the protection layer and/or the protecting cover is(are) more preferably fitted to the light-emitting device.

Examples of the protection layer may include a layer formed from a material such as a polymer compound, a metal oxide, a metal fluoride, and a metal boride. The protection layer may be fitted to the cathode side. Examples of the protecting cover may include a metal plate, a glass plate, and a plastic plate of which surface is subjected to a low coefficient of water permeability treatment. Examples of the method for fitting the protecting cover may include a method for laminating the protecting cover to the device substrate through a thermocurable resin or a photocurable resin to seal the light-emitting device. By maintaining a space using a spacer, the damage of the light-emitting device can be easily prevented in the space, an inert gas such as nitrogen and argon may be enclosed or a desiccant such as barium oxide may be installed and any one of them is preferably performed. By enclosing an inert gas, the oxidation of the cathode can be prevented. By installing a desiccant, the damage of the light-emitting device caused by moisture adsorbed to the light-emitting device during the manufacturing step thereof or a trace amount of moisture penetrating through a cored resin can be easily suppressed.

The light-emitting device of the present invention can be used as a surface light source, a display device (a segment display device, a dot-matrix display device), a backlight of a liquid crystal display device, and the like. For obtaining a surface light emission using the light-emitting device of the present invention, a planar anode and a planar cathode may be arranged as overlapped on each other Examples of the method for obtaining a pattern-shaped light emission may include: a method for placing a mask in which a pattern-shaped window is provided on the surface of the planar light-emitting device; a method for forming a layer of a non-light-emitting part in an extremely large thickness to make the non-light-emitting part substantially non-light-emitting; and a method for forming any one of or both of the anode and the cathode in a pattern shape. By forming a pattern by any one method among these methods and by arranging several electrodes so that they can be independently subjected to ON/OFF, segment-type display device capable of displaying a numeral, a letter, a simple symbol, or the like can be obtained. Furthermore, in order to prepare a dot matrix-type display device, upon the preparation of the light-emitting device, both the anode and the cathode may be formed in a stripe shape so that they cross each other at right angles. By a method for painting the polymer compounds in a plurality of different emitting light colors or by a method for using a color filter or a fluorescence converting filter, a partial color display and a multi-color display become possible. The dot matrix-type display device can be passive-driven and may be active-driven in combination with TFT or the like. The above-described display device can be used as a display device of a computer, a television, a portable terminal, a portable telephone, a car navigation, a viewfinder for a video camera, and the like. Furthermore, the surface light source can be preferably used as a selfluminous thin-type surface light source, a surface light source for a backlight of a liquid crystal display device, a light source for a planar illumination, and the like. The light-emitting device of the present invention obtained using a flexible substrate can also be used as a curved face-shaped light source or display device.

EXAMPLES

For describing the present invention more in detail, examples will now be given; however, the present invention is not limited to these examples.

The number average molecular weight and the weight average molecular weight were measured by size exclusion chromatography (SEC) as the polystyrene-equivalent number average molecular weight and the polystyrene-equivalent weight average molecular weight Among SEC, a chromatography in which the mobile phase is an organic solvent refers to gel permeation chromatography (GPC). As analysis conditions for GPC, methods illustrated in the analysis condition below were used.

[Analysis Condition]

The measurement sample was dissolved in tetrahydrofuran in a concentration of about 0.05% by weigh and 10 μL of the resultant sample solution was injected into GPC (manufactured by Shimadzu Corporation; trade name: LC-10Avp). As the mobile phase of GPC, tetrahydrofuran was flowed at a flow rate of 2.0 mL/min. As the column, PLgel MIXED-B (manufactured by Polymer Laboratories Ltd.) was used. As the detector, UV-VIS detector (manufactured by Shimadzu Corporation; trade name: SPD-10Avp) was used.

The LC-MS measurement was performed by a method below. The measurement sample was dissolved in chloroform or tetrahydrofuran so that the concentration of the sample became about 2 mg/mL and 1 μL of the resultant sample solution was injected into LC-MS (manufactured by Agilent Technologies, Inc.; trade name: 1100LCMSD). As the mobile phase for LC-MS, ion-exchanged water, acetonitrile, tetrahydrofuran, and a solvent mixture thereof were used and if necessary, acetic acid was added thereto. As the column, L-column 2 ODS (3 μm) (manufactured by Chemicals Evaluation and Research Institute, Japan; inner diameter: 2.1 mm, length; 100 mm, particle diameter: 3 μm) was used.

The TLC-MS measurement was performed by a method below. The measurement sample was dissolved in chloroform or tetrahydrofuran and a small amount of the resultant sample solution was applied onto the surface of a TLC glass plate (Merck & Co., Inc.; trade name: Silica gel 60 $F_{254}$) that was cut beforehand. The resultant sample was measured by TLC-MS (manufactured by JEOL Ltd.; trade name: JMS-T100TD) using a helium gas heated to 240 to 350° C.

The NMR measurement was performed, unless defined otherwise, by a method including: dissolving 5 to 20 mg of the measurement sample in about 0.5 mL of deuterated chloroform; and using NMR (manufactured by Varian, Inc. trade name: MERCURY 300).

In Examples, the evaluation of the light-emitting spectrum peak of the phosphorescent light-emitting compound was performed, unless defined otherwise, by a method below. The phosphorescent light-emitting compound was dissolved in xylene (manufactured by Kanto Chemical Co., Ltd.; for the electronic industries (EL grade)). At this time, the solution was prepared so that the concentration of the solid content became 0.0008% by weight. This solution was excited using a fluorescence spectrophotometer (manufactured by JASCO Corporation; FP-6500) at a wavelength of 350 nm to measure the PL spectrum of the solution to evaluate the light-emitting spectrum peak.

In Examples, the measurement of the luminous efficiency, voltage, and light-emitting chromaticity of the light-emitting device was performed using OLED TEST SYSTEM (manufactured by Tokyo Systems Development Co., Ltd.)

<Synthesis Example 1> (Synthesis of Compound M-1)

[Chemical Formula 34]

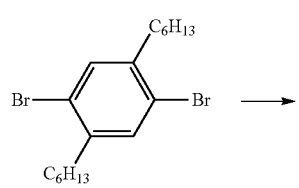

-continued

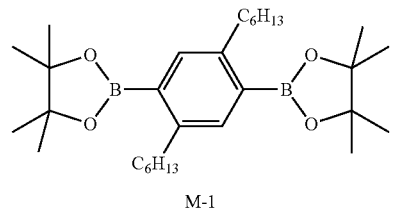

M-1

Into a four-neck flask, 8.08 g of 1,4-dihexyl-2,5-dibromobenzene, 12.19 g of bis(pinacolate)diboron, and 11.78 g of potassium acetate were charged and a gas inside the flask was purged with an argon gas. Thereto, 100 mL of dehydrated 1,4-dioxane was charged and the inside of the flask was deaerated with an argon gas. Thereto, 0.98 g of [1,1'-bis(diphenylphosphino)ferrocene]dichloropalladium (II) ($Pd(dppf)_2Cl_2$) was charged and further, the inside of the flask was deaerated with argon. The resultant reaction mixture was heated-refluxed for 6 hours. To the reaction mixture, toluene was added and the resultant reaction mixture was washed with ion-exchanged water. To the washed organic phase, sodium sulfate anhydride and an activated carbon were added and the resultant organic phase was filtered by a funnel pre-coated with celite. The resultant filtrate was concentrated to obtain 11.94 g of a dark brown crystal. This crystal was recrystallized in n-hexane and the resultant crystal was washed with methanol. The crystal was dried under reduced pressure, thus obtaining 4.23 g of a white capillary crystal of a compound M-1. The yield was 42%.

The results of the $^1$H-NMR analysis and the LC-MS analysis of the compound M-1 are illustrated below.
$^1$H-NMR (300 MHz, $CDCl_3$): δ (ppm)=0.88 (t, 6H), 1.23-1.40 (m, 36H), 1.47-1.56 (m, 4H), 2.81 (t, 4H), 7.52 (s, 2H)
LC-MS (ESI, positive) m/z$^+$=573 [M+K]$^+$ <Synthesis Example 2> (Synthesis of Compound M-2)

[Chemical Formula 35]

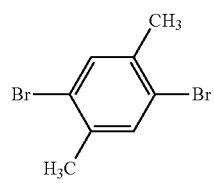

Commercially available 1,4-dibromo-2,5-dimethylbenzene was recrystallized to be purified and dried under reduced pressure. The resultant compound that exhibited an HPLC area percent value of 99.5% or more was used as a compound M-2.

<Synthesis Example 3> (Synthesis of Compound M-3)

[Chemical Formula 36]

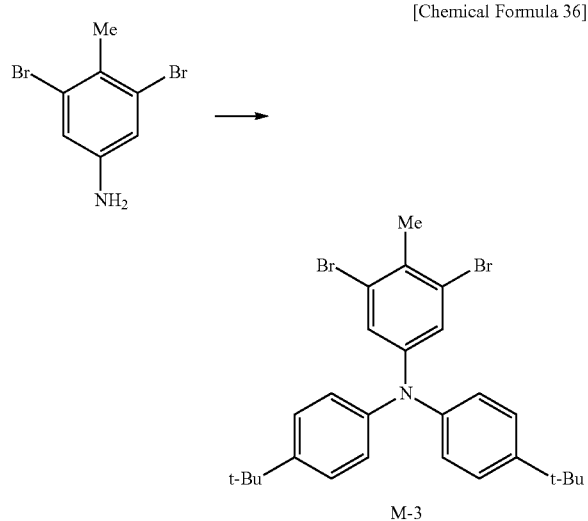

In an argon gas atmosphere, in a flask equipped with a Dean-Stark dehydrator, 3,5-dibromo-4-ethylaniline (5.30 g, 20.0 mmol), copper (I) chloride (0.99 g, 10 mmol), 1,10-phenanthroline (1.80 g, 10 mmol), potassium hydroxide 8.98 g, 160 mmol) 4-tert-butyliodobenzene (16.1 g, 62 mmol), and dehydrated toluene (40 mL) were mixed. The reaction mixture is dehydrated while heating the resultant reaction mixture on an oil bath of 130° C., refluxing and stirring the reaction mixture for about 8 hours. The reaction mixture was diluted with toluene and the resultant reaction mixture was cooled down to room temperature. The reaction mixture was passed through a celite pre-coated filter to filter off insoluble matters. To the filtrate, an activated white clay (manufactured by Wako Pure Chemical Industries, Ltd.) was added and the resultant reaction mixture was stirred at room temperature for 1 hour to filter off a deposit solid. The above operation of filtering was repeated for three times. Then, the filtrate was concentrated, followed by adding hexane to the concentrate to deposit and filter a solid. The resultant solid was recrystallized in toluene-methanol, was further recrystallized in toluene-ethanol, and then, was purified by medium pressure silica gel column chromatography (hexane). Then, the solid was recrystallized again in toluene-methanol, thus obtaining an objective compound M-3 (5.70 g, HPLC area percent (ultraviolet ray wavelength; 254 nm)>99.9%, yield: 54%) as a white crystal.

The result of the $^1$H-NMR analysis of the compound M-3 is illustrated below.

$^1$H-NMR (300 MHz, THF-$d_8$): δ (ppm)=1.33 (s, 18H), 2.49 (s, 3H), 7.01 (d, 4H), 7.16 (s, 2H), 7.36 (d, 4H)

<Synthesis Example 4> (Synthesis of Compound M-4)

[Chemical Formula 37]

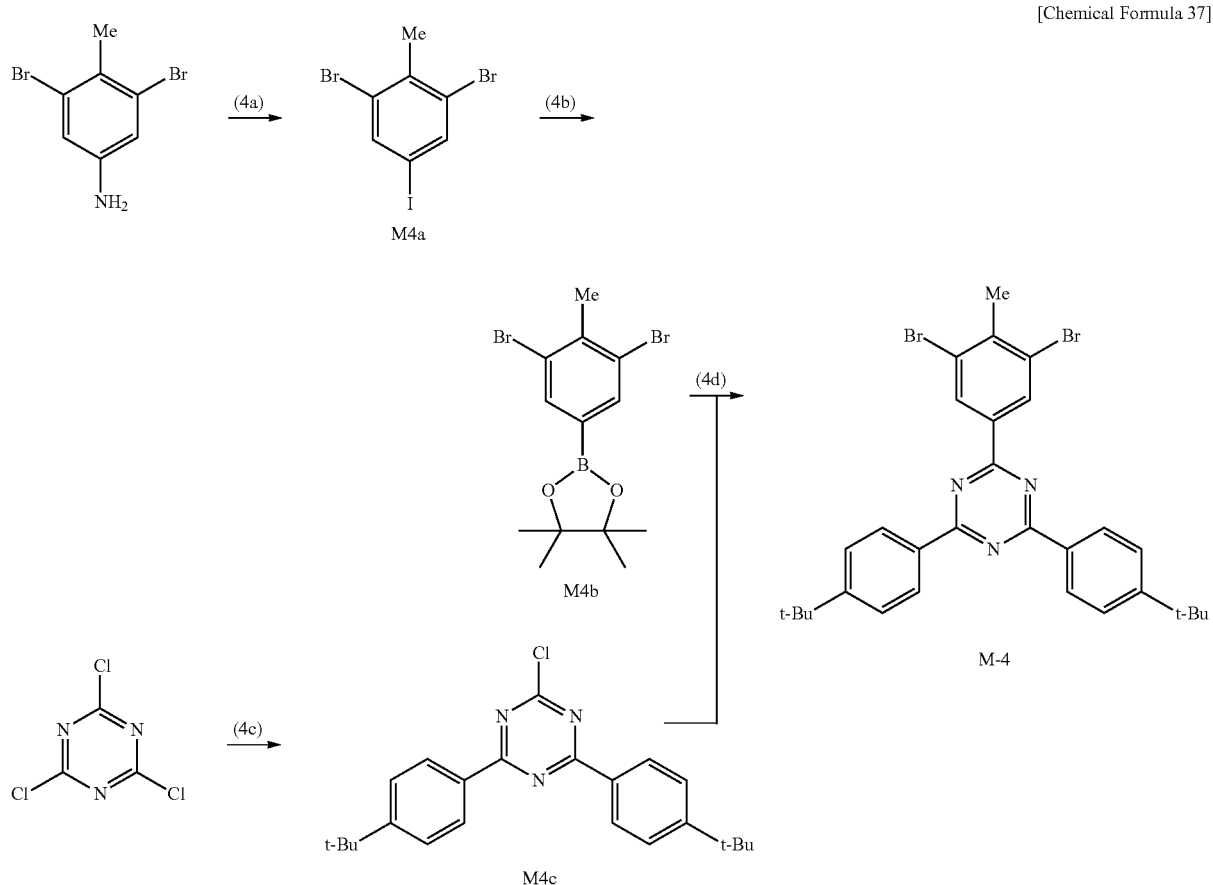

(Step (4a))

In an argon gas atmosphere, in a flask, 3,5-dibromo-4-methylaniline (47.0 g, 177 mmol), 35% by weight hydrochloric acid (111 mL), and ion-exchanged water (111 mL) were mixed and the resultant reaction mixture was cooled down in an ice bath. Into the reaction mixture, a solution in which sodium nitrite (12.9 g, 186 mmol) was dissolved in ion-exchanged water (about 130 mL) was drooped over about 30 minutes. After the completion of dropping, the reaction mixture was stirred at room temperature for about 1 hour and was cooled down in an ice bath again and into the reaction mixture, a solution in which potassium iodide (30.9 g, 186 mmol) was dissolved in ion-exchanged water (about 130 mL) was dropped over about 33 minutes. After the completion of dropping, the reaction mixture was stirred at room temperature for about 3 hours and while stirring the reaction mixture, the reaction mixture was slowly added to a separately prepared 10% by weight sodium hydrogen carbonate aqueous solution (about 1,200 mL). The reaction mixture was extracted by adding ethyl acetate thereto and the organic chase was washed with a 21% by weight sodium sulfite aqueous solution, was dried over magnesium sulfate anhydride, and was filtered and the filtrate was concentrated to obtain a crude product (77 g). The crude product was dissolved in acetone and to the resultant solution, an activated car-bon was added. The resultant reaction mixture was stirred and then, filtered and the filtrate was concentrated. The concentrate was dissolved in acetone again and to the resultant solution, an activated carbon was added, followed by stirring the resultant reaction mixture. The reaction mixture was filtered and the filtrate was concentrated, followed by drying a deposited solid under reduced pressure to obtain a yellow brown solid (about 50 g). The obtained solid was dissolved in hexane and to the resultant solution, ethanol was added to crystallize the resultant reaction mixture, followed by filtering and drying under reduced pressure the resultant crystal, thus obtaining intermediate 2,6-dibromo-4-iodotoluene (28.4 g, yield; 43%, compound M4a) as a white crystal.

The result of the $^1$H-NMR analysis of the compound M4a is illustrated below.

$^1$H-NMR (300 MHz, CDCl$_3$): δ (ppm)=2.51 (s, 3H), 7.83 (s, 2H)

(Step (4b))

In an argon gas atmosphere, in a flask, into a solution in which the compound M4a (22.6 g, 60.0 mmol) was dissolved in dehydrated tetrahydrofuran (300 mL), a tetrahydrofuran solution of isopropylmagnesium chloride (manufactured by Sigma Aldrich Corp., concentration: 2.0 M, 60 mL) was dropped at room temperature over 10 minutes and the resultant reaction mixture was stirred at room temperature for 1 hour. The reaction mixture was cooled down in an ice bath and thereto, 2-isopropyloxy-4,4,5,5-tetramethyl-1,3,2-dioxaborolan (22.3 g, 120 mmol) as added. The resultant reaction mixture was stirred at room temperature for 2 hours and was cooled down in an ice bath again and into the reaction mixture, 0.1 N hydrochloric acid (180 mL) was dropped. The resultant reaction mixture was extracted with ethyl acetate and the organic phase was washed with a 15% by weight brine twice, was dried over sodium sulfate anhydride, and was filtered. The filtrate was concentrated and thereto, methanol was added to deposit a solid. The deposited solid was filtered and was dried under reduced pressure, thus obtaining intermediate 2,6-dibromo-4-(4,4,5,5-tetraethyl-1,3,2-dioxaborolan-2-yl)toluene (16.3 g, yield 72%, compound M4b) as a white crystal.

The result of the $^1$H-NMR analysis of the compound M4b is illustrated below.

$^1$H-NMR (300 MHz, CDCl$_3$): δ (ppm)=1.33 (s, 12H), 2.58 (s, 3H), 7.90 (s, 2H)

(Step (4c))

In an argon gas atmosphere, in a flask, 4-bromo-tert-butylbenzene (125 g, 587 mmol) was dissolved in dehydrated tetrahydrofuran (470 mL) and the resultant reaction solution was cooled down to −70° C. Into the reaction solution, an n-butyllithium/hexane solution (1.6 M, 367 mL, 587 mmol) was dropped over 90 minutes and then, the resultant reaction mixture was stirred for 2 hours to prepare a 4-tert-butylphenyllithium/tetrahydrofuran solution.

Separately, in an argon gas atmosphere, in a flask, cyanur chloride (50.8 g, 276 mmol) was dissolved in dehydrated tetrahydrofuran (463 mL) and the resultant solution was cooled down to −70° C. Thereinto, the whole amount of the thus-prepared 4-tert-butylphenyllithium/tetrahydrofuran solution was dropped at a rate by which the internal temperature of the flask maintained −60° C. or less. After the completion of dropping, the resultant reaction mixture was stirred at −40° C. for 4 hour and then, at room temperature for 4 hours. To the reaction mixture, ion-exchanged water (50 mL) was slowly added and then, the solvent was distilled off under reduced pressure. To the resultant residue, ion-exchanged water and chloroform were added to extract the residue into an organic phase and further, the organic phase was washed with ion-exchanged water, followed by distilling off the solvent from the organic phase under reduced pressure. To the resultant residue, acetonitrile was added and the resultant reaction mixture was stirred while heating-refluxing the reaction mixture, followed by filtering insoluble matters by filtration during heating the reaction mixture. The filtrate was concentrated under reduced pressure and further, the concentrated filtrate was cooled down to 70° C. to deposit and filter a solid. The resultant solid was dissolved in a solvent mixture of chloroform/hexane and the resultant solution was purified by silica gel column chromatography (eluent: chloroform/hexane), followed by recrystallizing the solution in acetonitrile, thus obtaining the objective intermediate 4,6-bis(4-tert-butylphenyl)-2-chloro-1,3,5-triazine (41.3 g, 109 mmol, yield: 39%, compound M4c) as a white crystal.

The results or the $^1$H-NMR analysis and the LC-MS analysis of the compound M4c are illustrated below.

$^1$H-NMR (300 MHz, CDCl$_3$): δ (ppm)=1.39 (s, 18H), 7.56 (d, 4H), 8.54 (d, 4H)

LC/MS (APPI, positive) m/z$^+$=380 [M+H]$^+$ (Step (4d))

In a nitrogen gas atmosphere, in a flask, the compound M4b (7.52 g, 20.01 mmol), the compound M4c (9.12 g, 24.0 mmol), tetrakis(triphenylphosphine) palladium (0) (2.32 g, 2.0 mmol), silver carbonate (16.5 g, 60 mmol), and dehydrated tetrahydrofuran (160 mL) were mixed and while shading and heating-refluxing the resultant reaction mixture, the reaction mixture was stirred for 33 hours. After the completion of the reaction, the reaction mixture was diluted with toluene (400 mL) and therefrom, insoluble matters were filtered off. The filtrate was concentrated and thereto, acetonitrile (200 mL) was added, followed by stirring the resultant reaction mixture for 1 hour while refluxing the reaction mixture. Then, the reaction mixture was cooled down to room temperature and a deposited solid was filtered and was dried under reduced pressure to obtain a crude product. The crude product was purified by medium pressure silica gel chromatography (hexane/chloroform=98/2 to 70/30) and was subjected to recrystallization in toluene-acetonitrile repeatedly for three times, thus obtaining an objective compound M-4 (2.46 g, HPLC area percent (ultraviolet ray wavelength: 254 nm): 99.6%, yield: 21%) as a white crystal.

The result of the $^1$H-NMR analysis of the compound M-4 is illustrated below.

$^1$H-NMR (300 MHz, THF-$d_6$): δ (ppm)=1.43 (s, 18H), 2.68 (s, 3H), 7.65 (d, 4H), 8.67 (d, 4H), 8.89 (s, 2H)

<Synthesis Example 5> (Synthesis of Phosphorescent Light-Emitting Compound A)

<Step 1: Synthesis of Compound (A)>

[Chemical Formula 38]

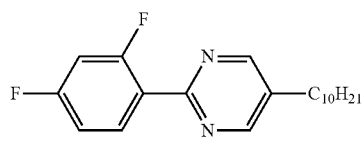

COMPOUND (A)

3.89 g of 2-chloro-5-n-decylpyrimidine, 2.65 g of 2,4-difluorophenylboronic acid, 35 mL of 1,2-dimethoxyethan, and 42 mL of a 2 M potassium carbonate aqueous solution were charged into a two-neck flask to prepare a reaction solution. An argon gas was passed through the reaction solution for 20 minutes and to the reaction solution, 0.88 g of tetrakistriphenylphosphine palladium (0) complex was added, followed by heating and refluxing the resultant reaction solution using an oil bath in an argon atmosphere for 16 hours. The organic phase was separated and recovered and was separated and purified by silica gel chromatography (elution: solvent mixture of dichloromethane and hexane), thus obtaining 4.1 g of a compound (A).

The result of the $^1$H-NMR analysis of the compound (A) is illustrated below.

$^1$H-NMR (400 MHz, CDCl$_3$): δ (ppm)=8.66 (s, 2H), 8.08-8.15 (m, 1H), 6.91-7.00 (m, 2H), 2.63 (t, 2H), 1.18-1.68 (m, 16H), 0.88 (t, 3H)

<Step 2: Synthesis of Compound (B)>

[Chemical Formula 39]

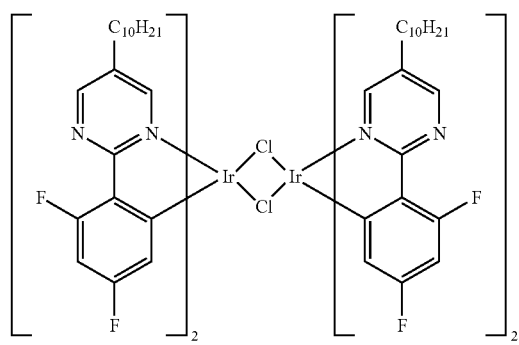

COMPOUND (B)

800 mg of iridium trichloride n-hydrate, 1.58 g of the compound (A), 64 mL of 2-ethoxyethanol, and 22 mL of water were charged into a two-neck flask and the resultant reaction solution was heated in an argon atmosphere for 14 hours to be refluxed. The resultant reaction solution was cooled down to room temperature and thereto, water was added, followed by filtering a generated solid, thus obtaining a compound (B). The isolation yield was 57%.

The result of the $^1$H-NMR analysis of the compound (B) is illustrated below.

$^1$H-NMR (400 MHz, CDCl$_3$): δ (ppm)=9.03 (s, 4H), 8.79 (s, 4H), 6.42 (t, 4H), 5.25 (d, 4H), 2.52 (m, 4H), 2.11 (m, 4H), 1.18-1.70 (m, 64H), 0.87 (t, 12H)

<Step 3: Synthesis of Phosphorescent Light-Emitting Compound A>

[Chemical Formula 40]

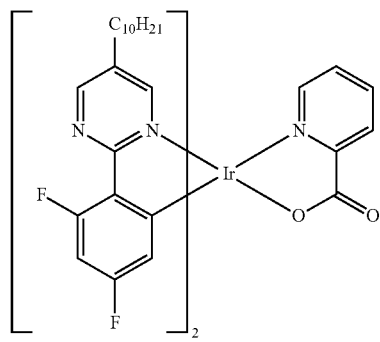

PHOSPHORESCENT LIGHT-EMITTING MATERIAL A 111 mg of the compound (B), 45 mg of sodium picolinate, and 40 mL of 2-ethoxyethanol were charged into an eggplant-shaped flask and the resultant reaction solution was irradiated with a microwave (2,450 MHz) In an argon atmosphere for 10 minutes. The resultant reaction solution was cooled down to room temperature and the solvent was concentrated under reduced pressure to obtain a solid. The solid was recrystallized in dichloromethane-hexane, thus obtaining the phosphorescent light-emitting compound A. The isolation yield thereof was 74%.

The result of the $^1$H-NMR analysis of the phosphorescent light-emitting compound A is illustrated below.

$^1$H-NMR (400 MHz, CDCl$_3$: δ (ppm)=8.68-8.72 (m, 3H), 8.36 (d, 1H), 8.01 (t, 1H), 7.83 (d, 1H), 7.49 (dd, 1H), 7.26 (d, 1H), 6.54 (dd, 1H), 6.47 (dd, 1H), 5.83 (d, 1H) 5.60 (d, 1H), 2.60-2.67 (m, 2H), 2.39-2.48 (m, 2H), 1.23-1.60 (m, 32H), 0.88 (t, 6H)

The phosphorescent light-emitting compound A had a light-emitting spectrum peak at 472 nm.

<Synthesis Example 6> (Synthesis of Electron Transport Material ET-A)

[Chemical Formula 41]

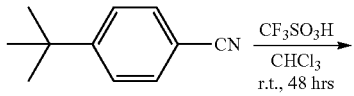

-continued

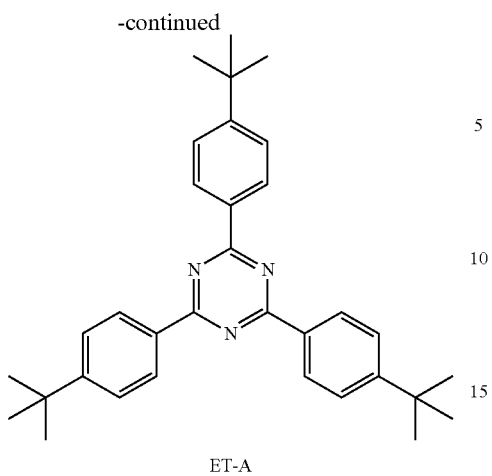

ET-A 4-tert-butylbenzonitrile (10.0 g) and dehydrated chloroform (75 mL) were charged into a round bottom flask and a gas in the flask was charged with a nitrogen, gas. To the resultant reactor solution, trifluoromethanesulfonic acid (11 mL) was added while stirring the reaction solution and the resultant reaction solution was stirred at room temperature for 48 hours. After the completion of the reaction, the reaction solution was cooled down to room temperature and the reaction solution was washed with 10% by weight ammonia water and ion-exchanged water each for one time. The retrieved organic phase was dehydrated over magnesium sulfate and therefrom, and then the solvent was distilled off under reduced pressure. The resultant residue was repeatedly recrystallized in a solvent mixture of chloroform/hexane, thus obtaining 4.2 g of an electron transport material ET-A.

The result of the $^1$H-NMR analysis of the electron transport material ET-A is illustrated below.

$^1$H-NMR (300 MHz, CDCl$_3$): δ (ppm)=1.40 (s, 27H), 7.59 (d, J=7.5 Hz, 6H), 8.68 (d, J=7.5 Hz, 6H)

<Synthesis Example 7> (Synthesis of Polymer Compound HP-1)

In an inert atmosphere, 5.20 g of 2,7-bis(1,3,2-dioxaborolan-2-yl)-9,9-dioctylfluorene, 5.42 g of bis(4-bromophenyl)-(4-sec-butylphenyl)-amine, 2.2 mg of palladium acetate, 15.1 mg of tris(2-methylphenyl)phosphine, 1.91 g of trioctylmethylammonium chloride (trade name: Aliquat 336; manufactured by Sigma Aldrich Corp.), and 70 mL of toluene were mixed and the resultant reaction solution was heated to 105° C. Into the reaction solution, 19 mL of a 2M sodium carbonate aqueous solution was dropped and the resultant reaction solution was refluxed for 4 hours. After the completion of the reaction, 121 mg of phenylboronic acid was added to the reaction solution and further, the resultant reaction solution was refluxed for 3 hours. Next, to the reaction solution, an aqueous solution of sodium N,N-diethyldithiocarbamate trihydrate was added and the resultant reaction solution was stirred at 80° C. for 2 hours. The reaction solution was cooled down and then, the reaction solution was washed with water, a 3% by weight acetic acid aqueous solution, and water in this order, followed by passing the resultant toluene solution through an alumina column and a silica gel column to be purified. The resultant toluene solution was dropped into a large amount of methanol and the resultant reaction solution was stirred. The resultant precipitate was filtered and was dried, thus obtaining a polymer compound HP-1. The polystyrene-equivalent number average molecular weight Xn and The polystyrene-equivalent weight average molecular weight Mw of the polymer compound HP-1 that were measured under the above-described analysis conditions, were $8.4 \times 10^4$ and $3.4 \times 10^5$ respectively.

It is presumed from the charging ratios of the monomers that the polymer compound HP-1 is a polymer compound having a constitutional unit below and a mole fraction below in which the constitutional, units are alternately polymerized.

[Chemical Formula 42]

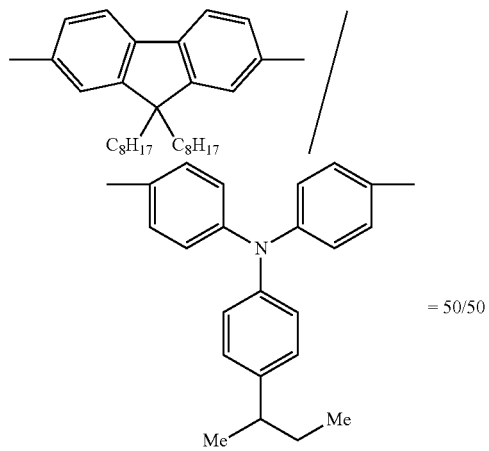

= 50/50

<Synthesis Example 8> (Synthesis of Polymer Compound P-1)

In an inert gas atmosphere, the compound M-1 (0.770 g), the compound M-2 (0.244 g), the compound M-3 (0.326 g), and 15.2 mL of toluene were mixed and while heating the resultant reaction solution, the reaction solution was stirred. To the reaction solution, palladium (II) acetate (0.5 mg) and tris(2-methoxyphenyl)phosphine (3.4 mg) were added and the resultant reaction solution was heated to 100° C. Then, to the reaction solution, a 20% by weight tetraethylammonium hydroxide aqueous solution (5.3 mL) was added and the resultant reaction solution was refluxed for 4.5 hours.

Next, to the reaction mixture, 2-isopropylphenylboric acid (25.5 mg), palladium (II) acetate (0.5 mg), tris(2-methoxyphenyl)phosphine (3.3 mg), and a 20% by weight tetraethylammonium hydroxide aqueous solution (5.2 mL) were added and further, the resultant reaction solution was refluxed for 17 hours.

From the reaction solution, the aqueous phase was removed and to the resultant reaction mixture, a solution in which sodium N,N-diethyldithiocarbamate trihydrate (0.86 g) was dissolved in ion-exchanged water (17 mL) was added, followed by stirring the resultant reaction mixture at 85° C. for 2 hours. The reaction mixture was cooled down to room temperature and was washed with water twice, with a 3% by weight acetic acid aqueous solution twice, and with water four times and the resultant toluene solution was dropped into methanol. A precipitate was deposited and then, the precipitate was filtered and dried. The thoroughly dried precipitate (solid) was dissolved in toluene and the resultant toluene solution was passed through a column filled with silica gel and alumina to be purified. The resultant toluene solution was dropped into methanol and a precipitate was deposited, followed by filtering and drying this precipitate. The yield of this precipitate (hereinafter, called "polymer compound P-1") was 0.58 g. The polystyrene-equivalent number average molecular weight and the polystyrene-equivalent weight average molecular weight of the polymer compound P-1 measured under the above-described analysis conditions were Mn=$1.0\times10^5$ and Mw=$3.8\times10^5$.

It is presumed from the charging ratios of the monomers that the polymer compound P-1 is a polymer compound having a constitutional unit below and a mole fraction below in which a constitutional unit of (PA) and a constitutional unit selected from (PB) are alternately polymerized.

[Chemical Formula 43]

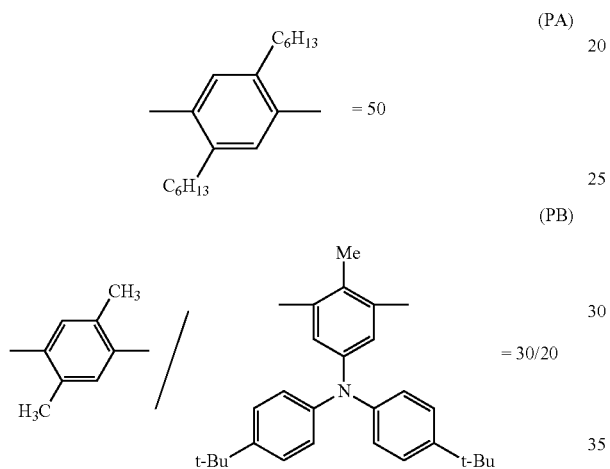

<Synthesis Example 9> (Synthesis of Polymer Compound P-2)

In an inert gas atmosphere, the compound M-1 (0.724 g), the compound M-2 (0.231 g, the compound M-4 (0.347 g), and 15.6 of toluene were mixed and while heating the resultant reaction solution, the reaction solution was stirred. To the reaction solution, palladium (II) acetate (0.5 mg) and tris(2-methoxyphenyl)phosphine (3.1 mg) were added and the resultant reaction solution was heated to 100° C. Then, to the reaction solution, a 20% by weight tetraethylammonium hydroxide aqueous solution (4.9 mL) was added and the resultant reaction solution was refluxed for hours.

Next, to the reaction solution, 2-isopropylphenylboric acid (24.1 mg), palladium (II) acetate (0.5 mg), tris(2-methoxyphenyl)phosphine (3.1 mg), and a 20% by weight tetraethylammonium hydroxide aqueous solution (4.9 mL) were added and further, the resultant reaction solution was refluxed for 18 hours.

From the reaction solution, the aqueous phase was removed and to the resultant reaction mixture, a solution in which sodium N,N-diethyldithiocarbamate trihydrate (0.81 g) was dissolved in ion-exchanged water (16 mL) was added, followed by stirring the resultant reaction mixture at 85° C. for 2 hours. The reaction mixture was cooled down to room temperature and was washed with water twice, with a 3% by weight acetic acid aqueous solution twice, and with water five times and the resultant toluene solution was dropped into methanol. A precipitate was deposited and then, the precipitate was filtered and dried. The thoroughly dried precipitate (solid) was dissolved in toluene and the resultant toluene solution was passed through a column filled with silica gel and alumina to be purified. The resultant toluene solution was dropped into methanol and a precipitate was deposited, followed by filtering and drying this precipitate. The yield of this precipitate (hereinafter, called "polymer compound P-2") was 0.63. The polystyrene-equivalent number average molecular weight and the polystyrene-equivalent weight average molecular weight of the polymer compound P-2 measured under the above-described analysis conditions were Mn=$4.2\times10^4$ and Mw=$1.2\times10^5$.

It is presumed from the charging ratios of the monomers that the polymer compound P-2 is a polymer compound having a constitutional unit below and a mole fraction below in which a constitutional unit of (PA) and a constitutional unit selected from (PB) are alternately polymerized.

[Chemical Formula 44]

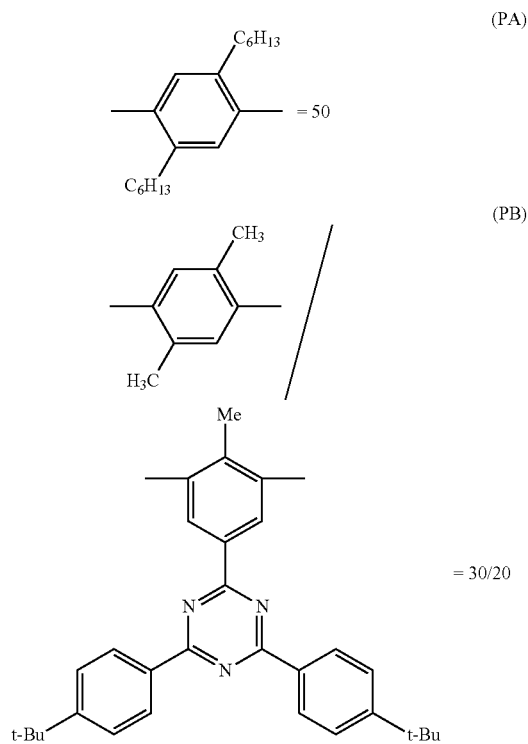

<Synthesis Example 10> (Synthesis of Polymer Compound P-3)

In an inert gas atmosphere, the compound M-1 (0.537 g), the compound M-3 (0.227 g), the compound M-4 (0.384 g), and 15 mL of toluene were mixed and while heating the resultant reaction solution, the reaction solution was stirred. To the reaction solution, palladium (II) acetate (0.4 mg) and tris(2-methoxyphenyl)phosphine (2.3 mg) were added and the resultant reaction solution was heated to 100° C. Then, to the reaction solution, a 20% by weight tetraethylammonium hydroxide aqueous solution (5.5 mL) was added and the resultant reaction solution was refluxed for 5 hours.

Next, to the reaction Solution, 2-isopropylphenylboric acid (17.9 mg), palladium (II) acetate 0.4 mg), tris(2-methoxyphenyl)phosphine (2.3 mg), and a 20% by weight tetraethylammonium hydroxide aqueous solution (3.6 mL) were added and further, the resultant reaction solution was refluxed for 17 hours.

From the reaction solution, the aqueous phase was removed and to the resultant reaction mixture, a solution in which sodium N,N-diethyldithiocarbamate trihydrate (0.60 g) was dissolved in ion-exchanged water (12 mL) was added, followed by stirring the resultant reaction mixture at 85° C. for 2 hours. The reaction mixture was cooled down to room temperature and was washed with water twice, with a 3% by weight acetic acid aqueous solution twice, and with water twice and the resultant toluene solution was dropped into methanol. A precipitate was deposited and then, the precipitate was filtered and dried. The thoroughly dried precipitate (solid) was dissolved in toluene and the resultant toluene solution was passed through a column filled with silica gel and alumina to be purified. The resultant toluene solution was dropped into methanol and a precipitate was deposited, followed by filtering and drying this precipitate. The yield of this precipitate (hereinafter, called "polymer compound P-3") was 0.56 g. The polystyrene-equivalent number average molecular weight and the polystyrene-equivalent weight average molecular weight of the polymer compound P-3 measured under the above-described analysis conditions were $Mn=2.5\times10^4$ and $Mw=1.1\times10^5$.

It is presumed from the charging ratios of the monomers that the polymer compound P-3 is a polymer compound having a constitutional unit below and a mole fraction below in which a constitutional unit of (PA) and a constitutional unit selected from (PB) are alternately polymerized.

[Chemical Formula 45]

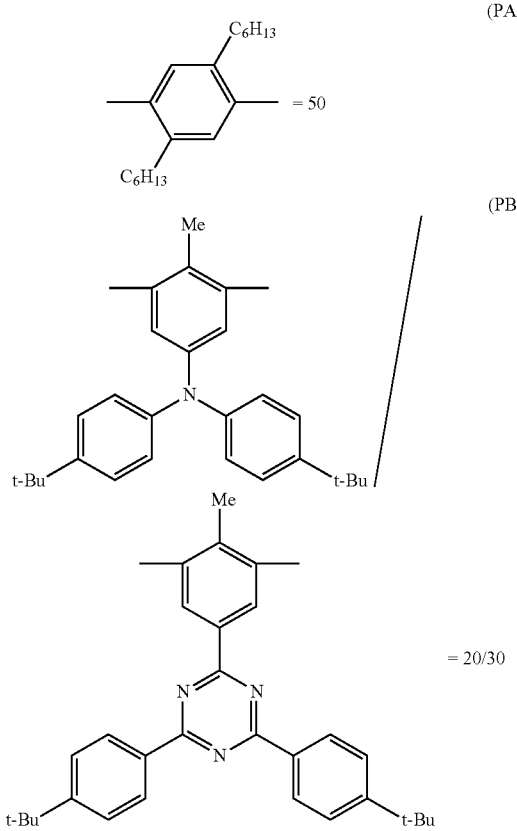

<Synthesis Example 11> (Synthesis of polymer Compound CP-1)

In an inert gas atmosphere, the compound M-1 (3.13 g), 2,7-dibromo-9,9-dioctylfluorene (3.47 g), and 80.0 mL of toluene were mixed and while heating the resultant reaction solution, the reaction solution was stirred. To the reaction solution, palladium (II) acetate (2.2 mg) and tris(2-methoxyphenyl)phosphine (13.4 ng) were added and the resultant reaction solution was heated to 100° C. Then, into the reaction solution, a 20% by weight tetraethylammonium hydride aqueous solution (22.0 mL) was dropped and the resultant reaction solution was refluxed for 4.5 hours. After the completion of the reaction, to the reaction solution, phenylboric acid (78 mg), palladium (II) acetate (2.2 mg), tris(2-methoxyphenyl)phosphine (13.4 mg), and a 20% by weight tetraethylarsonium hydroxide aqueous solution (22.0 mL) were added and further, the resultant reaction solution was refluxed for 15 hours. From the reaction solution, the aqueous phase was removed and to the resultant reaction mixture, a 0.2M sodium diethyldithiocarbamate aqueous solution (70 mL) was added, followed by stirring the resultant reaction mixture at 85° C. for 2 hours. The reaction mixture was cooled down to room temperature and was washed with water three times, with a 3% by weight acetic acid aqueous solution three times, and with water three times and the resultant toluene solution was dropped into methanol. A precipitate was deposited and then, the precipitate was filtered and dried. The thoroughly dried precipitate (solid) was dissolved in toluene and the resultant toluene solution was passed through a column filled with silica gel and alumina to be purified. The resultant toluene solution was dropped into methanol and a precipitate was deposited, followed by filtering an drying this precipitate. The yield of this precipitate (hereinafter called "polymer compound CP-1") was 3.52 g. The polystyrene-equivalent number average molecular weight and the polystyrene-equivalent weight average molecular weight of the polymer compound CP-1 measured under the above-described analysis conditions were $Mn=3.6\times10^5$ and $Mw=9.4\times10^5$.

It is presumed from the charging ratios of the monomers that the polymer compound CP-1 is a polymer compound having a constitutional unit below and a mole fraction below in which the constitutional units are alternately polymerized.

[Chemical Formula 46]

<Synthesis Example 12> (Synthesis of Polymer Compound CP-2)

In a nitrogen atmosphere, in a flask, a mixture of 2,7-bis(1,3,2-dioxaborolan-2-yl)-9,9-dioctylfluorene (1.5915 g, 3.000 mmol), the compound M-3 (1.5881 g, 3.000 mmol), and toluene (30 mL) was heated to 90° C. and to the resultant reaction mixture, palladium acetate (1.0 mg, 4.5 µmol), tris(2-methoxyphenyl)phosphine (6.3 mg, 18 µmol), and a 20% by weight tetraethylammonium hydroxide aqueous solution (10 mL, 14 mmol) were added. The resultant reaction mixture was further stirred for about 20 hours while refluxing the reaction mixture by heating.

Next, to the reaction mixture, phenylboric acid (0.366 g, 3.0 mmol), palladium acetate (1.0 mg, 4.5 μmol), and tris(2-methoxyphenyl)phosphine (6.3 mg, 18 μmol) were added and while heating the resultant reaction mixture to 105° C. and refluxing the reaction mixture, the reaction mixture was stirred for about 4 hours.

Next, to the reaction mixture, bromobenzene (0.66 g, 4.2 mmol), palladium acetate (1.0 mg, 4.5 μmol), and tris(2-methoxyphenyl)phosphine (6.3 mg, 18 μmol) were added and while heating the resultant reaction mixture to 105° C. and refluxing the reaction mixture, the reaction mixture was stirred for about 4 hours.

Furthermore, to the reaction mixture, a solution in which sodium N,N-diethyldithiocarbamate trihydrate (1.83 g) was dissolved in ion-exchanged water (18 mL) was added and while hearing the resultant reaction solution to 85° C., the reaction solution was stirred for 2 hours.

The organic phase was separated from the aqueous phase and was sequentially washed with ion-exchanged water twice, with a 3% by weight acetic acid aqueous solution twice, and with ion-exchanged water twice. The organic phase was dropped into methanol to precipitate a polymer compound and the polymer compound was filtered and dried to obtain a solid. This solid was dissolved in toluene and the resultant toluene solution was passed through a silica gel column and an alumina column through which toluene was passed beforehand. The resultant toluene solution was dropped into methanol to precipitate a polymer compound and the polymer compound was filtered and dried, thus obtaining a polymer compound CP-2 (1.87 g). The number polystyrene-equivalent average molecular weight (Mn) and the polystyrene-equivalent weight average molecular weight (Mw) of the polymer compound CP-2 measured under the above-described analysis conditions were Mn=$2.6 \times 10^4$ and Mw=$3.5 \times 10^4$.

It is presumed from the charging ratios of the monomers that the polymer compound CP-2 is a polymer compound having a constitutional unit below and a mole fraction below in which the constitutional units are alternately polymerized.

[Chemical Formula 47]

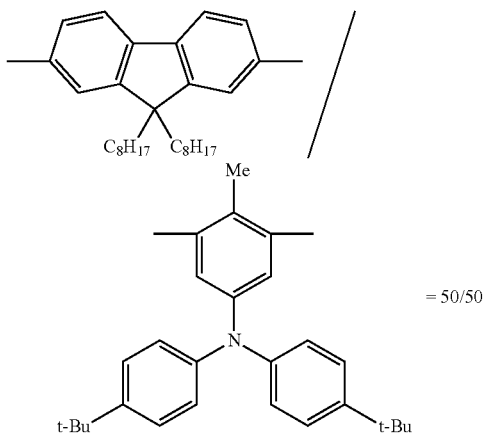

<Synthesis Example 13> (Synthesis of Polymer Compound CP-3)

In a nitrogen atmosphere, in a flask, a mixture of 2,7-bis (4,4,5,5-tetramethyl-1,3,2-dioxaborolan-2-yl)-9,9-dioctyl-fluorene (1.2851 mg, 2.000 mmol), 1,4-dihexyl-2,5-dibromobenzene (646.8 mg, 1.600 mmol), the compound M-3 (211.7 mg, 0.400 mmol), and toluene (40 mL) was heated to 90° C. and to the resultant reaction mixture, palladium acetate (0.9 mg, 4 μmol), tris(2-methoxyphenyl)phosphine 5.6 mg, 16 μmol), and a 20% by weight tetraethylammonium hydroxide aqueous solution (6.6 mL, 9.4 mmol) were added. The resultant reaction mixture was further stirred for about 6 hours while refluxing the reaction mixture by heating.

Next, to the reaction mixture, phenylboric acid (25.7 mg, 0.200 mmol), palladium acetate (0.9 mg, 4 μmol) and tris(2-methoxyphenyl)phosphine (5.6 mg, 16 μmol) that were dissolved in toluene (20 mL), and a 20% by weight tetraethylammonium hydroxide aqueous solution (6.6 mL, 9.4 mmol) were added and while heating the resultant reaction mixture to 105° C., the reaction mixture was stirred for about 16 hours while refluxing the reaction mixture.

Furthermore, to the reaction mixture, a solution in which sodium N,N-diethyldithiocarbamate trihydrate (1.22 g) was dissolved in ion-exchanged water (20 mL) was added and while heating the resultant reaction mixture to 850° C., the reaction mixture was stirred for 2 hours.

The organic phase was separated from the aqueous phase and was sequentially washed with ion-exchanged water twice, with a 3% by weight acetic acid aqueous solution twice, and with ion-exchanged water twice. The organic phase was dropped into methanol to precipitate a polymer compound and the polymer compound was filtered and dried to obtain a solid. This solid was dissolved an toluene and the resultant toluene solution was passed through a silica gel column and an alumina column through which toluene was passed beforehand. The resultant toluene solution was dropped into methanol to precipitate a polymer compound and the polymer compound was filtered and dried, thus obtaining a polymer compound CP-3 (1.14 g). The polystyrene-equivalent number average molecular weight (Mn) and the polystyrene-equivalent weight average molecular weight (Mw) of the polymer compound CP-3 measured under the above-described analysis conditions were Mn=$4.3 \times 10^4$ and Mw=$1.0 \times 10^5$.

It is presumed from the charging ratios of the monomers that the polymer compound CP-3 is a polymer compound having a constitutional unit below and a mole fraction below in which a constitutional unit of (PA) and a constitutional unit selected from (PB) are alternately polymerized.

[Chemical Formula 48]

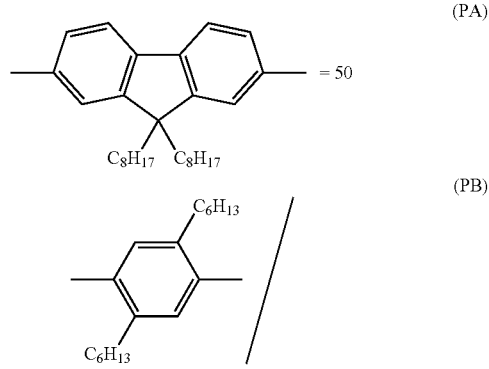

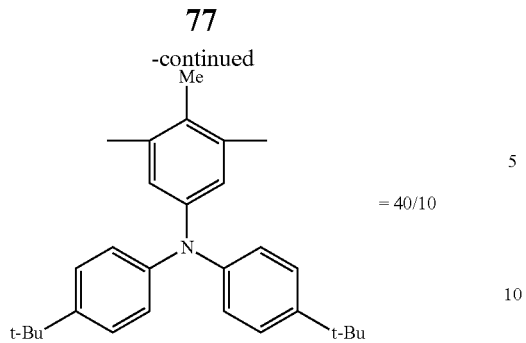

= 40/10

<Synthesis Example 14> (Synthesis of Polymer Compound CP-4)

In a nitrogen atmosphere, in a flask, a mixture of 2,7-bis(4,4,5,5-tetramethyl-1,3,2-dioxaborolan-2-yl)-9,9-dioctyl-fluorene (1.2851 mg, 2.000 mmol), 1,4-dihexyl-2,5-dibromobenzene (646.8 mg, 1600 mmol), the compound M-4 (238.3 mg, 0.400 mol), and toluene (40 mL) was heated to 90° C. and to the resultant reaction mixture, palladium acetate (0.9 mg, 4 μmol), tris(2-methoxyphenyl)phosphine (5.6 mg, 16 μmol), and a 20% by weight tetraethylammonium hydroxide aqueous solution (6.6 mL, 9.4 mmol) were added. The resultant reaction mixture was further stirred for about 6 hours while refluxing the reaction mixture by heating.

Next, to the reaction mixture, phenylboric acid (25.7 mg, 0.200 mmol), palladium acetate (0.9 mg, 4 μmol) and tris(2-methoxyphenyl)phosphine (5.6 mg, 16 μmol) that were dissolved in toluene (20 mL), and a 20% by weight tetraethylammonium hydroxide aqueous solution (6.6 mL, 9.4 mmol) were added and while heating the resultant reaction mixture to 105° C., the reaction mixture was stirred for about 16 hours while refluxing the reaction mixture.

Furthermore, to the reaction mixture, a solution in which sodium N,N-diethyldithiocarbamate trihydrate (1.22 g) was dissolved in ion-exchanged water (20 mL) was added and while heating the resultant reaction mixture to 85° C., the reaction mixture was stirred for 2 hours.

The organic phase was separated from the aqueous phase and was sequentially washed with ion-exchanged water twice, with a 3% by weight acetic acid aqueous solution twice, and with ion-exchanged water twice. The organic phase was dropped into methanol to precipitate a polymer compound and the polymer compound was filtered and dried to obtain a solid. This solid was dissolved in toluene and the resultant toluene solution was passed through a silica gel column and an alumina column through which toluene was passed beforehand. The resultant toluene solution was dropped into methanol to precipitate a polymer compound and the polymer compound was filtered and dried, thus obtaining a polymer compound CP-4 (1.14 g). The polystyrene-equivalent number average molecular weight (Mn) and the polystyrene-equivalent weight average molecular weight (Mw) of the polymer compound CP-4 measured under the above-described analysis conditions were Mn=$5.6 \times 10^4$ and Mw=$1.4 \times 10^5$.

It is presumed from the charging ratios of the monomers that the polymer compound CP-4 is a polymer compound having a constitutional unit below and a mole fraction below in which a constitutional unit of (PA) and a constitutional unit selected from (PB) are alternately polymerized.

[Chemical Formula 49]

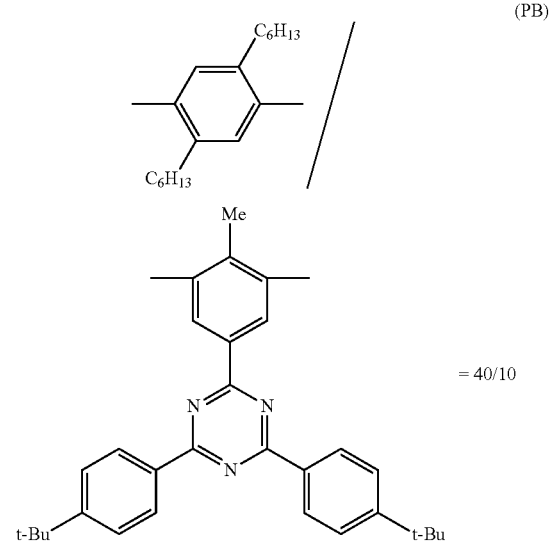

<Synthesis Example 15> (Synthesis of Compound M-5)

[Chemical Formula 50]

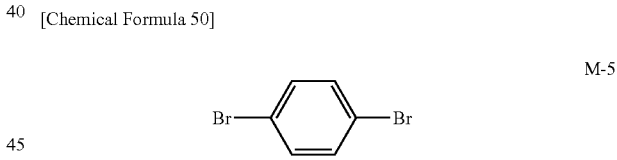

Commercially available 1,4-dibromobenzene was recrystallized to be purified and dried under reduced pressure. The resultant compound that exhibited an HPLC area percent value of 99.5% or more was used as a compound M-5.

<Synthesis Example 16> (Synthesis of Compound M-6)

[Chemical Formula 51]

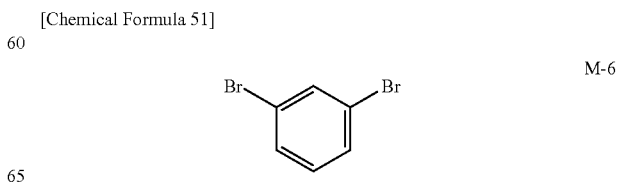

Commercially available 1,3-dibromobenzene was purified by distillation under reduced pressure. The resultant compound that exhibited an HPLC area percent value of 99.2% or more was used as a compound M-6.

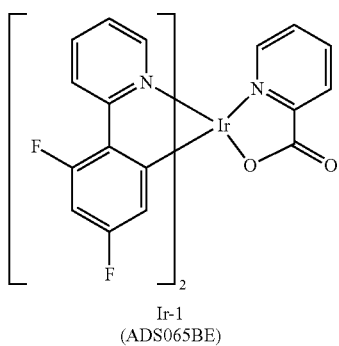

Ir-1
(ADS065BE)

[Chemical Formula 52]

As the phosphorescent light-emitting compound Ir-1, trade name: ADS065BE (manufactured by American Dye Source, Inc.) was purchased to be used.

The phosphorescent light-emitting compound Ir-1 had a light-emitting spectrum peak at 470 nm.

<Synthesis Example 17> (Synthesis of Light-Emitting Material T)

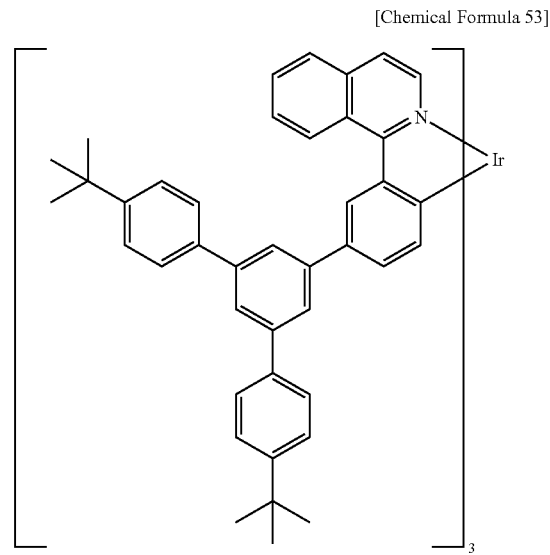

[Chemical Formula 53]

Light-Emitting Material T

The light-emitting material T was synthesized through a synthesis method described in Japanese Patent Application Laid-open No. 2006-188673.

The light-emitting material T had a light-emitting spectrum peak at 619 nm.

<Synthesis Example 18> (Synthesis of Light-Emitting Material U)

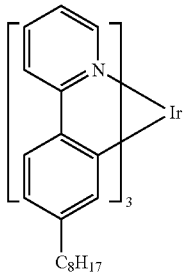

[Chemical Formula 54]

Light-Emitting Material U

The light-emitting material U was synthesized through a synthesis method described in Journal of American Chemical Society, Vol. 107, pp. 1431-1432 (1985).

The light-emitting material U had a light-emitting spectrum peak at 508 nm.

<Synthesis Example 19> (Synthesis of Polymer Compound P-4)

In an inert gas atmosphere, the compound M-1 (1.0317 g), the Compound M-5 (0.0978 g), the compound M-3 (0.4396 g), the compound M-4 (0.4906 g), and toluene (35 mL) were mixed and while heating the resultant reaction solution at 100° C. the reaction solution was stirred. To the reaction solution, palladium (II) acetate (0.9 mg) and tris(2-methoxyphenyl)phosphine (6.0 mg) were added and while continuing heating at 100° C., a 20% by weight tetraethylammonium hydroxide aqueous solution (7.0 mL) was dropped into the reaction solution, followed by refluxing the resultant reaction solution for 7 hours. Next, to the reaction solution, 2-isopropylphenylboric acid (51 mg), palladium (II) acetate (0.5 mg), tris(2-methoxyphenyl)phosphine (2.9 mg), and a 20% by weight tetraethylammonium hydroxide aqueous solution (7.0 mL) were added and further, the resultant reaction solution was refluxed for 16 hours. From the reaction solution, the aqueous phase was removed and to the resultant reaction mixture, a solution in which sodium N,N-diethyldithiocarbamate trihydrate (0.58 g) was dissolved in ion-exchanged water (11.6 mL) was added, followed by stirring the resultant reaction mixture for 2.5 hours while heating the reaction mixture to 85° C.

The organic phase was separated from the aqueous phase and was washed with 3.6% by weight hydrochloric acid twice, with a 2.5% by weight ammonia aqueous solution twice, and with water our times. The washed organic phase (toluene solution) was dropped into methanol to generate a precipitate and this precipitate was filtered and dried. The thoroughly dried precipitate (solid) was dissolved in toluene (68 mL) and the resultant toluene solution was passed through a column filled with silica gel and alumina to be purified. The resultant toluene solution was dropped into methanol to generate a precipitate and this precipitate was filtered and dried. The yield of the precipitate (hereinafter, called "polymer compound P-4") was 0.99 g. The polystyrene-equivalent number average molecular weight and the polystyrene-equivalent weight average molecular weight of the polymer compound P-4 measured under the above-described analysis conditions were $Mn=1.4\times10^4$ and $Mw=3.2\times10^4$.

It is presumed from the charging ratios of the monomers that the polymer compound P-4 is a polymer compound having a constitutional unit below and a mole fraction below in which the constitutional units are alternately polymerized.

[Chemical Formula 55]

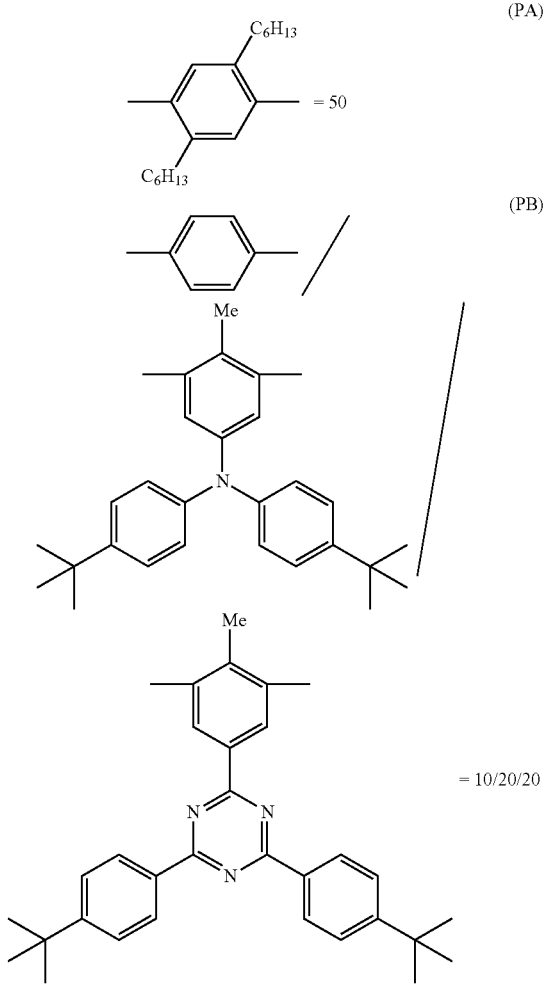

<Synthesis Example 20> (Synthesis of Polymer Compound P-5)

In an inert gas atmosphere, the compound M-1 (1.0318 g), the compound M-6 (0.0978 g), the compound M-3 (0.4396 g), the compound M-4 (0.4907 g, and toluene (35 mL) were mixed and while heating the resultant reaction solution at 100° C., the reaction solution was stirred. To the reaction solution, palladium (II) acetate (0.9 mg) and tris(2-methoxyphenyl)phosphine (5.8 mg) were added and while continuing heating at 100° C., a 20% by weight tetraethylammonium hydroxide aqueous solution (7.0 mL) was dropped into the reaction solution, followed by refluxing the resultant reaction solution for 7.5 hours. Next, to the reaction solution, 2-isopropylphenylboric acid (102 mg), palladium (II) acetate (0.5 mg), tris(2-methoxyphenyl)phosphine (29 mg), and a 20% by weight tetraethylammonium hydroxide aqueous solution (7.0 mL) were added and further, the resultant reaction solution was refluxed for 16 hours. From the reaction solution, the aqueous phase was removed and to the resultant reaction mixture, a solution in which sodium N,N-diethyldithiocarbamate trihydrate (0.58 g) was dissolved in ion-exchanged water (11.6 mL) was added, followed by stirring the resultant reaction mixture for 8 hours while heating the reaction mixture to 85° C.

The organic phase was separated from the aqueous phase and was washed with 3.6% by weight hydrochloric acid twice, with a 2.5% by weight ammonia aqueous solution twice, and with water four times. The washed organic phase (toluene solution) was passed through a column filled with silica gel and alumina to be purified. The resultant toluene solution was dropped into methanol to generate a precipitate and this precipitate was filtered and dried. The yield of the precipitate (hereinafter, called "polymer compound P-5") as 0.93 g. The polystyrene-equivalent number average molecular weight and the polystyrene-equivalent weight average molecular weight of the polymer compound P-5 measured under the above-described analysis conditions were $Mn=7.3 \times 10^3$ and $Mw=1.3 \times 10^4$.

It is presumed from the charging ratios of the monomers that the polymer compound P-5 is a polymer compound having a constitutional unit below and a mole fraction below in which the constitutional units are alternately polymerized.

[Chemical Formula 56]

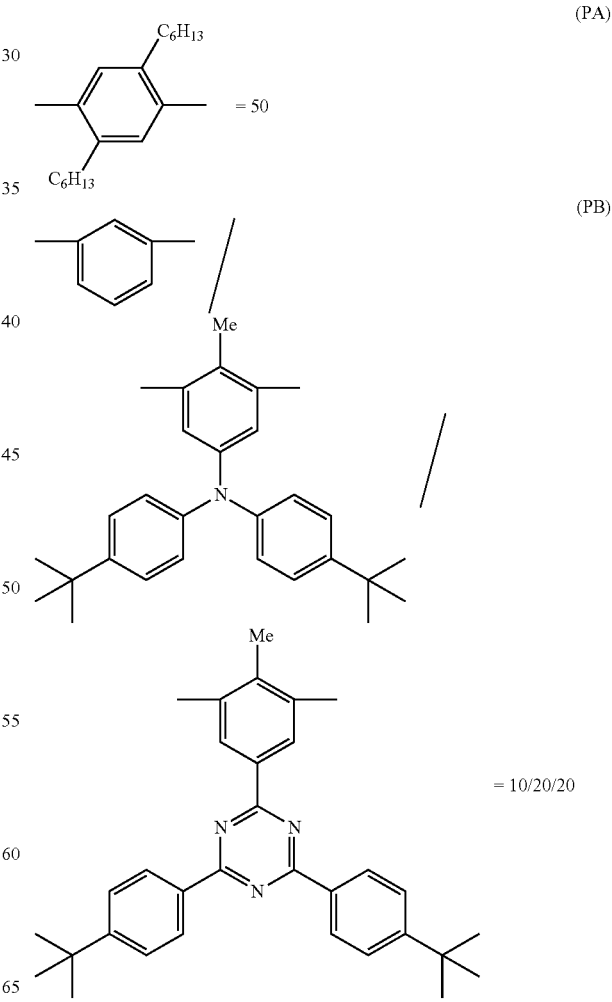

<Synthesis Example 21> (Synthesis of Polymer Compound P-6)

In an inert gas atmosphere, the compound M-1 (1.0464 g), the compound M-2 (0.1660 g), the compound M-3 (0.1113 g), the compound M-4 (0.7464 g), and toluene (35 mL) were mixed and while heating the resultant reaction solution at 100° C., the reaction solution was stirred. To the reaction solution, palladium (II) acetate (0.9 mg) and tris(2-methoxyphenyl)phosphine (6.0 mg) were added and while continuing heating at 100° C., a 20% by weight tetraethylammonium hydroxide aqueous solution (7.1 mL) was dropped into the reaction solution, followed by refluxing the resultant reaction solution for 7.5 hours. Next, to the reaction solution, 2-isopropylphenylboric acid (51 mg), palladium (II) acetate (0.5 mg), tris(2-methoxyphenyl)phosphine (2.9 mg), and a 20% by weight tetraethylammonium hydroxide aqueous solution (7.1, mL) were added and further, the resultant reaction solution was refluxed for 15 hours. From the reaction solution, the aqueous phase was removed and to the resultant reaction mixture, a solution in which sodium N,N-diethyldithiocarbamate trihydrate (0.60 g) was dissolved in ion-exchanged water (12 mL) was added, followed by stirring the resultant reaction mixture for 2.5 hours while heating the reaction mixture to 85° C.

The organic phase was separated from the aqueous phase and was washed with 3.6% by weight hydrochloric acid twice, with a 2.5% by weight ammonia aqueous solution twice, and with water five times. The washed organic phase (toluene solution) was passed through a column filled with silica gel and alumina to be purified. The resultant toluene solution was dropped into methanol to generate a precipitate and this precipitate was filtered and dried. The yield of the precipitate (hereinafter, called "polymer compound P-6") was 0.87 g. The polystyrene-equivalent number average molecular weight and the polystyrene-equivalent weight average molecular weight of the polymer compound P-6 measured under the above-described analysis conditions were $Mn=8.9\times10^3$ and $Mw=1.70\times10^4$.

It is presumed from the charging ratios of the monomers that the polymer compound P-6 is a polymer compound having a constitutional unit below and a mole fraction below in which the constitutional units are alternately polymerized.

[Chemical Formula 57]

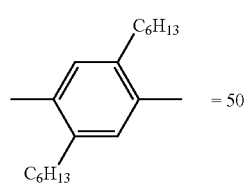

(PA)

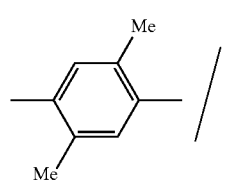

(PB)

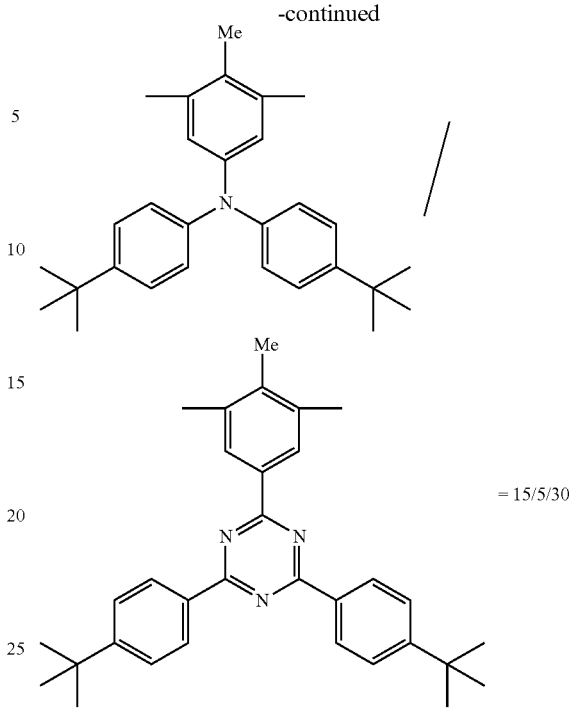

= 15/5/30

<Synthesis Example 22> (Synthesis of Polymer Compound P-7)

In an inert gas atmosphere, the compound M-1 (1.0002 g), the compound M-2 (0.1059 g), the compound M-3 (0.2131 g), the compound M-4 (0.7133 g) and toluene (35 mL) were mixed and while heating the resultant reaction solution at 100° C., the reactor solution was stirred. To the reaction solution, palladium (II) acetate (0.9 mg) and tris(2-methoxyphenyl)phosphine (5.6 mg) were added and while continuing heating at 100° C., a 20% by weight tetraethylammonium hydroxide aqueous solution (6.8 mL) was dropped into the resultant reaction solution, followed by refluxing the resultant reaction solution for 6.5 hours. Next, to the reaction solution, 2-isopropylphenylboric acid (6 mg), palladium (II) acetate (0.5 mg), tris(2-methoxyphenyl)phosphine (2.8 mg), and a 20% by weight tetraethylammonium hydroxide aqueous solution (6.8 mL) were added and further, the resultant reaction solution was refluxed for 16.5 hours. From the reaction solution, the aqueous phase was removed and to the resultant reaction mixture, a solution in which sodium N,N-diethyldithiocarbamate trihydrate (0.57 g) was dissolved in ion-exchanged water (11.9 mL) was added, followed by stirring the resultant reaction mixture for 2 hours while heating the reaction mixture to 85° C.

The organic phase was separated from the aqueous phase and was washed with 3.6% by weight hydrochloric acid twice, with a 2.5% by weight ammonia aqueous solution twice, and with water four times. The washed organic phase (toluene solution) was passed through a column filled with silica gel and alumina to be purified. The resultant toluene solution was dropped into methanol to generate a precipitate and this precipitate was filtered and dried. The yield of the precipitate (hereinafter, called "polymer compound P-7") was 98 g. The polystyrene-equivalent number average molecular weight and the polystyrene-equivalent weight average molecular weight of the polymer compound P-7 measured under the above-described analysis conditions were Mn=5.3×10³ and Mw=1.0×10⁴.

It is presumed from the charging ratio of the monomers that the polymer compound P-7 is a polymer compound having a constitutional unit below and a mole fraction below in which the constitutional units are alternately polymerized.

[Chemical Formula 58]

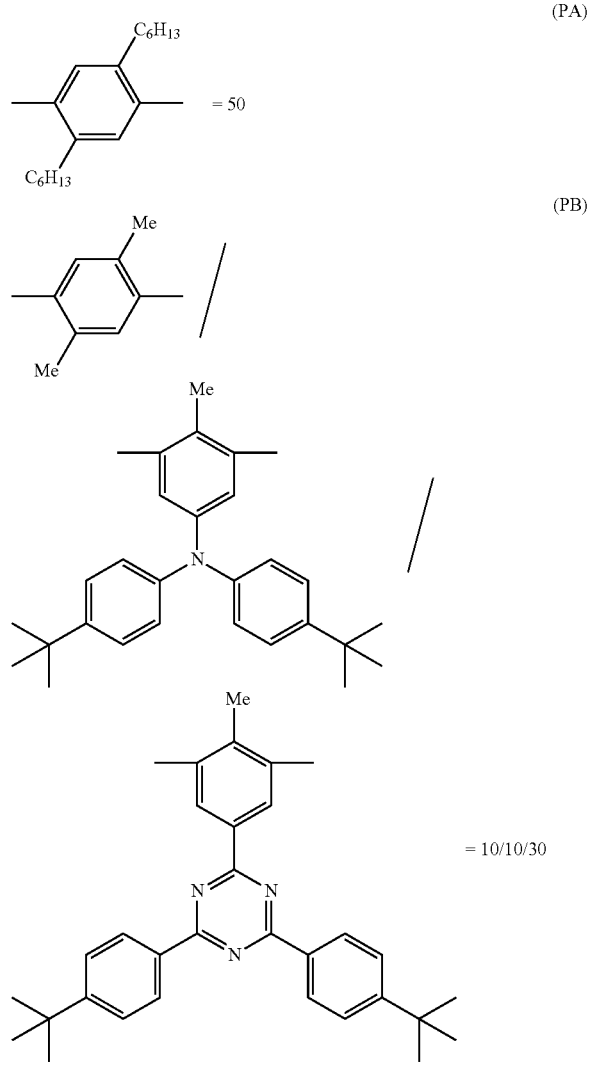

<Synthesis Example 23> (Synthesis of Polymer Compound CP-5)

In an inert gas atmosphere, the compound M-1 (2.8051 g), the compound M-6 (1.3324 g), and toluene (41 mL) were mixed and while heating the resultant reaction solution at 100° C., the reaction solution was stirred. To the reaction solution, palladium (II) acetate (1.2 mg) and tris(2-methoxyphenyl)phosphine (8.0 g) were added and while continuing heating at 100° C., a 20% by weight tetraethylammonium hydroxide aqueous solution (19.1 mL, was dropped into the resultant reaction solution, followed by refluxing the resultant reaction solution for 5.5 hours. Next, to the reaction solution, 2-isopropylphenylboric acid (92 mg), palladium (II) acetate (1.4 mg), tris(2-methoxyphenyl)phosphine (7.9 mg) and a 20% by weight tetraethylammonium hydroxide aqueous solution (19.1 mL) were added and further, the resultant reaction solution was refluxed for 16 hours. From the reaction solution, the aqueous phase was removed and to the resultant reaction mixture, a solution in which sodium N,N-diethyldithiocarbamate trihydrate (1.60 g) was dissolved in ion-exchanged water (32 mL) was added, followed by stirring the resultant reaction mixture for 2 hours while heating the reaction mixture to 85° C.

The organic phase was separated from the aqueous phase and was washed with 3.6% by weight hydrochloric acid twice, with a 2.5% by weight ammonia aqueous solution twice, and with water four times. The washed organic phase (toluene solution) was dropped into methanol to generate a precipitate and this precipitate was filtered and dried. The thoroughly dried precipitate (solid) was dissolved in toluene and the resultant toluene solution was passed through a column filled with silica gel and alumina to be purified. The resultant toluene solution was dropped into methanol to generate a precipitate and this precipitate was filtered and dried. The yield of the precipitate (hereinafter, called "polymer compound CP-5") was 1.49 g. The polystyrene-equivalent number average molecular weight and the polystyrene-equivalent weight average molecular weight of the polymer compound C-5 measured under the above-described analysis conditions were Mn=1.5×10⁴ and Mw=6.1×10⁴.

It is presumed from the charging ratios of the monomers that the polymer compound CP-5 is a polymer compound having a constitutional, unit below and a mole fraction below in which the constitutional units are alternately polymerized.

[Chemical Formula 59]

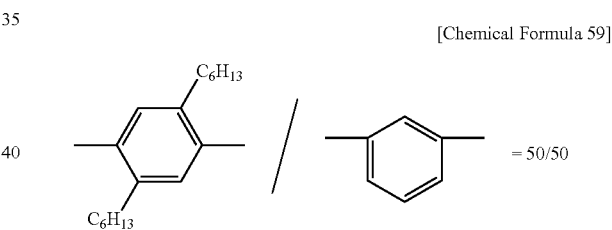

<Example 1> (Manufacturing of Light-Emitting Device 1)

Onto a glass substrate coated with an ITO film by a sputtering method in a thickness of 45 nm, a suspension of poly(3,4)ethylenedioxythiophene/polystyrenesulfonic acid (manufactured by H. C. Starck GmbH; trade name: CLEVIOS P AI4083) (hereinafter, called "CLEVIOS P") was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-1, the phosphorescent light-emitting compound A, and the electron transport material ET-A were dissolved in xylene (manufactured by Kanto Chemical Co., Ltd.; for the electronic industries (EL grade)) in a concentration of 1.2% by weight of the above-described materials (in a weight ratio of polymer compound P-1/phosphorescent light-emitting compound A/electron transport material ET-A=85/5/10). The resultant xylene solution was placed onto the thermally treated film of the polymer compound HP-1 and was made to a coating film as a light-emitting layer 1 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 1 in a thickness of about 5 nm and next, aluminum was vapor-deposited on the barium layer in a thickness of about 60 nm. After the vapor-deposition, the sealing was performed using a glass substrate, thus manufacturing a light-emitting device 1.

When a voltage of until 20 V was applied to the light-emitting device 1, electroluminescence (EL) emitting blue color light was observed. The luminous efficiency at a brightness of 20 cd/m$^2$ was 2.39 cd/A and at this time, the voltage was 6.1 V. The luminous efficiency at a brightness of 50 cd/m$^2$ was 2.05 cd/A and at this time, the voltage was 6.6 V. The luminous efficiency at a brightness of 100 cd/m$^2$ was 1.83 cd/A and at this time, the voltage was 7.1 V.

<Example 2> (Manufacturing of Light-Emitting Device 2)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot place at 200° C. for 10 minutes. Next, the polymer compound HP-1 was dissolved in xylene (manufactured by Kanto Chemical. Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-2 and the phosphorescent light-emit-zing compound A were dissolved in xylene (manufactured by Kanto Chemical Co., Ltd.; for the electronic industries (EL grade)) in a concentration of 1.6% by weight of the above-described materials (in a weight ratio of polymer compound P-2/phosphorescent light-emitting compound A=95/5). The resultant xylene solution was placed onto the thermally treated film of the polymer compound HP-1 and was made to a coating film as a light-emitting layer 2 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 2 in a thickness of about 5 nm and next, aluminum was vapor-deposited on the barium level in a thickness of about 60 nm. After the vapor-deposition, the sealing was performed using a glass substrate, thus manufacturing a light-emitting device 2.

When a voltage of until 20 V was applied to the light-emitting device 2, electroluminescence (EL) emitting blue color light was observed. The luminous efficiency at a brightness of 20 cd/m$^2$ was 1.72 cd/A and at this time, the voltage was 5.2 V. The luminous efficiency at a brightness of 50 cd/m$^2$ was 1.67 cd/A and at this time, the voltage was 5.8 V. The luminous efficiency at a brightness of 100 cd/m$^2$ was 1.62 cd/A and at this time, the voltage was 6.3 V.

<Example 3> (Manufacturing of Light-Emitting Device 3)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3 and the phosphorescent light-emitting compound A were dissolved in xylene (manufactured by Kanto Chemical Co., Ltd.; for the electronic industries (EL grade)) in a concentration of 1.7% by weight of the above-described materials (in a weight ratio of polymer compound P-3/phosphorescent light-emitting compound A=95/5). The resultant xylene solution was placed onto the thermally treated film of the polymer compound HP-1 and was made to a coating film as a light-emitting layer 3 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 3 in a thickness of about 5 nm and next, aluminum was vapor-deposited on the barium layer in a thickness of about 60 nm. After the vapor-deposition, the sealing was performed using a glass substrate, thus manufacturing a light-emitting device 3.

When a voltage of until 20 V was applied to the light-emitting device 3, electroluminescence (EL) emitting blue color light was observed. The luminous efficiency at a brightness of 20 cd/m$^2$ was 4.08 cd/A and at this time, the voltage was 4.1 V and the luminescent chromaticity was (0.16, 0.31). The luminous efficiency at a brightness of 50 cd/m$^2$ was 4.74 cd/A and at this time, the voltage was 4.3 V and the luminescent chromaticity was (0.16, 0.30). The luminous efficiency at a brightness of 100 cd/m$^2$ was 5.30 cd/A and at this time, the voltage was 4.5 V and the luminescent chromaticity was (0.15, 0.30).

<Comparative Example 1> (Manufacturing of Light-Emitting Device C1)

Onto a glass substrate coated with an ITO film by a sputtering method in a thickness of 45 nm, a suspension of CLEVIOS P was placed and was made to a coating film by a spin coating method so that the resultant coating film has a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-1 and the phosphorescent light-emitting compound A were dissolved in xylene (manufactured by Kanto Chemical Co., Ltd.; for the electronic industries (EL grade)) in a concentration of 0.7% by weight of the above-described materials (in a weight ratio of polymer compound CP-1/phosphorescent light-emitting compound A=95/5). The resultant xylene solution was placed onto the thermally treated film of the polymer compound HP-1 and was made to a coating film as a light-emitting layer C1 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C1 in a thickness of about 5 nm and next, aluminum was vapor-deposited on the barium layer in a thickness of about 60 nm. After the vapor-deposition, the sealing was performed using a glass substrate, thus manufacturing a light-emitting device C1.

When a voltage of until 20 V was applied to the light-emitting device C1, electroluminescence (EL) emitting blue color light was observed. The luminous efficiency at a brightness of 20 cd/m² was 0.01 cd/A and at this time, the voltage was 18.8 V. The brightness could not reach 50 cd/m² and 100 cd/m².

<Comparative Example 2> (Manufacturing of Light-Emitting Device C2)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-1, the phosphorescent light-emitting compound A, and the electron transport material ET-A were dissolved in xylene (manufactured by Kanto Chemical Co., Ltd.; for the electronic industries (EL grade)) in a concentration of 0.7% by weight of the above-described materials (in a weight ratio of polymer compound CP-1/phosphorescent light-emitting compound A/electron transport material ET-A=85/5/10). The resultant xylene solution was placed onto the thermally treated film of the polymer compound HP-1 and was made to a coating film as a light-emitting layer C2 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C2 in a thickness of about 5 nm and next, aluminum was vapor-deposited on the barium layer in a thickness of about 60 nm. After the vapor-deposition, the sealing was performed using a glass substrate, thus manufacturing a light-emitting device C2.

When a voltage of until 20 V was applied to the light-emitting device C2, electroluminescence (EL) emitting blue color light was observed. The luminous efficiency at a brightness of 20 cd/m² was 0.01 cd/A and at this time, the voltage was 18.4 V. The brightness could not reach 50 cd/m² and 100 cd/m².

<Comparative Example 3> (Manufacturing of Light-Emitting Device C3)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-2 and the phosphorescent light-emitting compound A were dissolved in xylene (manufactured by Kanto Chemical Co., Ltd.; for the electronic industries (EL grade)) in a concentration of 2.3% by weight of the above-described materials (in a weight ratio of polymer compound CP-2/phosphorescent light-emitting compound A=95/5). The resultant xylene solution was placed onto the thermally treated film of the polymer compound HP-1 and was made to a coating film as a light-emitting layer C3 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C3 in a thickness of about 5 nm and next, aluminum was vapor-deposited on the barium layer in a thickness of about 60 nm. After the vapor-deposition, the sealing was performed using a glass substrate, thus manufacturing a light-emitting device C3.

When a voltage of until 20 V was applied to the light-emitting device C3, electroluminescence (EL) emitting blue color light was observed. The luminous efficiency at a brightness of 20 cd/m² was 0.01 cd/A and at this time, the voltage was 13.1 V. The brightness could nor reach 50 cd/m² and 100 cd/m².

<Comparative Example 4> (Manufacturing of Light-Emitting Device C4)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 20° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-2, the phosphorescent light-emitting compound A, and the electron transport material ET-A were dissolved in xylene (manufactured by Kanto Chemical Co., Ltd.; for the electronic industries (EL grade)) in a concentration of 2.3% by weight of the above-described materials (in a weight ratio of polymer compound CP-2/phosphorescent light-emitting compound A/electron transport material ET-A=85/5/10). The resultant xylene solution was placed onto the thermally treated film of the polymer compound HP-1 and was made to a coating film as a light-emitting layer C4 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C4 in a thickness of about 5 nm and next, aluminum was vapor-deposited on the barium layer in a thickness of about 60 nm. After the vapor-deposition, the sealing was performed using a glass substrate, thus manufacturing a light-emitting device C4.

When a voltage of until 20 V was applied to the light-emitting device C4, electroluminescence (EL) emitting blue color light was observed. The luminous efficiency at a a brightness of 20 cd/m² was 0.03 cd/A and at this time, the voltage was 10.2 V. The luminous efficiency at a brightness of 50 cd/m² was 0.02 cd/A and at this time, the voltage was 13.1 V. The luminous efficiency at a brightness of 10 cd/m² was 0.02 cd/A and at this time, the voltage was 19.3 V.

<Comparative Example 5> (Manufacturing of Light-Emitting Device C5)

Onto a glass substrate coated with an ITO film by a sputtering method an a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co, Ltd.; for the electronic industries (EL grade)) in a concentration of 0.7% by weight, and the resultant xylene solution was placed Onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-3 and the phosphorescent light-emitting compound A were dissolved in xylene (manufactured by Kanto Chemical Co., Ltd.; for the electronic industries (EL grade)) in a concentration of 1.7% by weight of the above-described materials (in a weight ratio of polymer compound CP-3/phosphorescent light-emitting compound A=95/5). The resultant xylene solution was placed onto the thermally treated film of the polymer compound HP-1 and was made to a coating film as a light-emitting layer C5 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C5 in a thickness of about 5 nm and next, aluminum was vapor-deposited on the barium layer in a thickness of about 60 nm. After the vapor-deposition, the sealing was performed using a glass substrate, thus manufacturing a light-emitting device C5.

When a voltage of until 20 V was applied to the light-emitting device C5, electroluminescence (EL) emitting blue color light was observed. However, the brightness could not reach 20 cd/m², 50 cd/m², and 100 cd/m².

<Comparative Example 6> (Manufacturing of Light-Emitting Device C6)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weigh, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-3, the phosphorescent light-emitting compound. A, and the electron transport material ET-A were dissolved in xylene (manufactured by Kanto Chemical Co., Ltd.; for the electronic industries (EL grade)) in a concentration of 1.7% by weight of the above-described materials (in a weight ratio of polymer compound CP-3/phosphorescent light-emitting compound A/electron transport material ET-A=85/5/10). The resultant xylene solution was placed onto the thermally treated film of the polymer compound HP-1 and was made to a coating film as a light-emitting layer C6 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C6 in a thickness of about 5 nm and next, aluminum was vapor-deposited on the barium layer in a thickness of about 60 nm. After the vapor-deposition, the sealing was performed using a glass substrate, thus manufacturing a light-emitting device C6.

When a voltage of until 20 V was applied to the light-emitting device C6, electroluminescence (EL) emitting blue color light was observed. The luminous efficiency at a brightness of 20 cd/m$^2$ was 0.01 cd/A and at this time, the voltage was 19.6 V. The brightness could not reach 50 cd/m$^2$ and 100 cd/m$^2$.

<Comparative Example 7> (Manufacturing of Light-Emitting Device C7)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-4 and the phosphorescent light-emitting compound A were dissolved in xylene (manufactured by Kanto Chemical Co., Ltd.; for the electronic industries (EL grade)) in a concentration of 1.7% by weight of the above-described materials (in a weight ratio of polymer compound CP-4/phosphorescent light-emitting compound A=95/5). The resultant xylene solution was placed onto the thermally treated film of the polymer compound HP-1 and was made to a coating film as a light-emitting layer C7 by a spin coating method so as to have a thickness of about 60 nm. Then, in a nitrogen atmosphere having an oxygen concentration and a water concentration of each 10 ppm or less (on a weight basis), the resultant coating film was dried at 130° C. for minutes. The pressure of the atmosphere was reduced to 1.0×10$^{-4}$ Pa or less and as the cathode, barium was vapor-deposited on the film of the light-emitting layer C7 in a thickness of about 5 nm and next, aluminum was vapor-deposited on the barium layer in a thickness of about 60 nm. After the vapor-deposition, the sealing was performed using a glass substrate, thus manufacturing a light-emitting device C7.

When a voltage of until 20 V was applied to the light-emitting device C7, electroluminescence (EL) emitting blue color light was observed. The luminous efficiency at a brightness of 20 cd/m$^2$ was 0.04 cd/A and at this time, the voltage was 15.2 V. The luminous efficiency at a brightness of 50 cd/m$^2$ was 0.03 cd/A and at this time, the voltage was 18.4 V. The brightness could nor reach 100 cd/m$^2$.

<Example 4> (Manufacturing of Light-Emitting Device 4)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-4 and the phosphorescent light-emitting compound A were dissolved in xylene (manufactured by Kanto Chemical Co., Ltd.; for the electronic industries (EL grade)) in a concentration of 2.6% by weight of the above-described materials (in a weight ratio of polymer compound P-4/phosphorescent light-emitting compound A=95/5). The resultant xylene solution was placed onto the thermally treated film of the polymer compound HP-1 and was made to a coating film as a light-emitting layer 4 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to 1.0×10$^{-4}$ Pa or less and as the cathode, barium was vapor-deposited on the film of the light-emitting layer 4 in a thickness of about 5 nm and next, aluminum was vapor-deposited on the barium layer in a thickness of about 60 nm. After the vapor-deposition, the sealing was performed using a glass substrate, thus manufacturing a light-emitting device 4.

When a voltage of until 20 V was applied to the light-emitting device 4, electroluminescence (EL) emitting blue color light was observed. The luminous efficiency at a brightness of 20 cd/m$^2$ was 3.02 cd/A and at this time, the voltage was 4.0 V. The luminous efficiency at a brightness of 50 cd/m$^2$ was 3.44 cd/A and at this time, the voltage was 4.2 V. The luminous efficiency at a brightness of 100 cd/m$^2$ was 3.79 cd/A and at this time, the voltage was 4.4 V.

<Example 5> (Manufacturing of Light-Emitting Device 5)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus containing a thermally treated film. Next, the polymer compound P-5 and the phosphorescent light-emitting compound A were dissolved in xylene (manufactured by Kanto Chemical Co., Ltd.; for the electronic industries (EL grade)) in a concentration of 2.6% by weight of the above-described materials (in a weight ratio of polymer compound P-5/ phosphorescent light-emitting compound A=95/5). The resultant xylene solution was placed onto the thermally treated film of the polymer compound HP-1 and was made to a coating film as a light-emitting layer 5 by a spin coating method so as to have a thickness of about 60 nm. Then, in a nitrogen atmosphere having an oxygen concentration and a water concentration of each 10 ppm or less (on a weight basis), the resultant coating film was dried at 130° C. for minutes. The pressure of the atmosphere was reduced to $1.0 \times 10^{-4}$ Pa or Less and as the cathode, barium was vapor-deposited on the film of the light-emitting layer 5 in a thickness of about 5 nm and next, aluminum was vapor-deposited on the barium layer in a thickness of about 60 nm. After the vapor-deposition, the sealing was performed using a glass substrate, thus manufacturing a light-emitting device 5.

When a voltage of until 20 V was applied to the light-emitting device 5, electroluminescence (EL) emitting blue color light was observed. The luminous efficiency at a brightness of 20 cd/m$^2$ was 4.78 cd/A and at this time, the voltage was 4.2 V. The luminous efficiency at a brightness of 50 cd/m$^2$ was 5.28 cd/A and at this time, the voltage was 4.4 V. The luminous efficiency at a brightness of 100 cd/m$^2$ was 5.71 cd/A and at this time, the voltage was 4.6 V, <Example 6> (Manufacturing of Light-Emitting Device 6)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and, was made a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-6 and the phosphorescent light-emitting compound A were dissolved in xylene (manufactured by Kanto Chemical Co., Ltd.; for the electronic industries (EL grade)) in a concentrator of 2.6% by weight of the above-described materials (in a weight ratio of polymer compound P-6/ phosphorescent light-emitting compound A=95/5). The resultant xylene solution was placed onto the thermally treated film of the polymer compound HP-1 and was made to a coating film as a light-emitting layer 6 by a spin coating method so as to have a thickness of about 60 nm. Then, in a nitrogen atmosphere having an oxygen concentration and a water concentration of each 10 ppm or less (on a weight basis), the resultant coating film was dried at 130° C.for 10 minutes. The pressure of the atmosphere was reduced to $1.0 \times 10^{-4}$ Pa or less and as the cathode, barium was vapor-deposited deposited on the film the light-emitting layer 6 in a thickness of about 5 nm and next, aluminum was vapor-deposited on the barium layer in a thickness of about 60 nm. After the vapor-deposition, the sealing was performed using a glass substrate, thus manufacturing a light-emitting device 6.

When a voltage of until 20 V was applied to the light-emitting device 6, electroluminescence (EL) emitting blue color light was observed. The luminous efficient at a brightness of 20 cd/m$^2$ was 5.23 cd/A and at this time, the voltage was 4.5 V. The luminous efficiency at a brightness of 50 cd/m$^2$ was 5.88 cd/A and at this time, the voltage was 4.9 V. The luminous efficiency at a brightness of 100 cd/m$^2$ was 6.04 cd/A and at this time, the voltage was 5.3 V.

<Example 7> (Manufacturing of Light-Emitting Device 7)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes thus obtaining a thermally treated film. Next, the polymer compound P-7 and the phosphorescent light-emitting compound. A were dissolved in xylene (manufactured by Kanto Chemical Co., Ltd.; for the electronic industries (EL grade)) in a concentration of 2.7% by weight of the above-described materials in a weight ratio of polymer compound P-7/ phosphorescent light-emitting compound A=95/5). The resultant xylene solution was placed onto the thermally treated film of the polymer compound HP-1 and was made to a coating film as a light-emitting layer 7 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 7 in a thickness of about 5 nm and next, aluminum was vapor-deposited on the barium layer in a thickness of about 60 nm. After the vapor-deposition, the sealing was performed using a glass substrate, thus manufacturing a light-emitting device 7.

When a voltage of until 20 V was applied to the light-emitting device 7, electroluminescence (EL) emitting blue color light was observed. The luminous efficiency at a brightness of 20 cd/m$^2$ was 5.21 cd/A and at this time, the voltage was 4.1 V. The luminous efficiency at a brightness of 50 cd/m$^2$ was 6.73 cd/A and at this time, the voltage was 4.3 V. The luminous efficiency at a brightness of 100 cd/m$^2$ was 7.79 cd/A and at this time, the voltage was 4.5 V.

<Example 8> (Manufacturing of Light-Emitting Device 8)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade))

in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3 and the phosphorescent light-emitting compound Ir-1 were dissolved in xylene (manufactured by Kanto Chemical Co., Ltd.; for the electronic industries (EL grade)) in a concentration of 1.8% by weight of the above-described materials (in a weight ratio of polymer compound P-3/phosphorescent light-emitting compound Ir-1=95/5). The resultant xylene solution was placed onto the thermally treated film of the polymer compound HP-1 and was made to a coating film as a light-emitting layer 8 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 8 in a thickness of about 5 nm and next, aluminum was vapor-deposited on the barium layer in a thickness of about 60 nm. After the vapor-deposition, the sealing was performed using a glass substrate, thus manufacture a light-emitting device 8.

When a voltage of until 20 V was applied to the light-emitting device 8, electroluminescence (EL) emitting blue color light was observed. The luminous efficiency at a brightness of 20 cd/m$^2$ was 1.64 cd/A and at this time, the voltage was 4.6 V. The luminous efficiency at a brightness of 50 cd/m$^2$ was 2.00 cd/A and at this time, the voltage was 4.8 V. The luminous efficiency at a brightness of 100 cd/m$^2$ was 2.30 cd/A and at this time, the voltage was 4.9 V.

<Example 9> (Manufacturing of Light-Emitting Device 9)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis at 180° C. for 60 minutes, thus obtaining a thermally treated film. Next, the polymer compound P-3 and the phosphorescent light-emitting compound A were dissolved in xylene (manufactured by Kanto Chemical Co., Ltd.; for the electronic industries (EL grade)) in a concentration of 1.8% by weight of the above-described materials (in a weight ratio of polymer compound P-3/phosphorescent light-emitting compound A=90/10). The resultant xylene solution was placed onto the thermally treated film of the polymer compound HP-1 and was made to a coating film as a light-emitting layer 9 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 9 in a thickness of about 5 nm and next, aluminum was vapor-deposited on the barium layer in a thickness of about 60 nm. After the vapor-deposition, the sealing was performed using a glass substrate, thus manufacturing a light-emitting device 9.

When a voltage of until 20 V was applied to the light-emitting device 9, electroluminescence (EL) emitting blue color light was observed. The luminous efficiency at a brightness of 20 cd/m$^2$ was 6.31 cd/A and at this time, the voltage was 4.2 V. The luminous efficiency at a brightness of 50 cd/m$^2$ was 7.06 cd/A and at this time, the voltage was 4.5 V. The luminous efficiency at a brightness of 100 cd/m$^2$ was 7.66 cd/A and at this time, the voltage was 4.7 V.

<Example 10> (Manufacturing of Light-Emitting Device 10)

Onto a glass substrate coated with an ITO film by a sputtering method in a thickness of 45 nm, a suspension of CLEVIOS P was placed and was made to a coating film by a spin coating method so as to have a thickness of about 50 nm and the resultant coating film was dried on a hot plate as 200° C., for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was laced onto the film of CLEVIOS P and was made a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3 and the phosphorescent light-emitting compound A were dissolved in xylene (manufactured by Kanto Chemical Co., Ltd.; for the electronic industries (EL grade)) in a concentration of 1.9% by weight of the above-described materials (in a weight ratio of polymer compound P-3/phosphorescent light-emitting compound A=80/20). The resultant xylene solution was placed onto the thermally treated film of the polymer compound HP-1 and was made to a coating film as a light-emitting layer 10 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 10 in a thickness of about 5 nm and next, aluminum was vapor-deposited on the barium layer in a thickness of about 60 nm. After the vapor-deposition, the sealing was performed using a glass substrate, thus manufacturing a light-emitting device 10.

When a voltage of until 20 V was applied to the light-emitting device 10, electroluminescence (EL) emitting blue color light was observed. The luminous efficiency at a brightness of 20 cd/m$^2$ was 8.27 cd/A and at this time, the voltage was 4.6 V. The luminous efficiency at a brightness of 50 cd/m$^2$ was 9.26 cd/A and at this time, the voltage was 4.9

V. The luminous efficiency at a brightness of 100 cd/m² was 10.07 cd/A and at this time, the voltage was 5.2 V.

<Example 11> (Manufacturing of Light-Emitting Device 11)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a ho-t plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3 and the phosphorescent light-emitting compound A were dissolved in xylene (manufactured by Kanto Chemical Co., Ltd.; for the electronic industries (EL grade); in a concentration of 1.9% by weight of the above-described materials (in a weight ratio of polymer compound P-3/phosphorescent light-emitting compound A=70/30). The resultant xylene solution was placed onto the thermally treated film of the polymer compound HP-1 and was made to a coating film as a light-emitting layer 11 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 11 in a thickness of about 5 nm and next, aluminum was vapor-deposited on the barium layer in a thickness of about 60 nm. After the vapor-deposition, the sealing was performed using a glass substrate, thus manufacturing a light-emitting device 11.

When a voltage of until 20 V was applied to the light-emitting device 11, electroluminescence (EL) emitting blue color light was observed. The luminous efficiency at a brightness of 20 cd/m² was 8.22 cd/A and at this time, the voltage was 4.8 V. The luminous efficiency at a brightness of 50 cd/m² was 9.21 cd/A and at this time, the voltage was 5.2 V. The luminous efficiency at a brightness of 100 cd/m² was 9.87 cd/A and at this time, the voltage was 5.5 V.

<Comparative Example 8> (Manufacturing of Light-Emitting Device C8)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound CP-5 and the phosphorescent light-emitting compound A were dissolved in xylene (manufactured by Kanto Chemical Co., Ltd.; for the electronic industries (EL grade)) in a concentration of 2.4% by weight of the above-described materials (in a weight ratio of polymer compound CP-5/phosphorescent light-emitting compound A=95/5). The resultant xylene solution was placed onto the thermally treated film of the polymer compound HP-1 and was made to a coating film as a light-emitting layer C8 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer C8 in a thickness of about 5 nm and next, aluminum was vapor-deposited on the barium layer in a thickness of about 60 nm. After the vapor-deposition, the sealing was performed using a glass substrate, thus manufacturing a light-emitting device C8.

When a voltage of until 20 V was applied to the light-emitting device C8, electroluminescence (EL) emitting blue color light was observed. However, the brightness could not reach 20 cd/m², 50 cd/m², and 100 cd/m².

TABLE 2

| | LIGHT-EMITTING LAYER | | | 20 cd/m² | | 50 cd/m² | | 100 cd/m² | |
| | POLYMER COMPOUND | PHOSPHORESCENT LIGHT-EMITTING COMPOUND | ELECTRON TRANSPORT MATERIAL | COMPOSITION RATIO | LUMINOUS EFFICIENCY (cd/A) | VOLTAGE (V) | LUMINOUS EFFICIENCY (cd/A) | VOLTAGE (V) | LUMINOUS EFFICIENCY (cd/A) | VOLTAGE (V) |
|---|---|---|---|---|---|---|---|---|---|---|
| EXAMPLE 1 | P-1 | A | ET-A | 85/5/10 | 2.39 | 6.1 | 2.05 | 6.6 | 1.83 | 7.1 |
| EXAMPLE 2 | P-2 | A | — | 95/5/0 | 1.72 | 5.2 | 1.67 | 5.8 | 1.62 | 6.3 |
| EXAMPLE 3 | P-3 | A | — | 95/5/0 | 4.08 | 4.1 | 4.74 | 4.3 | 5.30 | 4.5 |
| EXAMPLE 4 | P-4 | A | — | 95/5/0 | 3.02 | 4.0 | 3.44 | 4.2 | 3.76 | 4.4 |
| EXAMPLE 5 | P-5 | A | — | 95/5/0 | 4.78 | 4.2 | 5.28 | 4.4 | 5.71 | 4.6 |
| EXAMPLE 6 | P-6 | A | — | 95/5/0 | 5.23 | 4.5 | 5.88 | 4.9 | 6.04 | 5.3 |
| EXAMPLE 7 | P-7 | A | — | 95/5/0 | 5.21 | 4.1 | 6.73 | 4.3 | 7.79 | 4.5 |
| EXAMPLE 8 | P-3 | Ir-1 | — | 95/5/0 | 1.64 | 4.6 | 2.00 | 4.8 | 2.30 | 4.9 |
| EXAMPLE 9 | P-3 | A | — | 90/10/0 | 6.31 | 4.2 | 7.06 | 4.5 | 7.66 | 4.7 |

TABLE 2-continued

| | LIGHT-EMITTING LAYER | | | | 20 cd/m² | | 50 cd/m² | | 100 cd/m² | |
|---|---|---|---|---|---|---|---|---|---|---|
| | POLYMER COMPOUND | PHOSPHORESCENT LIGHT-EMITTING COMPOUND | ELECTRON TRANSPORT MATERIAL | COMPOSITION RATIO | LUMINOUS EFFICIENCY (cd/A) | VOLTAGE (V) | LUMINOUS EFFICIENCY (cd/A) | VOLTAGE (V) | LUMINOUS EFFICIENCY (cd/A) | VOLTAGE (V) |
| EXAMPLE 10 | P-3 | A | — | 80/20/0 | 8.27 | 4.6 | 9.28 | 4.9 | 10.07 | 5.2 |
| EXAMPLE 11 | P-3 | A | — | 70/30/0 | 8.22 | 4.8 | 9.21 | 5.2 | 9.87 | 5.5 |
| COMPARATIVE EXAMPLE 1 | CP-1 | A | — | 95/5/0 | 0.01 | 18.8 | — | — | — | — |
| COMPARATIVE EXAMPLE 2 | CP-1 | A | ET-A | 85/5/10 | 0.01 | 18.4 | — | — | — | — |
| COMPARATIVE EXAMPLE 3 | CP-2 | A | — | 95/5/0 | 0.01 | 13.1 | — | — | — | — |
| COMPARATIVE EXAMPLE 4 | CP-2 | A | ET-A | 85/5/10 | 0.03 | 10.2 | 0.02 | 13.1 | 0.02 | 19.3 |
| COMPARATIVE EXAMPLE 5 | CP-3 | A | — | 95/5/0 | — | — | — | — | — | — |
| COMPARATIVE EXAMPLE 6 | CP-3 | A | ET-A | 85/5/10 | 0.01 | 19.6 | — | — | — | — |
| COMPARATIVE EXAMPLE 7 | CP-4 | A | — | 95/5/0 | 0.04 | 15.2 | 0.03 | 18.4 | — | — |
| COMPARATIVE EXAMPLE 8 | CP-5 | A | — | 95/5/0 | — | — | — | — | — | — |

<Example 12> (Manufacturing of Light-Emitting Device 12)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3, The phosphorescent light-emitting compound A, the light-emitting material U, and the light-emitting material T were dissolved in xylene (manufactured by Kanto Chemical Co., Ltd.; for the electronic industries (EL grade)) in a concentration of 1.9% by weight of the above-described materials (in a weight ratio of polymer compound P-3/phosphorescent light-emitting compound A/light-emitting material U/light-emitting material T=77/20/2.0/1.0). The resultant xylene solution was placed onto the thermally treated film of the polymer compound HP-1 and was made to a coating film as a light-emitting layer 12 by a spin coating method so as to have a thickness of about 60 nm. Then, in a nitrogen atmosphere having an oxygen concentration and a water concentration of each 10 ppm or less (on a weight basis), the resultant coating film was dried at 130° C. for minutes. The pressure of the atmosphere was reduced to $1.0 \times 10^{-4}$ Pa or less and as the cathode, barium was vapor-deposited on the film of the light-emitting layer 12 in a thickness of about 5 nm and next, aluminum was vapor-deposited on the barium layer in a thickness of about 60 nm. After the vapor-deposition, the sealing was performed using a glass substrate, thus manufacturing a light-emitting device 12.

When a voltage of until 20 V was applied to the light-emitting device 12, electroluminescence (EL) emitting white color light was observed. The luminous efficiency at a brightness of 20 cd/m² was 12.69 cd/A and at this time, the voltage was 4.7 V and the luminescent chromaticity was (0.50, 0.45). The luminous efficiency at a brightness of 50 cd/m² was 14.25 cd/A and at this time, the voltage was 5.1 V and the luminescent chromaticity was (0.49, 0.45). The luminous efficiency at a brightness of 100 cd/m² was 15.27 cd/A and at this time, the voltage was 5.5 V and the luminescent chromaticity was (0.48, 0.46).

<Example 13> (Manufacturing of Light-Emitting Device 13)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3, the phosphorescent light-emitting compound A, the light-emitting material U, and the light-emitting material T were dissolved in xylene (manufactured by Kanto Chemical Co., Ltd.; for the electronic industries (EL grade)) in a concentration of 1.9% by weight of the above-described materials (in a weight ratio of polymer compound P-3/phosphorescent light-emitting compound A/light-emitting material U/light-emitting material T=78.5/20/1.0/0.5). The resultant xylene solution was placed onto the thermally treated film of the polymer compound HP-1 and was made to a coating film as a light-emitting layer 13 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 13 in a thickness of about 5 nm and next, aluminum was vapor-deposited on the barium layer in a thickness of about 60 nm. After the vapor-deposition, the sealing was performed using a glass substrate, thus manufacturing a light-emitting device 13.

When a voltage of until 20 V was applied to the light-emitting device 13, electroluminescence (EL) emitting white color light was observed. The luminous efficiency at a brightness of 20 cd/m$^2$ was 10.56 cd/A and at this time, the voltage was 4.8 V and the luminescent chromaticity was (0.48, 0.46). The luminous efficiency at a brightness of 50 cd/m$^2$ was 12.27 cd/A and at this time, the voltage was 5.3 V and the luminescent chromaticity was (0.47, 0.47). The luminous efficiency at a brightness of 100 cd/m$^2$ was 13.63 cd/A and at this time, the voltage was 5.7 V and the luminescent chromaticity was (0.46, 0.48).

<Example 14> (Manufacturing of Light-Emitting Device 14)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co. Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer compound P-3, the phosphorescent light-emitting compound A, the light-emitting material U, and the light-emitting material T were dissolved in xylene (manufactured by Kanto Chemical Co., Ltd.; for the electronic industries (EL grade) in a concentration of 1.9% by weight of the above-described materials (in a weight ratio of polymer compound P-3/phosphorescent light-emitting compound A/light-emitting material U/light-emitting material T=79.25/20/0.5/0.25). The resultant xylene solution was placed onto the thermally treated film of the polymer compound HP-1 and was made to a coating film as a light-emitting layer 14 by a spin coating method so as to have a thickness of about 60 nm. Then, in a nitrogen atmosphere having an oxygen concentration and a water concentration of each 10 ppm or less (on a weight basis), the resultant coating film was dried at 130° C. for minutes. The pressure of the atmosphere was reduced to $1.0 \times 10^{-4}$ pa or less and as the cathode, barium was vapor-deposited on the film of the light-emitting layer 14 in a thickness of about 5 nm and next, aluminum was vapor-deposited on the barium layer in a thickness of about 60 nm. After the vapor-deposition, the sealing was performed using a glass substrate, thus manufacturing a light-emitting device 14.

When a voltage of until 20 V was applied to the light-emitting device 14, electroluminescence (EL) emitting white color light was observed. The luminous efficiency at a brightness of 20 cd/m$^2$ was 13.77 cd/A and at this time, the voltage was 4.4 V and the luminescent chromaticity was (0.37, 0.50). The luminous efficiency at a brightness of 50 cd/m$^2$ was 15.86 cd/A and at this time, the voltage was 4.8 V and the luminescent chromaticity as (0.3, 0.50). The luminous efficiency at a brightness of 100 cd/m$^2$ was 17.29 cd/A and at this time, the voltage was 5.1 V and the luminescent chromaticity was (0.35, 0.51).

<Example 15> (Manufacturing of Light-Emitting Device 15)

Onto a glass substrate coated with an ITO film by a sputtering method in a thickness of 45 nm, a suspension of CLEVIOS P was placed and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have the resultant coating film has a thickness of about 20 nm. The resultant coating film was dried in a nitrogen atmosphere having an oxygen concentration and a water concentration of each 10 ppm or less (on a weigh, basis) at 180° C. for 60 minutes, thus obtaining a thermally treated film. Next, the polymer compound P-3, the phosphorescent light-emitting compound A, the light-emitting material U, and the light-emitting material T were dissolved in xylene (manufactured by Kanto Chemical Co., Ltd.; for the electronic industries (EL grade) in a concentration of 1.9% by weight of the above-described materials (in a weight ratio of polymer compound P-3/phosphorescent light-emitting compound A/light-emitting material U/light-emitting material T=79.4/20/0.5/0.1). The resultant xylene solution was placed onto the thermally treated film of the polymer compound HP-1 and was made to a coating film as a light-emitting layer 15 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $1.0 \times 10^{-4}$ Pa or less and as the cathode, barium was vapor-deposited on the film of the light-emitting layer 15 in a thickness of about 5 nm and next, aluminum, was vapor-deposited on the barium layer in a thickness of about 60 nm. After the vapor-deposition, the sealing was performed using a glass substrate, thus manufacturing a light-emitting device 15.

When a voltage of until 20 V was applied to the light-emitting device 15, electroluminescence (EL) emitting white color light was observed. The luminous efficiency at a brightness of 20 cd/m$^2$ was 14.77 cd/A and at this time, the voltage was 4.6 V and the luminescent chromaticity was (0.41, 0.49). The luminous efficiency at a brightness of 50 cd/m$^2$ was 17.34 cd/A and at this time, the voltage was 5.0 V and the luminescent chromaticity was (0.40, 0.50). The luminous efficiency at a brightness of 100 cd/m$^2$ was 19.07 cd/A and at this time, the voltage was 5.4 V and the luminescent chromaticity was (0.39, 0.51).

<Example 16> (Manufacturing of Light-Emitting Device 16)

Onto a glass substrate coated with an ITO film by a sputtering method in a thickness of 45 nm, a suspension of CLEVIOS P was place and was made to a coating film by a spin coating method so as to have a thickness of about 50 nm, and the resultant coating film was dried on a hot plate at 200° C. for 10 minutes. Next, the polymer compound HP-1 was dissolved in xylene (manufactured by Kanto Chemical Co., Ltd.; for the electronic industries (EL grade)) in a concentration of 0.7% by weight, and the resultant xylene solution was placed onto the film of CLEVIOS P and was made to a coating film by a spin coating method so as to have a thickness of about 20 nm. The resultant coating film was dried in a nitrogen atmosphere having an oxygen concentration and a water concentration of each 10 ppm or less (on a weight basis) at 180° C. for 60 minutes, thus obtaining a thermally treated film. Next, the polymer Compound P-3, the phosphorescent light-emitting compound A, the light-emitting material U, and the light-emitting material T were dissolved in xylene (manufactured by Kanto Chemical Co., Ltd.; for the electronic industries (EL grade)) in a concentration of 1.9% by weight of the above-described materials (in a weight ratio of polymer compound P-3/phosphorescent light-emitting compound A/light-emitting material U/light-emitting material T=79/20/0.5/0.5). The resultant xylene solution was placed onto the thermally treated film of the polymer compound HP-1 and was made to a coating film as a light-emitting layer 16 by a spin coating method so as to have a thickness of about 60 nm. Then, in a nitrogen atmosphere having an oxygen concentration and a water concentration of each 10 ppm or less (on a weight basis), the resultant coating film was dried at 130° C. for 10 minutes. The pressure of the atmosphere was reduced to $10 \times 10^{-4}$ Pa or less and as the cathode, barium was vapor-deposited on the film of the light-emitting layer 16 in a thickness of about 5 nm and next, aluminum was vapor-deposited on the barium layer in a thickness of about 60 nm. After the vapor-deposition, the sealing was performed using a glass substrate, thus manufacturing a light-emitting device 16.

When a voltage of until 20 V was applied to the light-emitting device 16, electroluminescence (EL) emitting white color light was observed. The luminous efficiency at a brightness of 20 cd/m$^2$ was 17.41 cd/A and at this time, the voltage was 4.5 V and the luminescent chromaticity was (0.33, 0.55). The luminous efficiency at a brightness of 50 cd/m$^2$ was 20.47 cd/A and at this time, the voltage was 4.9 V and the luminescent chromaticity was (0.32, 0.55). The luminous efficiency at a brightness of 100 cd/m$^2$ was 22.64 cd/A and at this time, the voltage was 5.2 V and the luminescent chromaticity was (0.31, 0.55).

TABLE 3

| | | LIGHT-EMITTING LAYER | | | 20 cd/m$^2$ | | |
|---|---|---|---|---|---|---|---|
| | POLYMER COMPOUND | PHOSPHORESCENT LIGHT-EMITTING COMPOUND OR LIGHT-EMITTING MATERIAL | ELECTRON TRANSPORT MATERIAL | COMPOSITION RATIO | LUMINOUS EFFICIENCY (cd/A) | VOLTAGE (V) | LUMINESCENT CHROMATICITY |
| EXAMPLE 12 | P-3 | A/U/T | — | 77/20/2/1/0 | 12.69 | 4.7 | (0.50, 0.45) |
| EXAMPLE 13 | P-3 | A/U/T | — | 78.5/20/1/0.5/0 | 10.56 | 4.8 | (0.48, 0.46) |
| EXAMPLE 14 | P-3 | A/U/T | — | 79.25/20/0.5/0.25/0 | 13.77 | 4.4 | (0.37, 0.50) |
| EXAMPLE 15 | P-3 | A/U/T | — | 79.4/20/0.5/0.1/0 | 14.77 | 4.6 | (0.41, 0.49) |
| EXAMPLE 16 | P-3 | A/U/T | — | 79/20/0.5/0.5/0 | 17.41 | 4.5 | (0.33, 0.55) |
| EXAMPLE 3 | P-3 | A | — | 95/5/0 | 4.08 | 4.1 | (0.16, 0.31) |

| | 50 cd/m$^2$ | | | 100 cd/m$^2$ | | |
|---|---|---|---|---|---|---|
| | LUMINOUS EFFICIENCY (cd/A) | VOLTAGE (V) | LUMINESCENT CHROMATICITY | LUMINOUS EFFICIENCY (cd/A) | VOLTAGE (V) | LUMINESCENT CHROMATICITY |
| EXAMPLE 12 | 14.25 | 5.1 | (0.49, 0.45) | 15.27 | 5.5 | (0.48, 0.46) |
| EXAMPLE 13 | 12.27 | 5.3 | (0.47, 0.47) | 13.63 | 5.7 | (0.46, 0.48) |
| EXAMPLE 14 | 15.86 | 4.8 | (0.35, 0.50) | 17.29 | 5.1 | (0.35, 0.51) |
| EXAMPLE 15 | 17.34 | 5.0 | (0.40, 0.50) | 19.07 | 5.4 | (0.39, 0.51) |
| EXAMPLE 16 | 20.47 | 4.9 | (0.32, 0.55) | 22.64 | 5.2 | (0.31, 0.55) |
| EXAMPLE 3 | 4.74 | 4.3 | (0.16, 0.30) | 5.30 | 4.5 | (0.15, 0.30) |

The invention claimed is:

1. A composition comprising a polymer compound, a phosphorescent light-emitting compound that has a light-emitting spectrum peak at smaller than 480 nm, a phosphorescent light-emitting compound that has a light-emitting spectrum peak at 480 nm or larger and smaller than 580 nm, and a phosphorescent light-emitting compound that has a light-emitting spectrum peak at 580 nm or larger and smaller than 680 nm,
wherein:
the polymer compound comprises greater than 50% (by molarity) of constitutional units that are selected from among a constitutional unit represented by Formula (1)-1, a constitutional unit represented by Formula (1)-2, a constitutional unit represented by Formula (2)-1, and a constitutional unit represented by Formula (2)-2;
the polymer compound contains at least both the constitutional unit represented by Formula (1)-1 and the constitutional unit represented by Formula (1)-2; and a ratio of a total weight of the phosphorescent light-emitting compound that has a light-emitting spectrum peak at 480 nm or larger and smaller than 580 nm and the phosphorescent light-emitting compound that has a light-emitting spectrum peak at 580 nm or larger and smaller than 680 nm relative to a weight of the phosphorescent light-emitting compound that has a light-emitting spectrum peak at smaller than 480 nm is 0.01 to 0.3;

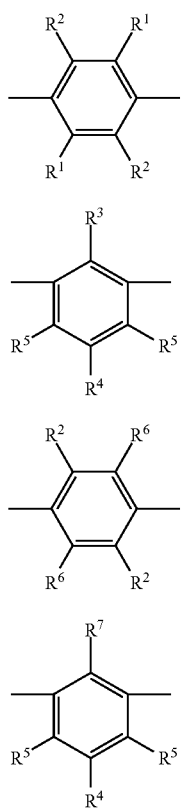

wherein
$R^1$ represents an alkyl group, an aryl group, a monovalent aromatic heterocyclic group, an aryloxy group, an aralkyl group, an arylalkoxy group, a substituted amino group, a substituted carbonyl group, a formyl group, a substituted carboxyl group, or a cyano group, and two or more $R^1$s that are present in the polymer compound may be the same as or different from each other;
$R^2$ represents a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and two or more $R^2$s that are present in the polymer compound may be the same as or different from each other;
$R^3$ represents an alkyl group, an aryl group, a monovalent aromatic heterocyclic group, or an aralkyl group, and when two or more $R^3$s are present in the polymer compound, $R^3$s may be the same as or different from each other;
$R^4$ and $R^5$ each independently represent a hydrogen atom, an alkyl group, an aryl group, a monovalent aromatic heterocyclic group, an alkoxy group, an aryloxy group, an aralkyl group, an arylalkoxy group, a substituted amino group, a substituted carbonyl group, a formyl group, a substituted carboxyl group, a fluorine atom, or a cyano group, and when two or more $R^4$s are present in the polymer compound, $R^4$s may be the same as or different from each other, and two or more $R^5$s that are present in the polymer compound may be the same as or different from each other;
$R^6$ represents a hydrogen atom, an alkoxy group, or a fluorine atom, and two or more $R^6$s that are present in the polymer compound may be the same as or different from each other; and
$R^7$ represents a hydrogen atom, an alkoxy group, an aryloxy group, an arylalkoxy group, a substituted amino group, a substituted carbonyl group, a formyl group, a substituted carboxyl group, or a fluorine atom, and when two or more $R^7$s are present in the polymer compound, $R^7$s may be the same as or different from each other.

2. The composition according to claim 1, wherein $R^1$ is an alkyl group, an aryl group, or an aralkyl group.

3. The composition according to claim 1, wherein $R^2$ is a hydrogen atom.

4. The composition according to claim 1, wherein $R^3$ is an alkyl group, an aryl group, or an aralkyl group.

5. The composition according to claim 4, wherein $R^3$ is a methyl group.

6. The composition according to claim 1, wherein $R^5$ is a hydrogen atom.

7. The composition according to claim 1, wherein $R^4$ is a group represented by Formula (3) and/or a group represented by Formula (4):

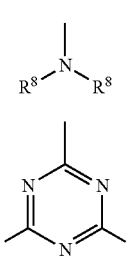

wherein
$R^8$ and $R^9$ each independently represent an alkyl group, an aryl group, a monovalent aromatic heterocyclic group, or an aralkyl group;
two $R^8$s that are present in Formula (3) are optionally linked together; two or more $R^8$s that are present in the polymer compound may be the same as or different from each other;
two $R^9$s that are present in Formula (4) are optionally linked together; and two or more $R^9$s that are present in the polymer compound, may be the same as or different from each other.

8. The composition according to claim 1, wherein a ratio of a total number of moles of the constitutional unit represented by Formula (1)-2 and the constitutional unit represented by Formula (2)-2 relative to a total number of moles of the constitutional unit represented by Formula (1)-1 and the constitutional unit represented by Formula (2)-1 is 0.1 to 9.0.

9. The composition according to claim 7, wherein a ratio of a total number of moles of: the constitutional unit represented by Formula (1)-2 and the constitutional unit represented by Formula (2)-2 in which $R^4$ is the group represented by Formula (3); and the constitutional unit represented by Formula (1)-2 and the constitutional unit represented by Formula (2)-2 in which $R^4$ is the group represented by Formula (4),
  relative to a total number of moles of: the constitutional unit represented by Formula (1)-1; the constitutional unit represented by Formula (2)-1; the constitutional unit represented by Formula (1)-2 in which $R^4$ is neither the group represented by Formula (3) nor the group represented by Formula (4); and the constitutional unit represented by Formula (2)-2 in which $R^4$ is neither the group represented by Formula (3) nor the group represented by Formula (4),
  is 0.1 to 9.0.

10. The composition according to claim 7, wherein a ratio of a total number of moles of the constitutional unit represented by Formula (1)-2 and the constitutional unit represented by Formula (2)-2 in which $R^4$ is the group represented by Formula (3), relative to a total number of moles of the constitutional unit represented by Formula (1)-2 and the constitutional unit represented by Formula (2)-2 in which $R^4$ is the group represented by Formula (4), is 0.1 to 9.0.

11. The composition according to claim 1, wherein constitutional units represented by Formula (2)-1 are not substantially adjacent to each other; constitutional units represented by Formula (2)-2 are not substantially adjacent to each other; and the constitutional unit represented by Formula (2)-1 and the constitutional unit represented by Formula (2)-2 are not substantially adjacent to each other.

12. The composition according to claim 1, wherein the phosphorescent light-emitting compound that has a light-emitting spectrum peak at smaller than 480 nm is an iridium complex.

13. The composition according to claim 12, wherein the iridium complex has a fluorine atom or a trifluoromethyl group.

14. The composition according to claim 12, wherein the iridium complex has an alkyl group.

15. The composition according to claim 1, wherein a ratio of a weight of the phosphorescent light-emitting compound that has a light-emitting spectrum peak at smaller than 480 nm relative to a weight of the polymer compound is 0.05 to 0.5.

16. The composition according to claim 1, further comprising:
  one or more types of material selected from the group consisting of a hole transport material, an electron transport material, and a light-emitting material except for a phosphorescent light-emitting material.

17. The composition according to claim 16, wherein the electron transport material is an electron transport material having a structure represented by Formula (5):

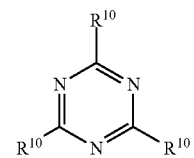

(5)

wherein
$R^{10}$ represents an alkyl group, an aryl group, a monovalent aromatic heterocyclic group, or an aralkyl group; three $R^{10}$s are optionally linked together; and three $R^{10}$s that are present in the polymer compound may be the same as or different from each other.

18. A liquid composition comprising:
the composition according to claim 1 and a solvent.

19. A film comprising:
the composition according to claim 1.

20. A light-emitting device comprising:
an anode and a cathode; and
a layer that is provided between the anode and the cathode and that comprises the composition according to claim 1.

21. The light-emitting device according to claim 20, wherein the layer is a light-emitting layer.

22. A surface light source comprising the light-emitting device according to claim 20.

23. A display device comprising the light-emitting device according to claim 20.

24. The composition according to claim 1, wherein the polymer compound consists of constitutional units that are selected from among the constitutional unit represented by Formula (1)-1, the constitutional unit represented by Formula (1)-2, the constitutional unit represented by Formula (2)-1, and the constitutional unit represented by Formula (2)-2.

25. The composition according to claim 1, wherein the ratio of the total weight of the phosphorescent light-emitting compound that has a light-emitting spectrum peak at 480 nm or larger and smaller than 580 nm and the phosphorescent light-emitting compound that has a light-emitting spectrum peak at 580 nm or larger and smaller than 680 nm relative to the weight of the phosphorescent light-emitting compound that has a light-emitting spectrum peak at smaller than 480 nm is 0.01 to 0.2.

26. The composition according to claim 1, wherein the ratio of the total weight of the phosphorescent light-emitting compound that has a light-emitting spectrum peak at 480 nm or larger and smaller than 580 nm and the phosphorescent light-emitting compound that has a light-emitting spectrum peak at 580 nm or larger and smaller than 680 nm relative to the weight of the phosphorescent light-emitting compound that has a light-emitting spectrum peak at smaller than 480 nm is 0.03 to 0.2.

* * * * *